(12) United States Patent
Donofrio et al.

(10) Patent No.: US 9,831,220 B2
(45) Date of Patent: Nov. 28, 2017

(54) LIGHT EMITTING DIODE (LED) ARRAYS INCLUDING DIRECT DIE ATTACH AND RELATED ASSEMBLIES

(75) Inventors: Matthew Donofrio, Raleigh, NC (US); Christopher P. Hussell, Cary, NC (US); John Adam Edmond, Durham, NC (US)

(73) Assignee: Cree, Inc., Durham, NC (US)

(*) Notice: Subject to any disclaimer, the term of this patent is extended or adjusted under 35 U.S.C. 154(b) by 395 days.

(21) Appl. No.: 13/424,699

(22) Filed: Mar. 20, 2012

(65) Prior Publication Data

US 2013/0193453 A1 Aug. 1, 2013

Related U.S. Application Data

(63) Continuation-in-part of application No. 13/027,006, filed on Feb. 14, 2014, which is a continuation-in-part of application No. 13/018,013, filed on Jan. 31, 2011.

(60) Provisional application No. 61/589,173, filed on Jan. 20, 2012.

(51) Int. Cl.
*H01L 25/075* (2006.01)
*H01L 33/50* (2010.01)
*H01L 33/62* (2010.01)
*H01L 33/20* (2010.01)

(52) U.S. Cl.
CPC .......... *H01L 25/0753* (2013.01); *H01L 33/20* (2013.01); *H01L 33/505* (2013.01); *H01L 33/62* (2013.01); *H01L 2924/0002* (2013.01)

(58) Field of Classification Search
CPC ... H01L 25/0753; H01L 33/20; H01L 33/505; H01L 33/62
See application file for complete search history.

(56) References Cited

U.S. PATENT DOCUMENTS

| 4,916,464 A | 4/1990 | Ito et al. |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,309,001 A | 5/1994 | Watanabe et al. |
| 5,338,944 A | 8/1994 | Edmond et al. |

(Continued)

OTHER PUBLICATIONS

International Search Report and Written Opinion Corresponding to International Application No. PCT/US13/21968; dated Apr. 5, 2013; 17 Pages.

(Continued)

*Primary Examiner* — Tucker J Wright
(74) *Attorney, Agent, or Firm* — Sage Patent Group

(57) ABSTRACT

An electronic device may include a packaging substrate having a packaging face, and the packaging substrate may include positive and negative electrically conductive pads on the packaging face. A plurality of light emitting diodes may be electrically and mechanically coupled to the packaging face of the packaging substrate, with the plurality of light emitting diodes being electrically coupled between the positive and negative electrically conductive pads on the packaging face. A continuous optical coating may be provided on the plurality of light emitting diodes and on the packaging face of the packaging substrate so that the plurality of light emitting diodes are between the optical coating and the packaging substrate.

52 Claims, 54 Drawing Sheets

(56) References Cited

U.S. PATENT DOCUMENTS

| | | | |
|---|---|---|---|
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond et al. |
| 5,912,477 | A | 6/1999 | Negley |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,614,056 | B1 | 9/2003 | Tarsa et al. |
| 6,791,119 | B2 | 9/2004 | Slater, Jr. et al. |
| 6,853,010 | B2 | 2/2005 | Slater, Jr. et al. |
| 6,871,982 | B2 | 3/2005 | Holman et al. |
| 6,964,877 | B2 | 11/2005 | Chen et al. |
| 7,081,667 | B2 | 7/2006 | Du |
| 7,141,825 | B2 | 11/2006 | Horio et al. |
| 7,262,467 | B2 | 8/2007 | Kelberlau |
| 7,285,801 | B2 | 10/2007 | Eliashevich et al. |
| 7,326,583 | B2 | 2/2008 | Andrews et al. |
| 7,442,564 | B2 | 10/2008 | Andrews |
| 7,476,337 | B2 | 1/2009 | Sakane et al. |
| 7,521,728 | B2 | 4/2009 | Andrews |
| 7,646,035 | B2 | 1/2010 | Loh et al. |
| D615,504 | S | 5/2010 | Keller et al. |
| 7,808,013 | B2 | 10/2010 | Mendendorp, Jr. et al. |
| 7,852,009 | B2 * | 12/2010 | Coleman et al. ......... 315/185 S |
| 8,008,850 | B2 | 8/2011 | Su et al. |
| 8,067,783 | B2 | 11/2011 | Wirth |
| 8,115,217 | B2 | 2/2012 | Duong et al. |
| 8,492,777 | B2 | 7/2013 | Hsieh et al. |
| 8,610,145 | B2 | 12/2013 | Yano |
| 2002/0043926 | A1 | 4/2002 | Takahashi et al. |
| 2002/0123164 | A1* | 9/2002 | Slater, Jr. ............... H01L 33/20 438/39 |
| 2003/0006418 | A1 | 1/2003 | Emerson et al. |
| 2003/0089918 | A1 | 5/2003 | Hiller et al. |
| 2004/0056260 | A1 | 3/2004 | Slater et al. |
| 2004/0080938 | A1* | 4/2004 | Holman et al. .............. 362/231 |
| 2004/0218390 | A1 | 11/2004 | Holman et al. |
| 2004/0228115 | A1* | 11/2004 | Jacobson et al. ............ 362/84 |
| 2006/0091415 | A1 | 5/2006 | Yan |
| 2006/0113555 | A1 | 6/2006 | Yang |
| 2006/0124953 | A1 | 6/2006 | Negley et al. |
| 2006/0192223 | A1 | 8/2006 | Lee et al. |
| 2007/0262338 | A1* | 11/2007 | Higashi ................ H01L 33/38 257/99 |
| 2008/0035947 | A1 | 2/2008 | Weaver, Jr. et al. |
| 2008/0089053 | A1 | 4/2008 | Negley |
| 2008/0217635 | A1 | 9/2008 | Emerson et al. |
| 2008/0299398 | A1* | 12/2008 | Hata ..................... C09K 11/02 428/412 |
| 2009/0050907 | A1 | 2/2009 | Yuan et al. |
| 2009/0050908 | A1* | 2/2009 | Yuan et al. ..................... 257/88 |
| 2009/0108281 | A1 | 4/2009 | Keller et al. |
| 2009/0140633 | A1 | 6/2009 | Tanimoto et al. |
| 2009/0179207 | A1* | 7/2009 | Chitnis ................ H01L 33/44 257/88 |
| 2009/0283787 | A1 | 11/2009 | Donofrio et al. |
| 2009/0283789 | A1 | 11/2009 | Kim et al. |
| 2009/0296384 | A1* | 12/2009 | Van De Ven et al. ........ 362/231 |
| 2009/0315061 | A1 | 12/2009 | Andrews |
| 2010/0066229 | A1* | 3/2010 | Hamby et al. .................... 313/1 |
| 2010/0109030 | A1 | 5/2010 | Krames et al. |
| 2010/0155763 | A1 | 6/2010 | Donofrio et al. |
| 2010/0308354 | A1 | 12/2010 | David et al. |
| 2011/0006334 | A1 | 1/2011 | Ishii et al. |
| 2011/0018013 | A1 | 1/2011 | Margalith et al. |
| 2011/0101389 | A1 | 5/2011 | Wu |
| 2011/0220929 | A1 | 9/2011 | Collins et al. |
| 2012/0146066 | A1* | 6/2012 | Tischler et al. ................. 257/89 |
| 2012/0161161 | A1* | 6/2012 | Schubert ......................... 257/88 |

OTHER PUBLICATIONS

International Search Report and Written Opinion Corresponding to International Application No. PCT/US13/21975; dated Apr. 16, 2013; 9 Pages.
International Preliminary Report on Patentability Corresponding to International Application No. PCT/US2012/024580; dated Aug. 29, 2013; 11 Pages.
International Preliminary Report on Patentability Corresponding to International Application No. PCT/US2013/021975 ; dated Jul. 31, 2014; 7 Pages.
International Preliminary Report on Patentability Corresponding to International Application No. PCT/US2013/021968; dated Jul. 31, 2014; 14 Pages.
Cree, Inc., Data Sheet: "Cree® XLamp® XP-E High-Efficiency White LEDs", CLD-DS34 Rev. 0, Dec. 6, 2010, 11 pages.
Cree, Inc., Data Sheet: "Cree® XLamp® XP-E LEDs", CLD-DS18 Rev. 12, Oct. 27, 2010, 16 pages.
Donofrio M. et al., "Conformally Coated Light Emitting Devices and Methods for Providing the Same", U.S. Appl. No. 13/017,845, filed Jan. 31, 2011, 38 pages.
Donofrio M. et al., "Horizontal Light Emitting Diodes Including Phosphor Particles", U.S. Appl. No. 13/018,013, filed Jan. 31, 2011, 26 pages.
Chen, K. et al., "Integration of Phosphor Printing and Encapsulant Dispensing Processes for Wafer Level LED Array Packaging", 11th International Conference on Electronic Packaging Technology & High Density Packaging, 2010, p. 1386-1392.
International Search Report Corresponding to International Application No. PCT/Us12//24580; dated Jun. 22, 2012; 16 Pages.
"Remote Phosphor Offers Alternative to White LEDs", Digi-Key Electronics, by Steven Keeping, Feb. 12, 2013, pp. 1-5, www.digikey.com.

* cited by examiner

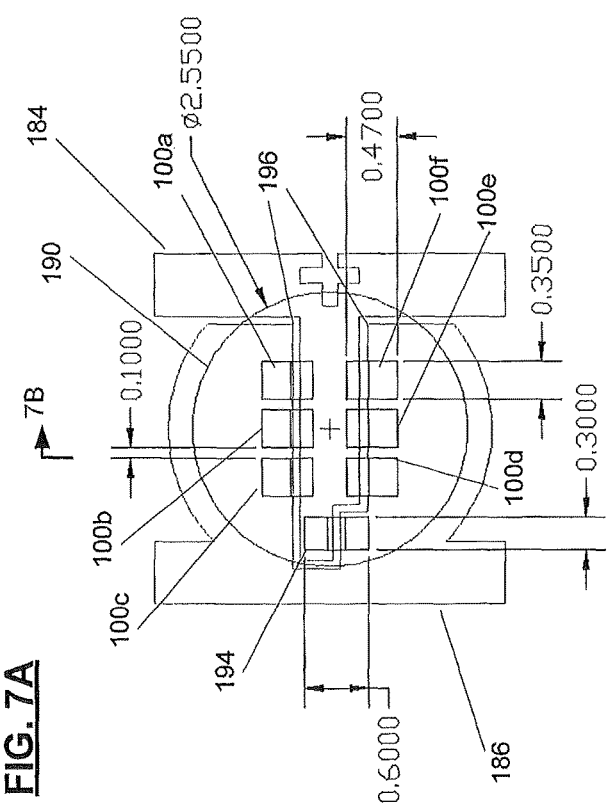
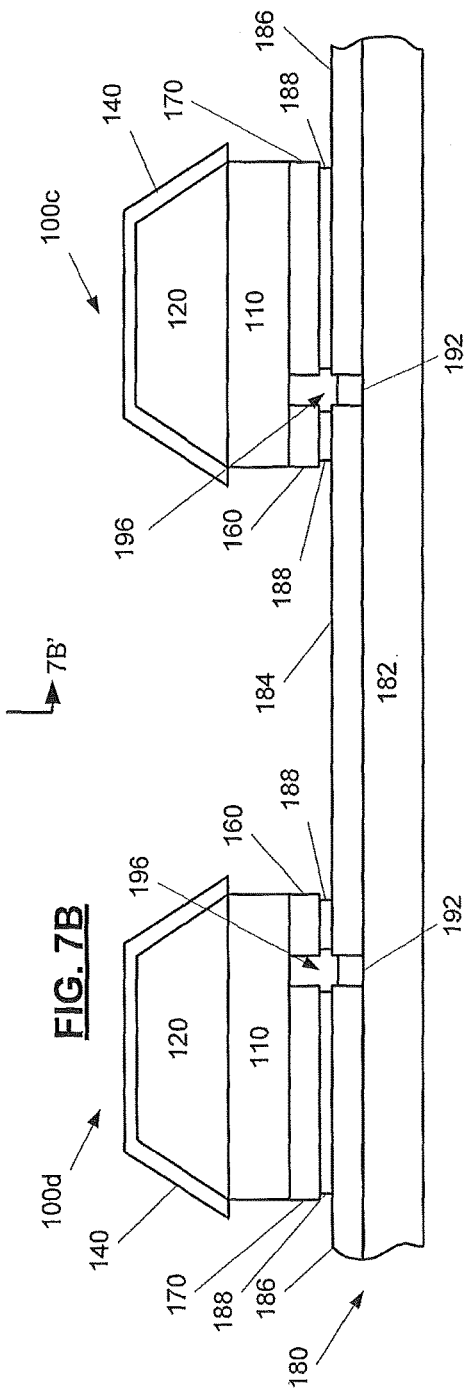
FIG. 7A
FIG. 7B

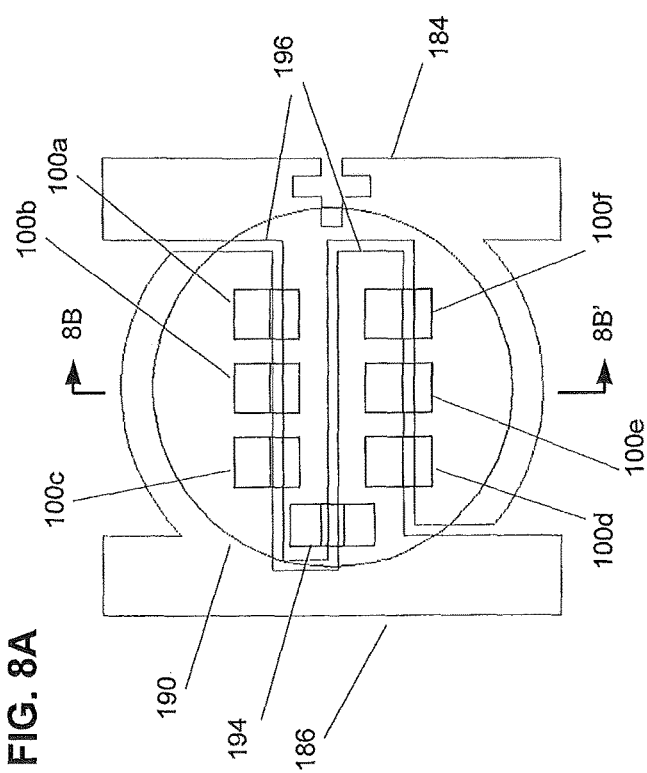
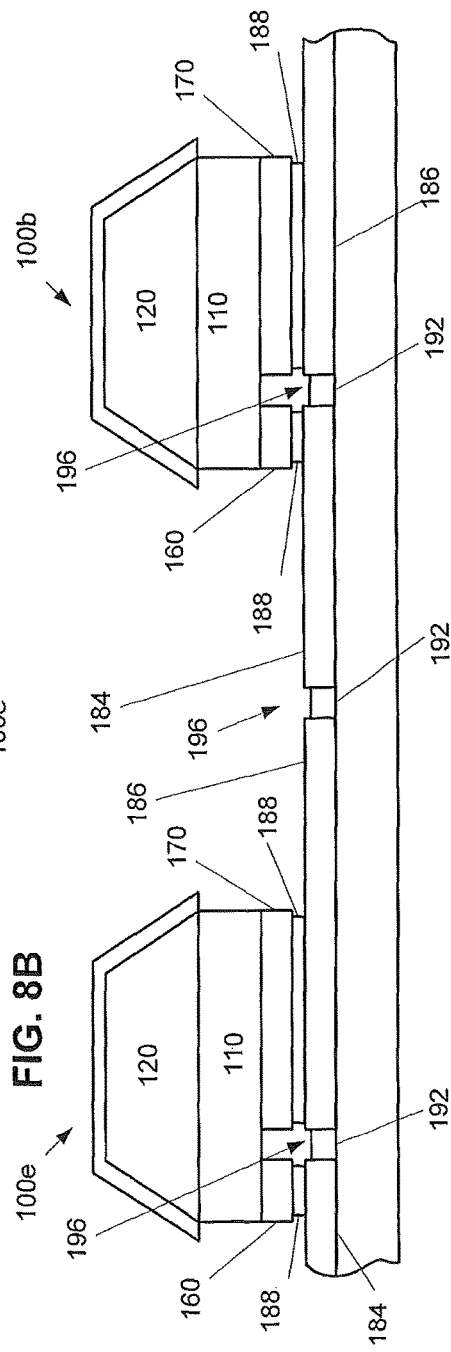
FIG. 8A
FIG. 8B

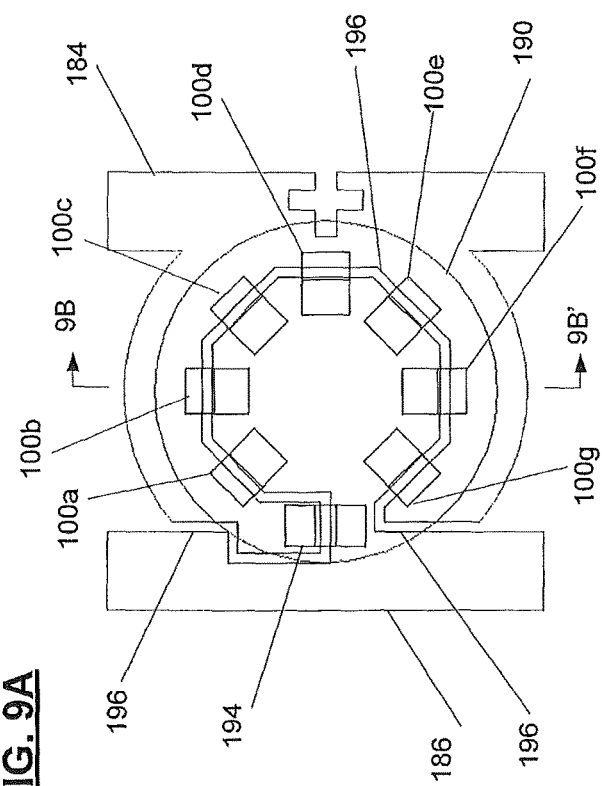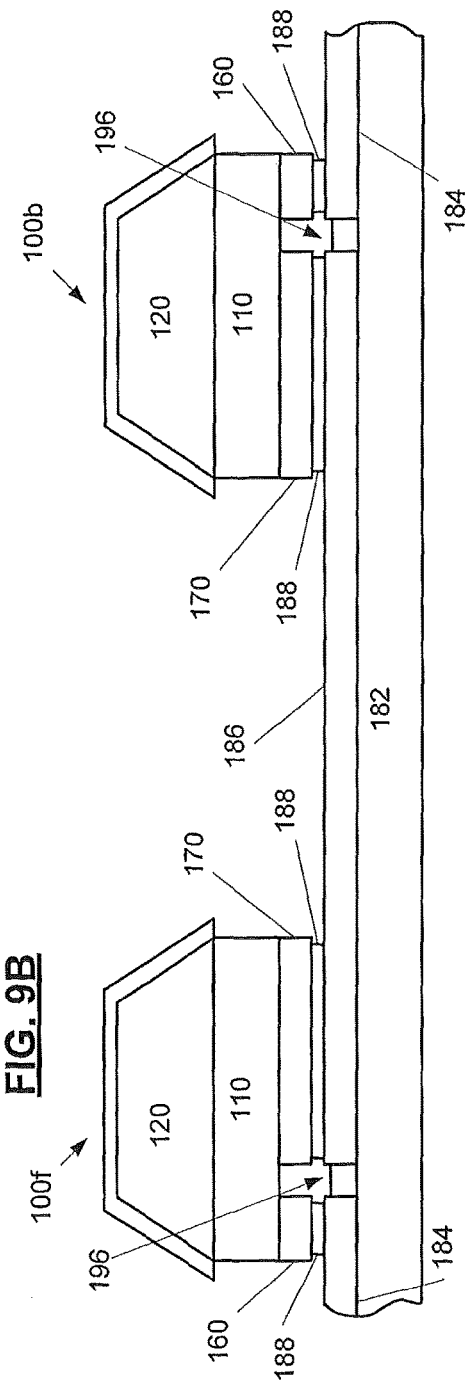
FIG. 9A
FIG. 9B

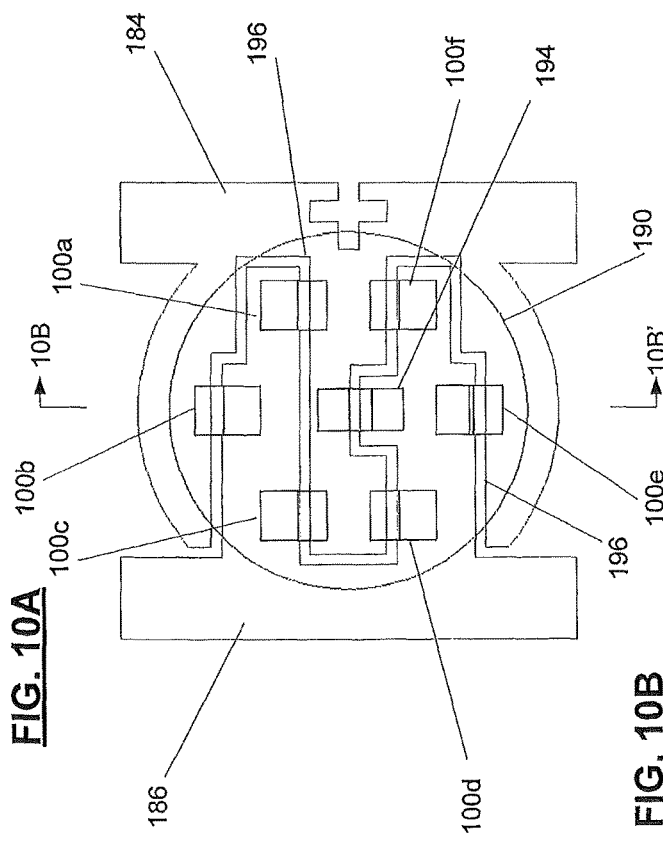
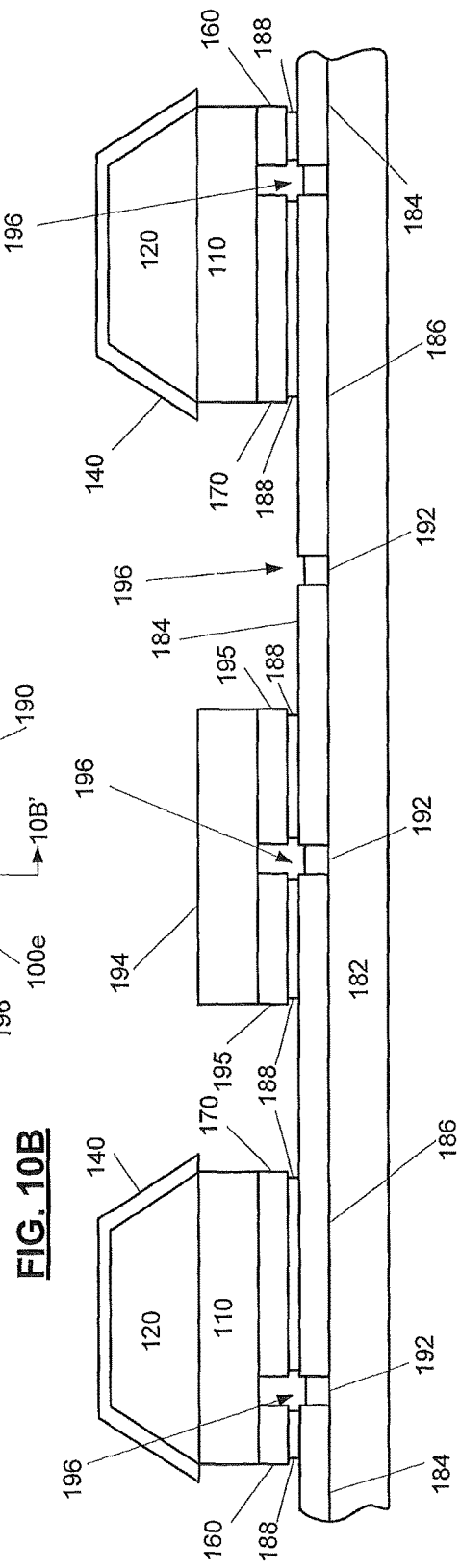
FIG. 10A
FIG. 10B

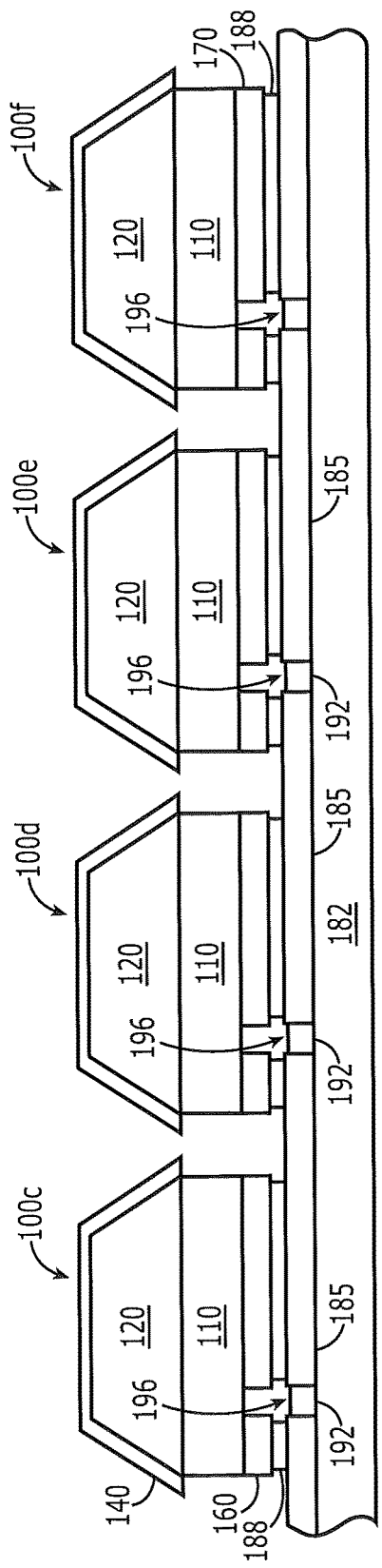

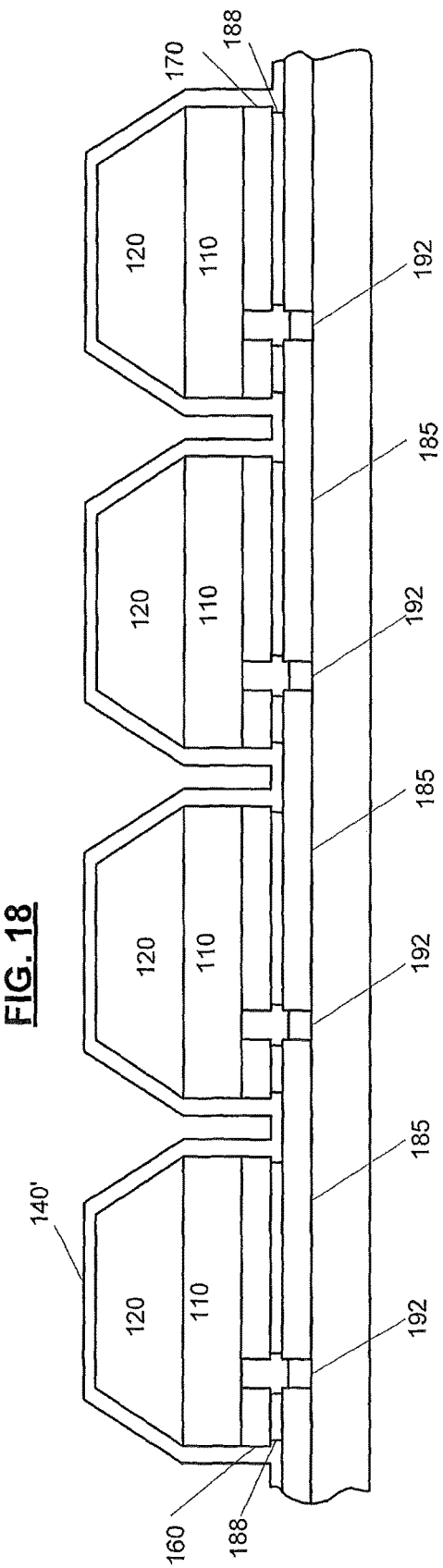

Panel design   537 mW @ 454 nm   133 lm @ 6500K   104 lm @ 3080K

BOTTOM SIDE HATCHED AREA IS METALLIZED

| | MATERIAL | TOPSIDE METALLIZATION | BACKSIDE METALLIZATION |
|---|---|---|---|
|  | Ti | .06um | .06um |
| 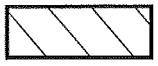 | Electroless Cu | 50 ± 10um | 50 ± 10um |
|  | Electroless Ag | .2 - .5um | .2 - .5um |
|  | SOLDER MASK PSR4000-G23KHP | Flash to 4um below metallized surface | 10-13um |
FIG. 23E

TOP SIDE
HATCHED AREA IS
METALLIZED

BOTTOM SIDE HATCHED AREA IS METALLIZED

| | MATERIAL | TOPSIDE METALLIZATION | BACKSIDE METALLIZATION |
|---|---|---|---|
| | Ti | .06um | .06um |
| | Electroless Cu | 50 ± 10um | 50 ± 10um |
| | Electroless Ag | .2 - .5um | .2 - .5um |
| | SOLDER MASK PSR4000-G23KHP | Flash to 2um below metallized surface | 10-13um |

FIG. 29E

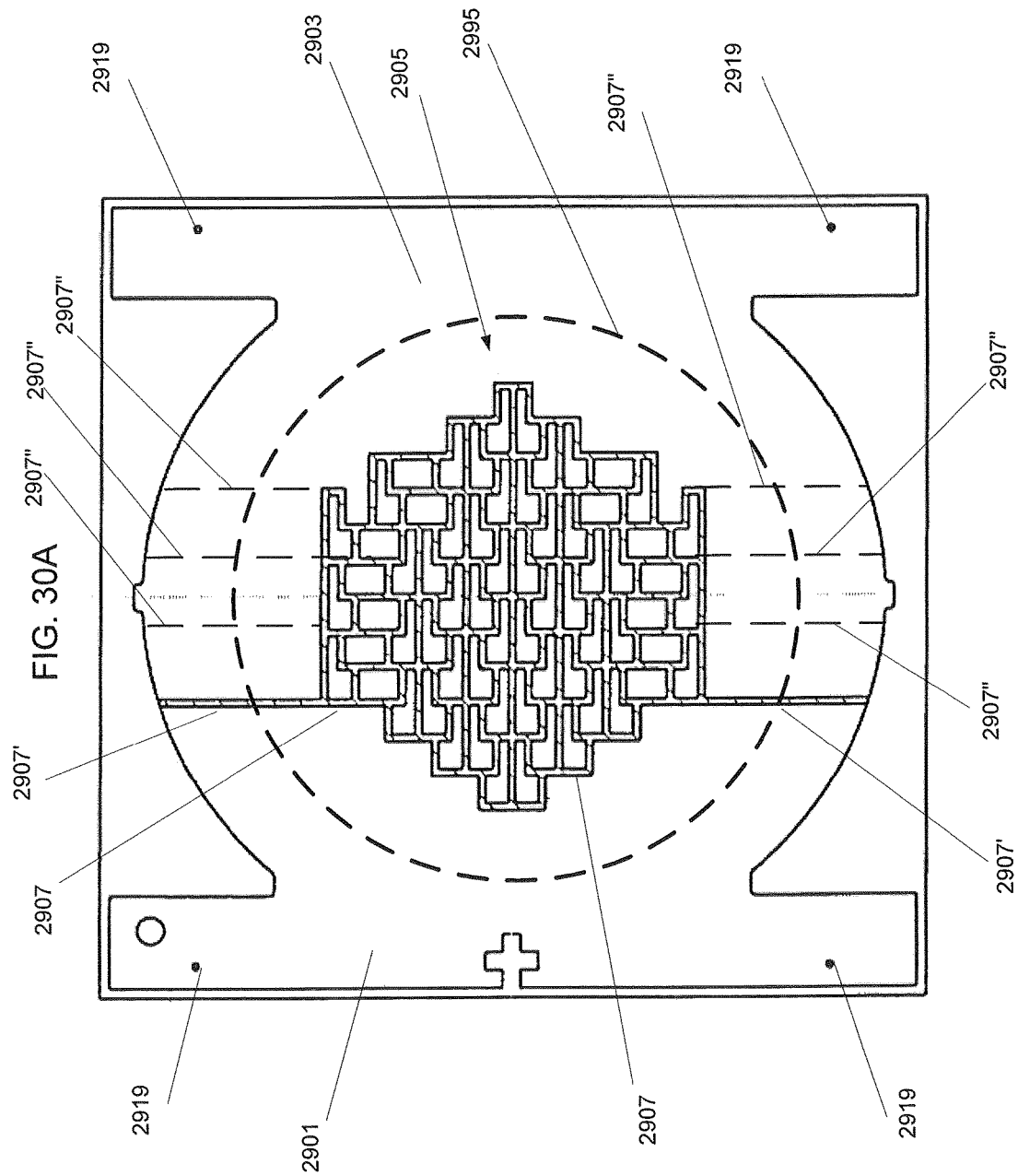

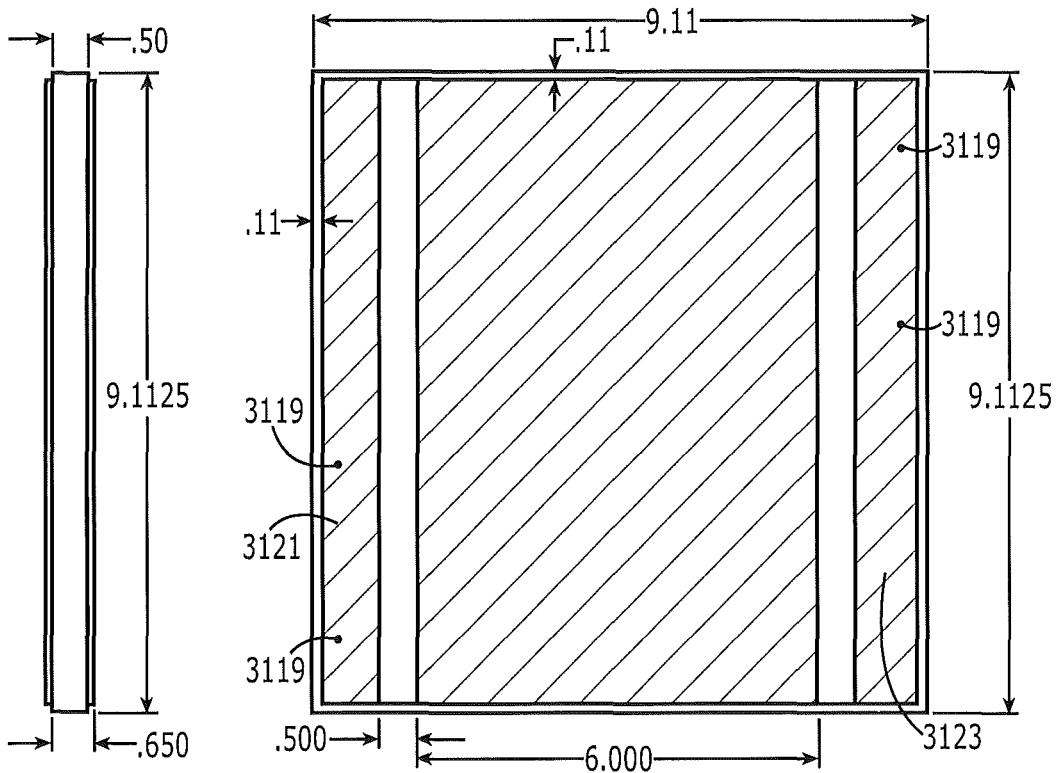
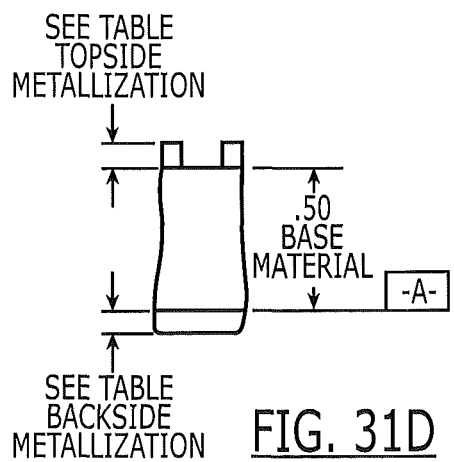

| | MATERIAL | TOPSIDE METALLIZATION | BACKSIDE METALLIZATION |
|---|---|---|---|
| | Ti | .06um | .06um |
| | Electroless Cu | 50 ± 10um | 50 ± 10um |
| | Electroless Ag | .2 - .5um | .2 - .5um |
| | SOLDER MASK PSR4000-G23KHP | Flash to 2um below metallized surface | 10-13um |

FIG. 31E

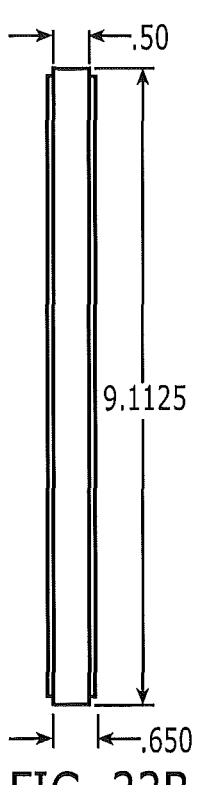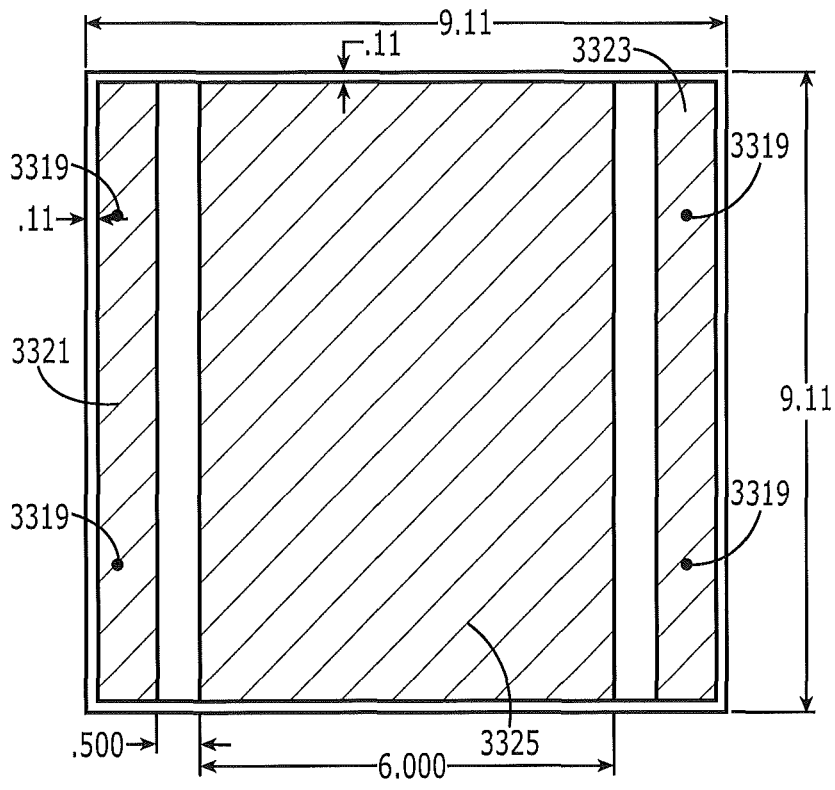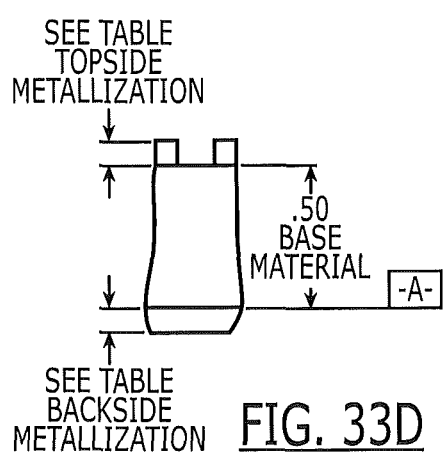
FIG. 33B
FIG. 33C
FIG. 33D

| | MATERIAL | TOPSIDE METALLIZATION | BACKSIDE METALLIZATION |
|---|---|---|---|
| | Ti | .06um | .06um |
| | Electroless Cu | 50 ± 10um | 50 ± 10um |
| | Electroless Ag | .2 - .5um | .2 - .5um |
| | TRENCH SOLDER MASK LEW-3 | Flash to 2um below metallized surface | 10-13um |
| | TOP SOLDER MASK | ABOVE SURFACE | 10-13um |

FIG. 33E

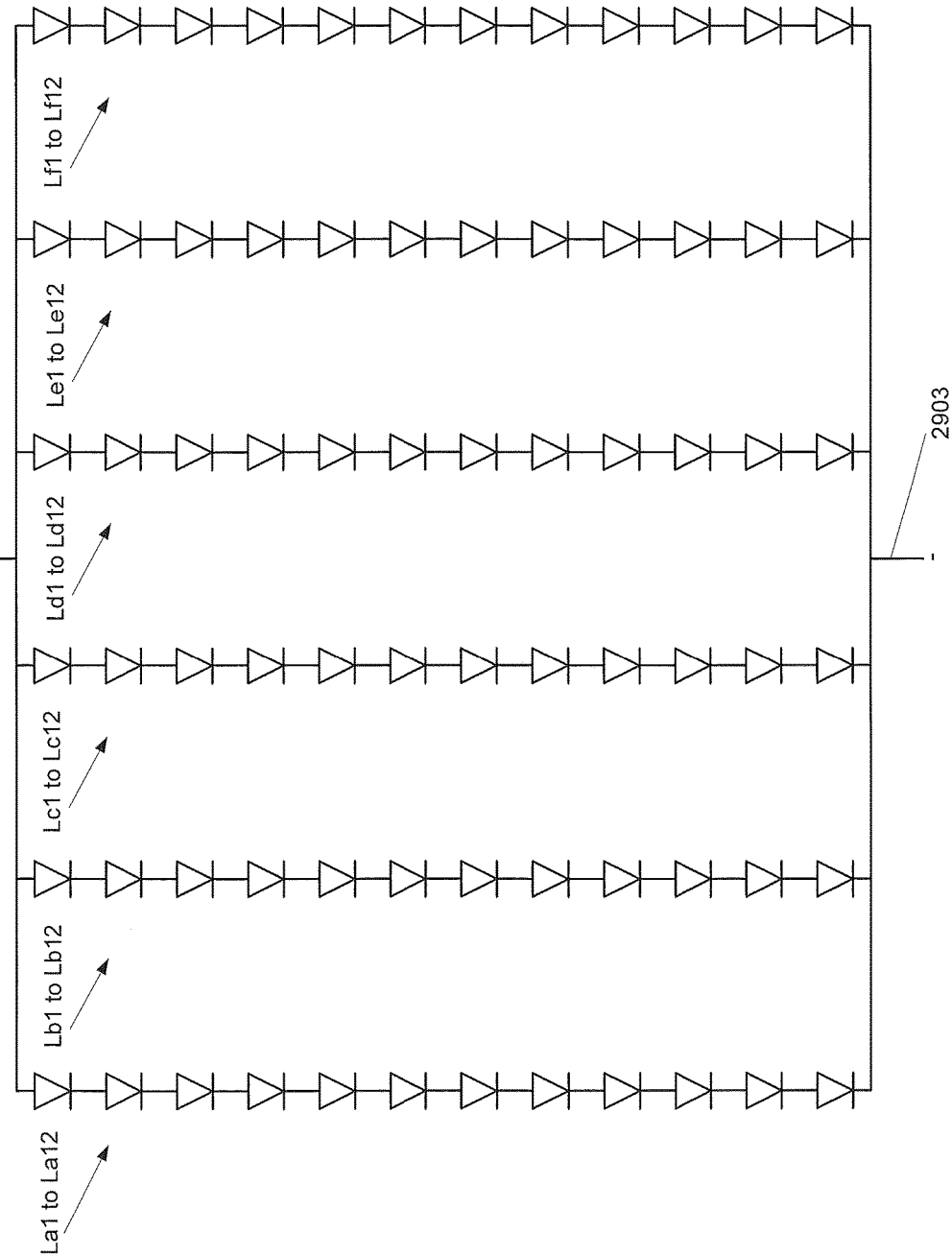

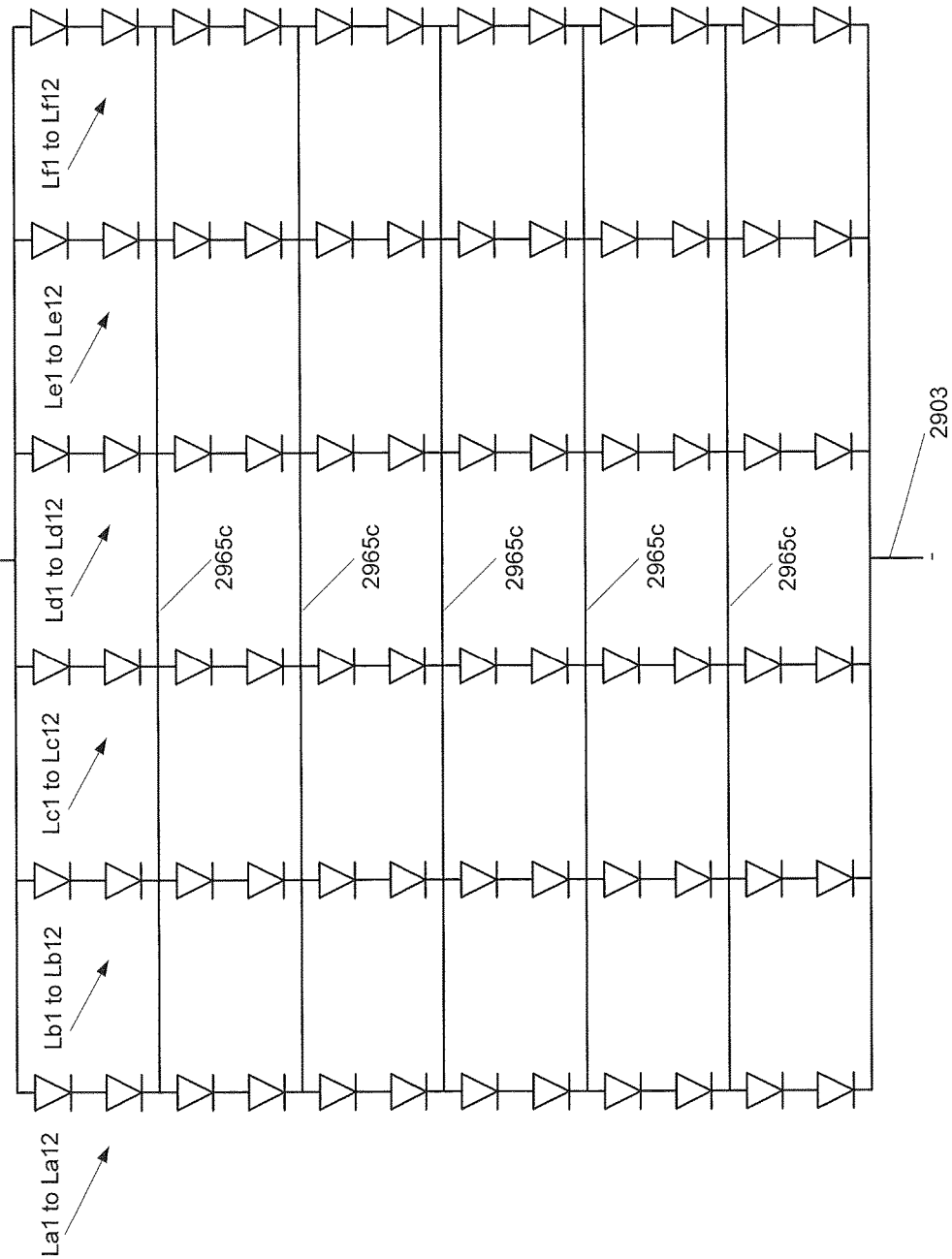

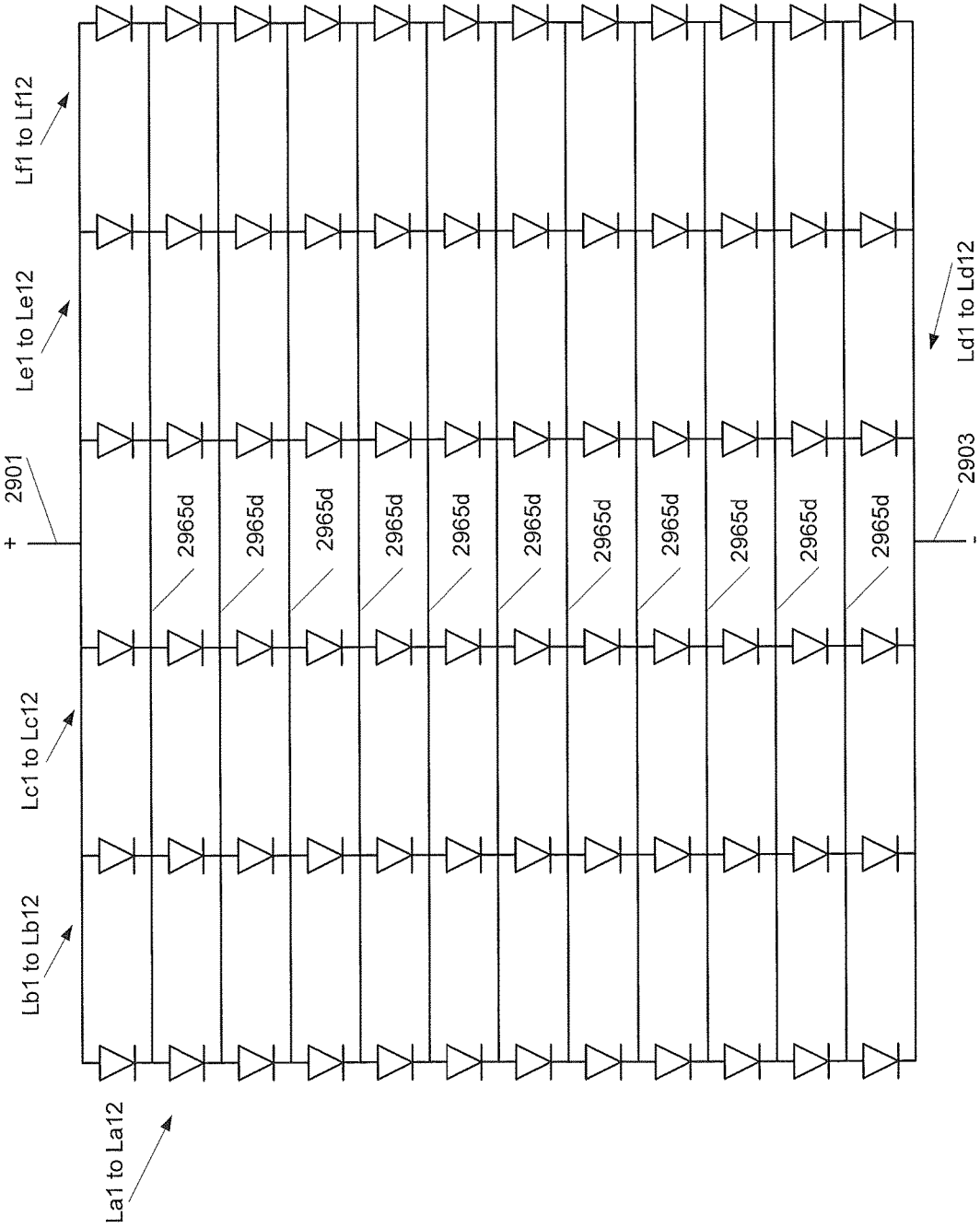

LIGHT EMITTING DIODE (LED) ARRAYS INCLUDING DIRECT DIE ATTACH AND RELATED ASSEMBLIES

RELATED APPLICATIONS

The present application claims the benefit of priority as a continuation-in-part (CIP) of U.S. application Ser. No. 13/027,006 filed Feb. 14, 2011, and entitled "Light Emitting Diode (LED) Arrays Including Direct Die Attach And Related Assemblies" which claims the benefit of priority as a continuation-in-part (CIP) of U.S. application Ser. No. 13/018,013 filed Jan. 31, 2011, and entitled "Horizontal Light Emitting Diodes Including Phosphor Particles." The present application also claims the benefit of priority of U.S. Provisional Application No. 61/589,173 filed Jan. 20, 2012. The disclosures of all of the above referenced applications are hereby incorporated herein in their entireties by reference.

BACKGROUND

This invention relates to semiconductor light emitting devices and assemblies and methods of manufacturing the same, and more particularly, to semiconductor Light Emitting Diodes (LEDs) and assemblies thereof.

Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

LEDs are increasingly being used in lighting/illumination applications, with a goal being to provide a replacement for ubiquitous incandescent and fluorescent lighting. To accomplish the goal of replacing traditional lighting with LED lighting, LED lighting designers are faced with stringent dimensional, energy efficiency and luminous flux output requirements. Such requirements have caused LED designers to produce LED arrays in varying arrangements. Typical LED arrangements involve the use of wire bonds. The use of wire bonds creates a constraint on the density with which individual LED chips can be packaged together due to mechanical or manufacturing constraints and problems with light absorption, for example due to the wire bond pads. The use of monolithic LED chip arrays can resolve some of the issues with wire bond pads, but the monolithic LED chips may add increased costs, limited shapes and reduced yield.

SUMMARY

Some embodiments of the present invention may provide small area LEDs with LED arrays for various applications, such as higher voltage applications, where LED chip bonding area is more efficiently used to balance practical aspects of maintaining a chip spacing that provides ease of manufacture, improved yield and/or less light absorption to provide more efficient and/or improved light output. Depending on the dimensional requirements and desired operating voltage, the packaged LED array can provide different serial/parallel configurations. The packaged LED array can use wirebond-free LEDs which are individually selected and/or reflow bonded to a packaging substrate. In certain embodiments, the packaging substrate includes small conductive islands, and LED chips can bridge the smaller conductive islands to electrically couple the LED chips in series. The packaging substrate can include larger conductive islands or contiguous conductive pads to electrically couple the LED chips in parallel. In some embodiments, different sized and/or shaped conductive pads or islands can be used to provide the desired serial and/or parallel configuration for the LED array in a desired shape.

According to some embodiments, an electronic device may include a packaging substrate having a packaging face, with the packaging substrate including positive and negative electrically conductive pads on the packaging face. A plurality of light emitting diodes may be electrically and mechanically coupled to the packaging face of the packaging substrate, with the plurality of light emitting diodes being electrically coupled between the positive and negative electrically conductive pads on the packaging face. In addition, a continuous optical coating may be provided on the plurality of light emitting diodes and on the packaging face of the packaging substrate so that the plurality of light emitting diodes are between the optical coating and the packaging substrate, and an optic area may be defined by an area of the packaging face covered by the continuous optical coating. More particularly, the plurality of light emitting diodes may be configured to generate at least 20 lumens per square millimeter of the optic area while delivering at least 100 lumens per watt of power consumed by the plurality of light emitting diodes between the continuous optical coating and the packaging substrate. Still more particularly, the plurality of light emitting diodes may be configured to generate at least 25 lumens per square millimeter of the optic area while delivering at least 100 lumens per watt of power consumed, and/or the electronic device of Claim 1 wherein the optic area is in the range of about 20 square millimeters to about 200 square millimeters.

The plurality of light emitting diodes may include at least 2 light emitting diodes between the continuous optical coating and the packaging substrate, at least 6 light emitting diodes between the continuous optical coating and the packaging substrate, at least 16 light emitting diodes between the continuous optical coating and the packaging substrate, at least 72 light emitting diodes between the continuous optical coating and the packaging substrate, at least 98 light emitting diodes between the continuous optical coating and the packaging substrate, at least 108 light emitting diodes between the continuous optical coating and the packaging substrate, at least 192 light emitting diodes between the continuous optical coating and the packaging substrate, or even at least 200 light emitting diodes between the continuous optical coating and the packaging substrate.

At least one of the light emitting diodes is free of wirebonds. For example, at least one of the light emitting diodes may include an anode contact electrically and mechanically coupled to the packaging substrate using a first metallic bond (e.g., a first solder bond) physically located between the anode contact and the packaging substrate and a cathode contact electrically and mechanically coupled to the packaging substrate using a second metallic bond (e.g., a second solder bond) physically located between the cathode contact and the packaging substrate. More particularly, each of the plurality of light emitting diodes may include a diode region having first and second opposing faces including therein an n-type layer and a p-type layer, an anode contact that ohmically contacts the p-type layer and extends on the first face, a cathode contact that ohmically contacts the n-type layer and extends on the first face, and a support substrate on the second face of the diode region, with the diode region being between the support substrate and the anode and cathode contacts, and with the support substrate having a thickness of at least about 50 micrometers. Moreover, for each of the plurality of light emitting diodes, the diode region may be between the support substrate and the packaging substrate.

The continuous optical coating include a layer of a transparent and/or translucent material including a phosphor material therein. Moreover, a thickness of the continuous optical coating relative to the packaging face of the packaging substrate may be greater than a thickness of each of the plurality of light emitting diodes relative to the packaging face of the packaging substrate, and a surface of the continuous optical coating opposite the packaging substrate may be substantially planar over an area including the plurality of light emitting diodes.

The packaging substrate may also have a backside face opposite the packaging face. Moreover, the packaging substrate may further include a first backside contact electrically coupled to the positive electrically conductive pad through a first electrically conductive via through the packaging substrate, and a second backside contact electrically coupled to the negative electrically conductive pad through a second electrically conductive via through the packaging substrate. In addition, the packaging substrate may include an aluminum nitride substrate, and a metal heat conducting structure on the backside face. The metal heat conducting structure may be electrically isolated from the first and second backside contacts, and the metal heat conducting structure may be aligned with the plurality of light emitting diodes in a direction perpendicular with respect to the packaging face of the packaging substrate.

The plurality of light emitting diodes may include a first string of light emitting diodes electrically coupled in series between the positive and negative electrically conductive pads, and a second string of light emitting diodes electrically coupled in series between the positive and negative electrically conductive pads. In addition, a node between two light emitting diodes of the first string may be electrically coupled to a node between two light emitting diodes of the second string, and at least one of the plurality of light emitting diodes may be electrically coupled to the packaging substrate using no more than one wirebond.

The continuous optical coating may include a layer of a transparent and/or translucent material including different first and second phosphor materials therein, with the first and second phosphor materials being configured to emit different wavelengths of light.

The plurality of light emitting diodes may be configured to generate at least 20 lumens per square millimeter of the optic area while delivering at least 100 lumens per watt of power consumed by the plurality of light emitting diodes between the continuous optical coating and the packaging substrate and while delivering at least 600 absolute lumens, at least 800 lumens, at least 1100 lumens, or even at least 1500 lumens from the plurality of light emitting diodes between the continuous optical coating and the packaging substrate.

The plurality of light emitting diodes may include first and second light emitting diodes between the continuous optical coating and the packaging substrate with the first and second light emitting diodes being spaced apart by a distance in the range of about 20 micrometers to about 500 micrometers.

According to some other embodiments, an electronic device may include a packaging substrate having a packaging face, the packaging substrate including positive and negative electrically conductive pads on the packaging face. A plurality of light emitting diodes may be electrically and mechanically coupled to the packaging face of the packaging substrate, with the plurality of light emitting diodes being electrically coupled between the positive and negative electrically conductive pads on the packaging face. A continuous optical coating may be provided on the plurality of light emitting diodes and on the packaging face of the packaging substrate so that the plurality of light emitting diodes are between the optical coating and the packaging substrate. A thickness of the continuous optical coating relative to the packaging face of the packaging substrate may be greater than a thickness of each of the plurality of light emitting diodes relative to the packaging face of the packaging substrate, and a surface of the continuous optical coating opposite the packaging substrate may be substantially planar over an area including the plurality of light emitting diodes, and at least one of the plurality of light emitting diodes may be free of wirebonds.

An optic area may be defined by an area of the packaging face covered by the continuous optical coating, and the plurality of light emitting diodes may be configured to generate at least 20 lumens per square millimeter of the optic area while delivering at least 100 lumens per watt of power consumed by the plurality of light emitting diodes between the continuous optical coating and the packaging substrate.

The plurality of light emitting diodes may include at least 2 light emitting diodes, at least 6 light emitting diodes, at least 16 light emitting diodes, at least 72 light emitting diodes, at least 98 light emitting diodes, at least 108 light emitting diodes, at least 192 light emitting diodes, or even at least 200 light emitting diodes. At least one of the light emitting diodes may include an anode contact electrically and mechanically coupled to the packaging substrate using a first metallic bond located between the anode contact and the packaging substrate and a cathode contact electrically and mechanically coupled to the packaging substrate using a second metallic bond located between the cathode contact and the packaging substrate.

Each of the plurality of light emitting diodes may include a diode region having first and second opposing faces including therein an n-type layer and a p-type layer, an anode contact that ohmically contacts the p-type layer and extends on the first face, a cathode contact that ohmically contacts the n-type layer and extends on the first face, and a support substrate on the second face of the diode region. Moreover, the diode region may be between the support substrate and the anode and cathode contacts, and the support substrate may have a thickness of at least about 50 micrometers. For each of the plurality of light emitting diodes, the diode region may be between the support substrate and the packaging substrate. The continuous optical coating may include a layer of a transparent and/or translucent material including a phosphor material therein.

The packaging substrate may have a backside face opposite the packaging face, and the packaging substrate may further include a first backside contact electrically coupled to the positive electrically conductive pad through a first electrically conductive via, and a second backside contact electrically coupled to the negative electrically conductive pad through a second electrically conductive via. The packaging substrate may include a thermally conductive and electrically insulating material and a metal heat conducting structure on the backside face. The metal heat conducting structure may be electrically isolated from the first and second backside contacts, and the metal heat conducting structure may be aligned with the plurality of light emitting diodes in a direction perpendicular with respect to the packaging face of the packaging substrate.

The plurality of light emitting diodes may include a first string of light emitting diodes electrically coupled in series between the positive and negative electrically conductive pads, and a second string of light emitting diodes electrically coupled in series between the positive and negative electrically conductive pads. A node between two light emitting diodes of the first string may be electrically coupled to a node between two light emitting diodes of the second string, and at least one of the plurality of light emitting diodes may be free of wirebonds.

The continuous optical coating may include a layer of a transparent and/or translucent material including different first and second phosphor materials therein, and the first and second phosphor materials may be configured to emit different wavelengths of light. In addition, a dam may surround the plurality of light emitting diodes, with the continuous optical coating being confined within the dam.

According to still other embodiments, an electronic device may include a packaging substrate having a packaging face with the packaging substrate including positive and negative electrically conductive pads on the packaging face. A plurality of light emitting diodes may be electrically and mechanically coupled to the packaging face of the packaging substrate, with the plurality of light emitting diodes being electrically coupled between the positive and negative electrically conductive pads on the packaging face. The plurality of light emitting diodes may include a first string of light emitting diodes electrically coupled in series between the positive and negative electrically conductive pads, and a second string of light emitting diodes electrically coupled in series between the positive and negative electrically conductive pads. A node between two light emitting diodes of the first string may be electrically coupled to a node between two light emitting diodes of the second string, and at least one of the plurality of light emitting diodes may be electrically coupled to the packaging substrate using no more than one wirebond.

A continuous optical coating may be provided on the plurality of light emitting diodes and on the packaging face of the packaging substrate so that the plurality of light emitting diodes are between the optical coating and the packaging substrate. An optic area may be defined by an area of the packaging face covered by the continuous optical coating, and the plurality of light emitting diodes may be configured to generate at least 20 lumens per square millimeter of the optic area while delivering at least 100 lumens per watt of power consumed by the plurality of light emitting diodes between the continuous optical coating and the packaging substrate.

The plurality of light emitting diodes may include at least 2 light emitting diodes, at least 6 light emitting diodes, at least 16 light emitting diodes, at least 72 light emitting diodes, at least 98 light emitting diodes, at least 108 light emitting diodes, at least 192 light emitting diodes, or even at least 200 light emitting diodes. Moreover, at least one of the light emitting diodes may be free of wirebonds.

At least one of the light emitting diodes may include an anode contact electrically and mechanically coupled to the packaging substrate using a first metallic bond physically located between the anode contact and the packaging substrate and a cathode contact electrically and mechanically coupled to the packaging substrate using a second metallic bond physically located between the cathode contact and the packaging substrate.

Each of the plurality of light emitting diodes may include a diode region having first and second opposing faces including therein an n-type layer and a p-type layer, an anode contact that ohmically contacts the p-type layer and extends on the first face, a cathode contact that ohmically contacts the n-type layer and extends on the first face, and a support substrate on the second face of the diode region. More particularly, the diode region may be between the support substrate and the anode and cathode contacts, and the support substrate may have a thickness of at least about 50 micrometers. For each of the plurality of light emitting diodes, the diode region may be between the support substrate and the packaging substrate.

The continuous optical coating may include a layer of a transparent and/or translucent material including a phosphor material therein. A thickness of the continuous optical coating relative to the packaging face of the packaging substrate may be greater than a thickness of each of the plurality of light emitting diodes relative to the packaging face of the packaging substrate, and a surface of the continuous optical coating opposite the packaging substrate may be substantially planar over an area including the plurality of light emitting diodes.

The packaging substrate may have a backside face opposite the packaging face. The packaging substrate may further include a first backside contact electrically coupled to the positive electrically conductive pad through a first electrically conductive via through the packaging substrate, and a second backside contact electrically coupled to the negative electrically conductive pad through a second electrically conductive via through the packaging substrate. The packaging substrate may include an aluminum nitride substrate, and a metal heat conducting structure on the backside face with the metal heat conducting structure being electrically isolated from the first and second backside contacts. Moreover, the metal heat conducting structure may be aligned with the plurality of light emitting diodes in a direction perpendicular with respect to the packaging face of the packaging substrate.

Moreover, the continuous optical coating may include a layer of a transparent and/or translucent material including different first and second phosphor materials therein, wherein the first and second phosphor materials are configured to emit different wavelengths of light.

According to yet other embodiments, an electronic device may include a packaging substrate having a packaging face, with the packaging substrate including positive and negative electrically conductive pads on the packaging face. A plurality of light emitting diodes may be electrically and mechanically coupled to the packaging face of the packaging substrate, and the plurality of light emitting diodes may be electrically coupled between the positive and negative electrically conductive pads on the packaging face. Moreover, each of the plurality of light emitting diodes may have a forward voltage drop in the range of about 2.5 volts to about 3.5 volts, the plurality of light emitting diodes may be configured to provide a combined forward voltage drop between the positive and negative electrically conductive pads of at least about 36 volts, and at least one of the plurality of light emitting diodes may be free of wirebonds.

The plurality of light emitting diodes may include at least two light emitting diodes electrically coupled in series, at least 6 light emitting diodes electrically coupled in series, at least 16 light emitting diodes electrically coupled in series, at least 72 light emitting diodes electrically coupled in series, at least 98 light emitting diodes electrically coupled in series, at least 108 light emitting diodes electrically coupled in series, at least 192 light emitting diodes electrically coupled in series, or even at least 200 light emitting diodes electrically coupled in series. For example, the plurality of light emitting diodes may include at least 70 light emitting diodes electrically coupled in series between the positive and negative electrically conductive pads, and the plurality of light emitting diodes may be configured to provide a combined forward voltage drop between the positive and negative electrically conductive pads of at least about 200 volts. Moreover, the plurality of light emitting diodes may include at least 75 light emitting diodes electrically coupled in series between the positive and negative electrically conductive pads, and the plurality of light emitting diodes may be configured to provide a combined forward voltage drop between the positive and negative electrically conductive pads of at least about 220 volts.

The packaging substrate may include a plurality of electrically conductive islands providing electrical coupling between respective ones of the plurality of light emitting diodes between the positive and negative electrically conductive pads. The electrically conductive islands and the positive and negative electrically conductive pads may define a reflective area on the packaging substrate surrounding the plurality of light emitting diodes, and at least one of the electrically conductive islands may extend to an edge of the reflective area adjacent to the one of the positive and/or negative electrically conductive pads with an electrically insulating gap defined therebetween. The at least one of the electrically conductive islands may include a first electrically conductive island, and a second one of the electrically conductive islands may extend to the edge of the reflective area adjacent to the first electrically conductive island with an electrically insulating gap defined between the first and second electrically conductive islands.

The packaging substrate may include a plurality of electrically conductive islands providing electrical coupling between respective ones of the plurality of light emitting diodes between the positive and negative electrically conductive pads. The packaging substrate may include an electrically conductive reflector layer adjacent at least one of the plurality of electrically conductive islands and adjacent at least one of the positive and/or negative electrically conductive pads. The electrically conductive islands, the electrically conductive reflector, and the positive and negative electrically conductive pads may define a reflective area on the packaging substrate surrounding the plurality of light emitting diodes, and the electrically conductive reflector may be electrically isolated from each of the positive electrically conductive pad, the negative electrically conductive pad, and each of the plurality of electrically conductive islands.

At least two light emitting diodes of the plurality of light emitting diodes may be electrically coupled in parallel between the positive and negative electrically conductive pads, and/or at least two strings of the plurality of light emitting diodes may be electrically coupled in parallel between the positive and negative electrically conductive pads. At least one of the light emitting diodes may include an anode contact electrically and mechanically coupled to the packaging substrate using a first metallic bond physically located between the anode contact and the packaging substrate and a cathode contact electrically and mechanically coupled to the packaging substrate using a second metallic bond physically located between the cathode contact and the packaging substrate.

Each of the plurality of light emitting diodes may include a diode region having first and second opposing faces including therein an n-type layer and a p-type layer, an anode contact that ohmically contacts the p-type layer and extends on the first face, a cathode contact that ohmically contacts the n-type layer and extends on the first face, and a support substrate on the second face of the diode region. Moreover, the diode region may be between the support substrate and the anode and cathode contacts, and the support substrate may have a thickness of at least about 50 micrometers.

In addition, a continuous optical coating may be provided on the plurality of light emitting diodes. The continuous optical coating may include a layer of a transparent and/or translucent material including a phosphor material therein, and a thickness of the continuous optical coating relative to the packaging face of the packaging substrate may be greater than a thickness of each of the plurality of light emitting diodes relative to the packaging face of the packaging substrate. A surface of the continuous optical coating opposite the packaging substrate may be substantially planar over an area including the plurality of light emitting diodes. Moreover, a dam may surround the plurality of light emitting diodes, with the continuous optical coating being confined within the dam.

BRIEF DESCRIPTION OF THE DRAWINGS

FIGS. 7A and 7B are respective plan and cross-sectional views of an array of packaged LED die electrically coupled in parallel on a submount according to various embodiments described herein.

FIGS. 8A and 8B are respective plan and cross-sectional views of an array of packaged LED die electrically coupled in parallel on a submount including interdigitated cathode and anode pads according to various embodiments described herein.

FIGS. 9A and 9B are respective plan and cross-sectional views of an array of radially arranged LED die electrically coupled in parallel on a submount according to various embodiments described herein.

FIGS. 10A and 10B are respective plan and cross-sectional views of an array of packaged LED die electrically coupled in parallel on a submount including interdigitated electrodes according to various embodiments described herein.

FIG. 14C is a cross-sectional view of a column of LED die from the array of FIG. 14B.

FIG. 18 is a cross-sectional view of an array of LED die with a continuous and conformal phosphor layer according to various embodiments described herein.

FIG. 23E is a table providing a legend of materials and dimensions of FIGS. 23A-23D according to embodiments described herein.

FIG. 29E is a table providing a legend of materials and dimensions of FIGS. 29A-29D according to embodiments described herein.

FIG. 30A is an enlarged top view of the submount of FIGS. 29A-29E according to embodiments described herein.

FIGS. 31A, 31B, and 31C, are respective top side, edge, and bottom side views of an LED (light emitting diode) packaging submount (with dimensions shown in mm) according to additional embodiments described herein.

FIG. 31D is a enlarged cross sectional view of the submount of FIGS. 31A, 31B, and 31C illustrating dimensions of top side and bottom side metallizations according to embodiments described herein.

FIG. 31E is a table providing a legend of materials and dimensions of FIGS. 31A-31D according to embodiments described herein.

FIGS. 33A, 33B, and 33C, are respective top side, edge, and bottom side views of an LED (light emitting diode) packaging submount (with dimensions shown in mm) according to additional embodiments described herein.

FIG. 33D is a enlarged cross sectional view of the submount of FIGS. 33A, 33B, and 33C illustrating dimensions of top side and bottom side metallizations according to embodiments described herein.

FIG. 33E is a table providing a legend of materials and dimensions of FIGS. 33A-33D according to embodiments described herein.

FIG. 36A is a schematic diagram illustrating electrical couplings of LEDs La1 to La12, Lb1 to Lb12, Lc1 to Lc12, Ld1 to Ld12, Le1 to Le12, and Lf1 to Lf12 of the device of FIGS. 29A-29E and 30A-30C according to embodiments described herein.

FIGS. 36B, 36C, and 36D are schematic diagrams illustrating alternative electrical couplings of LEDs of FIGS. 29A-29E and 30A-30C according to embodiments described herein.

DETAILED DESCRIPTION

Figure 1:
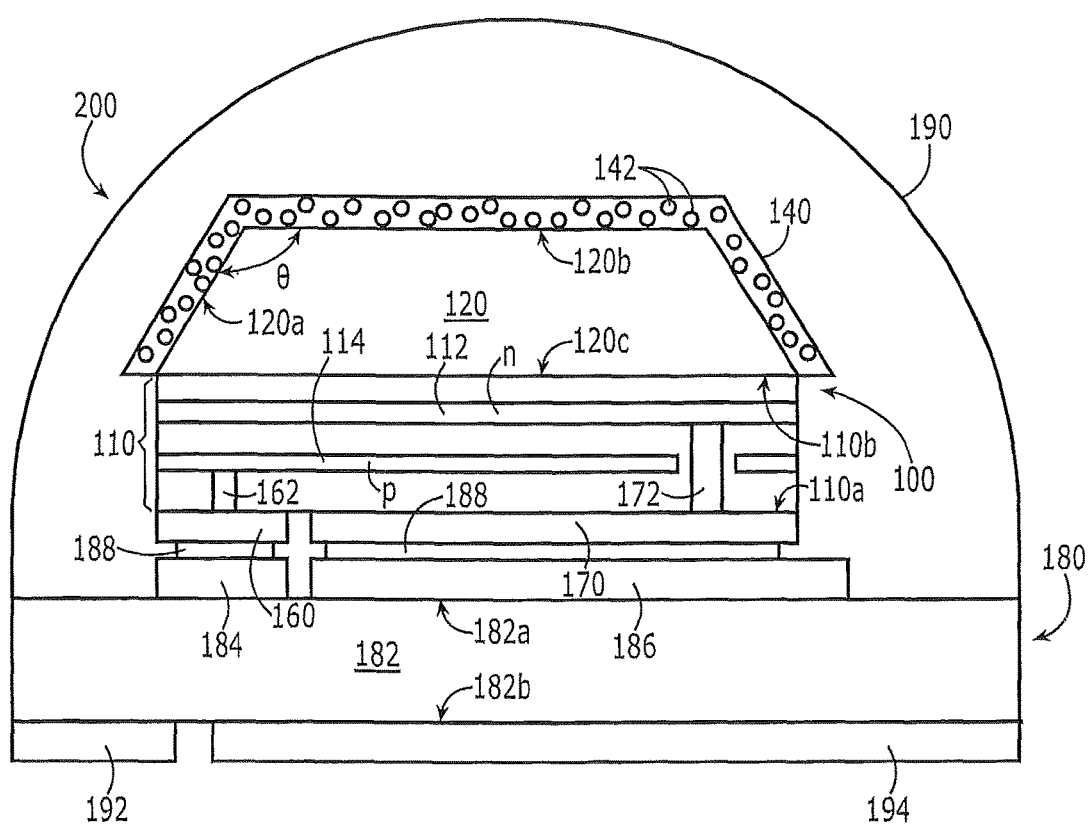
FIGS. 1 and 2 are cross-sectional views of LEDs and packaged LEDs according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" when at least 90% of the radiation from the LED that impinges on the transparent layer or region emerges through the transparent region. For example, in the context of blue and/or green LEDs that are fabricated from gallium nitride-based materials, silicon dioxide can provide a transparent insulating layer (for example, at least 90% transparent), whereas indium tin oxide (ITO) can provide a transparent conductive layer (for example, at least 90% transparent) as measured by considering transmitted and reflected components on a sapphire substrate. Moreover, as used herein, a layer or region of an LED is considered to be "reflective" when at least 90% of the angle averaged radiation that impinges on the reflective layer or region from the LED is reflected back into the LED. For example, in the context of gallium nitride-based blue and/or green LEDs, silver (for example, at least 90% reflective) may be considered reflective materials. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

It is known to provide a conformal phosphor layer on an oblique or tapered sidewall of a light emitting diode, as described in U.S. Pat. No. 6,853,010, to Slater, Jr. et al., entitled Phosphor-Coated Light Emitting Diodes Including Tapered Sidewalls, and Fabrication Methods Therefor, assigned to the assignee of the present application, the entire disclosure of which is hereby incorporated by reference herein as if set forth fully herein (hereinafter referred to as "the '010 patent"). As described in the '010 patent, the tapered or oblique sidewall can allow at least some of the emitting surfaces of a light emitting diode (LED) to be covered with a nearly conformal phosphor-containing layer of substantially uniform thickness. This more conformal coverage can produce a desired spectrum of light, while also allowing more radiant flux to be emitted from the phosphor-coated LED. Phosphor layers are further discussed detail in U.S. application Ser. No. 13/018,013 to Donofrio et al., entitled Horizontal Light Emitting Diodes Including Phosphor Particles, and in U.S. application Ser. No. 13/017,845 to Donofrio et al., entitled Conformally Coated Light Emitting Devices And Methods For Providing The Same, both filed Jan. 31, 2011, and assigned to the assignee of the present application. The disclosures of both of the above referenced applications are hereby incorporated herein by reference in their entireties as if set forth fully herein.

Various embodiments described herein may arise from recognition that a conformal phosphor layer on an oblique sidewall of an LED may provide further unanticipated advantages. Specifically, larger particle size phosphor particles may be used in the conformal layer that comprises phosphor. It is well known that larger phosphor particles are generally more efficient in light conversion than small sized phosphor particles. Unfortunately, due to their large size, large phosphor particles may also have a lower light scattering efficiency than relatively small phosphor particles. The low scattering efficiency may produce a high angular variation in Correlated Color Temperature (CCT), which is typical in white LEDs using large particulate size phosphor particles for brightness boost.

In sharp contrast, various embodiments described herein may provide relatively high brightness with relatively low angular variation, by providing a conformal layer that comprises large phosphor particles on the outer face and on the oblique sidewall of an LED.

It will be understood that real world phosphor particle layers are not precisely uniform in size. Rather, consistent with other particulate materials, a range of particle sizes may be provided, and various metrics are used to indicate a measure of particle size in a particulate material. Particle size is generally measured by an equivalent particle diameter, which may take into account the fact that the particles may be non-spherical. Moreover, the particle size distribution may be specified by providing one or more equivalent particle diameters, often abbreviated with "d", to indicate a mass percent of the particles that has a smaller diameter. Thus, d50, also referred to as an average equivalent particle diameter, indicates that 50 mass-% of the particles has a smaller diameter. Moreover, an equivalent particle diameter d10 refers to 10 mass-% of the particles having a smaller diameter, whereas an equivalent particle diameter d90 refers to 90 mass-% of the particles having a smaller diameter. A given phosphor may be specified in terms of d50, d10 and/or d90. Moreover, other metrics other than d50, d10 and d90 may be used, such as d75 and d25. Combinations of these metrics also may be used.

FIG. 1 is a cross-sectional view of a light emitting diode (also referred to as a light emitting diode "die" or "chip") and a packaged light emitting diode according to various embodiments described herein. Referring to FIG. 1, these light emitting diodes 100 include a diode region 110 having first and second opposing faces 110a, 110b, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on a first face 110a. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110a. The cathode contact may directly ohmically contact the n-type layer 112, or may ohmically contact the n-type layer 112 by way of one or more conductive vias 172 and/or other intermediate layers. As illustrated in FIG. 1, the anode contact 160 and the cathode contact 170 that both extend on the first face 110a are coplanar. The diode region 110 also may be referred to herein as an "LED epi region", because it is typically formed epitaxially on a substrate 120. For example, a Group III-nitride based LED epi 110 may be formed on a silicon carbide growth substrate. In some embodiments, as will be described below, the growth substrate may be present in the finished product. In other embodiments, the growth substrate may be removed. In still other embodiments, another substrate may be provided that is different from the growth substrate, and the other substrate may be bonded to the LED after removing the growth substrate.

As also shown in FIG. 1, a transparent substrate 120, such as a transparent silicon carbide growth substrate or a transparent sapphire growth substrate, is included on the second face 110b of the diode region 110. The transparent substrate 120 includes a sidewall 120a and may also include an inner face 120c adjacent the second face 110b of the diode region 110 and an outer face 120b, remote from the inner face 120c. The outer face 120b is of smaller area than the inner face 120c. In some embodiments, the sidewall 120a may be stepped, beveled and/or faceted, so as to provide the outer face 120b that is of smaller area than the inner face 120c. In other embodiments, as shown in FIG. 1, the sidewall is an oblique sidewall 120a that extends at an oblique angle θ, and in some embodiments at an obtuse angle, from the outer face 120b towards the inner face 120c. According to some embodiments, transparent substrate 120 may have a thickness of at least about 50 micrometers, at least about 100 micrometers, or even at least about 150 micrometers. Transparent substrate 120, for example, may have a thickness in the range of about 150 micrometers to about 400 micrometers, or in the range of about 175 micrometers to about 35 micrometers. Phosphor layer 140 may thus be separated from portions of diode region 110 by a thickness of transparent substrate 120.

LEDs 100 configured as was described above in connection with FIG. 1, may be referred to as "horizontal" or "lateral" LEDs, because both the anode and the cathode contacts thereof are provided on a single face of the LED. Horizontal LEDs may be contrasted with vertical LEDs in which the anode and cathode contacts are provided on opposite faces thereof, as is illustrated, for example, in the '010 patent.

Various other configurations of horizontal LEDs that may be used according to any of the embodiments described herein, are described in detail in U.S. Patent Application publication 2009/0283787 to Donofrio et al., entitled Semiconductor Light Emitting Diodes Having Reflective Structures and Methods of Fabricating Same, assigned to the assignee of the present application, the disclosure of which is hereby incorporated herein by reference in its entirety as if set forth fully herein (hereinafter referred to as "the '787 Publication").

Still continuing with the description of FIG. 1, a conformal layer 140 that comprises phosphor particles 142 having an average equivalent particle diameter d50 of at least 10 µm, is provided on the outer face 120b and on the oblique sidewall 120a. In embodiments of FIG. 1, the entire outer face 120b and the entire oblique sidewall 120a are covered with the phosphor layer 140. However, in other embodiments, the entire outer face 120b and/or the entire oblique sidewall 120a need not be covered with the phosphor layer 140. Moreover, the conformal phosphor layer 140 may be of uniform thickness on the outer face 120b and on the oblique sidewall 120a. In some embodiments, this uniform thickness is between the range of between about 36 µm and about 56 µm and, in other embodiments, a range of between about 30 µm and about 75 µm may be provided. In other embodiments, a thickness of about 46 µm may be provided.

Various embodiments of phosphor layers 140 and diode regions 110 may be provided according to various embodiments described herein. For example, in some embodiments, the diode region 110 is configured to emit blue light, for example light having a dominant wavelength of about 450-460 nm, and the conformal layer comprises yellow phosphor, such as YAG:Ce phosphor having a peak wavelength of about 550 nm and an average equivalent particle diameter d50 of at least 10 µm. In other embodiments, an average equivalent diameter d50 of about 15 µm is provided. In still other embodiments, an average equivalent diameter d50 of between about 15 µm and about 17 µm is provided.

In other embodiments, the diode region 110 is configured to emit blue light upon energization thereof, as described above, and the conformal layer 140 may comprise a mixture of phosphor having average equivalent particle diameter of at least about 10 µm, as described above, and red phosphor, such as a CASN-based phosphor, having an average equivalent particle diameter d50 of about 10 µm in size. In still other embodiments, the mixture of yellow phosphor and red phosphor may have a phosphor weight ratio of the yellow phosphor to the red phosphor of at least about 5:1 and, in other embodiments, at least about 9:1. In some embodiments, since at least five times as much yellow phosphor as red phosphor is provided, a wider range of red phosphor particle sizes may be used in combination with yellow phosphor particles having an average equivalent particle diameter d50 of at least about 10 µm.

As was described above, various embodiments of FIG. 1 may arise from recognition that a conformal phosphor layer 140 on an oblique sidewall 120a of an LED 100 may provide further unanticipated advantages. Specifically, large particle size phosphor particles 142 may be used in the conformal layer 140 that comprises phosphor. It is well known that larger phosphor particles 142 are generally more efficient in light conversion than small sized phosphor particles. Unfortunately, due to their large size, large phosphor particles 142 may also have a lower light scattering efficiency than relatively small phosphor particles. The low scattering efficiency may produce a high angular variation in CCT, which is typical in white LEDs using large particulate size phosphor particles for brightness boost.

In sharp contrast, various embodiments described herein may provide relatively high brightness with relatively low angular variation, by providing a conformal layer 140 that comprises large phosphor particles 142 on the outer face 120b and on the oblique sidewall 120a of an LED.

Moreover, various embodiments described herein may provide other unexpected advantages. Specifically, since the CCT variation can be reduced compared to an LED with a non-oblique sidewall, less red phosphor may need to be used. For example, with non-oblique walls, a ratio of yellow phosphor to red phosphor may be about 2:1 whereas, as described above, ratios of at least about 5:1 or at least about 9:1 may be used. Since red phosphor often is more expensive than yellow phosphor, lower cost LEDs may be obtained. Moreover, since a higher ratio of yellow phosphor to red phosphor may be used, the particle size of the red phosphor may vary over a wide range because the particle size of the yellow phosphor will dominate.

Continuing with the description of FIG. 1, the LED 100 may be combined with a packaging substrate, such as a submount 180, and a lens 190 to provide a packaged LED 200. The submount 180 may include a body 182 that may comprise aluminum nitride (AlN). In other embodiments, metal core substrates, printed circuit boards, lead frames and/or other conventional packaging substrates may be used to mount the LED 100 in a flip-chip configuration. The submount 180 includes a submount face 182a, and an anode pad 184 and a cathode pad 186 thereon. The anode and cathode pads may comprise silver-plated copper and/or other conductive materials. As illustrated in FIG. 1, the LED 100 is mounted on the submount 180, such that the first face 110a is adjacent the submount face 182a, the outer face 110b is remote from the submount 180, the anode contact 184 is adjacent the anode pad 160, and the cathode contact 186 is adjacent the cathode pad 170. In some embodiments, a bonding layer, such as a eutectic gold/tin solder layer 188, is used to electrically, thermally and mechanically connect the anode contact 160 to the anode pad 184, and the cathode contact 170 to the cathode pad 186. In other embodiments, direct attachment of the anode contact 160 to the anode pad 184, and direct attachment of the cathode contact 170 to the cathode pad 186 may be provided, for example using thermocompression bonding and/or other techniques.

A packaged device anode 192 and a packaged device cathode 194 may be provided on a second face 182b of the submount body 182, and may be connected to the anode pad 184 and cathode pad 186, respectively, using internal vias and/or conductive layers that extend on and/or around the submount body 182.

Various embodiments of submounts 180 that may be used with embodiments described herein, are described in the '787 Publication that was cited above. Various other embodiments of submounts 180 are described in U.S. Patent Application Publication 2009/0108281 to Keller et al., entitled Light Emitting Diode Package and Method for Fabricating Same, assigned to the assignee of the present application, the disclosure of which is hereby incorporated herein by reference in its entirety as if set forth fully herein (hereinafter referred to as "the '281 Publication"). It will be understood that any and all embodiments of these submounts may be used in embodiments of FIG. 1. However, the pad structure on the submount may be modified so as to be used with a horizontal LED 100 of FIG. 1, rather than the vertical LEDs described in the '281 Publication.

Finally, the packaged LED 200 may also include a lens 190 that extends from submount face 180a to surround the LED 100. The lens 190 may be a molded plastic lens, as described in detail in the '281 Publication, and may be fabricated on the submount according to techniques that are described in the '281 Publication, and/or other techniques. In some embodiments, the lens may be about 3.06 mm in diameter.

Figure 2:
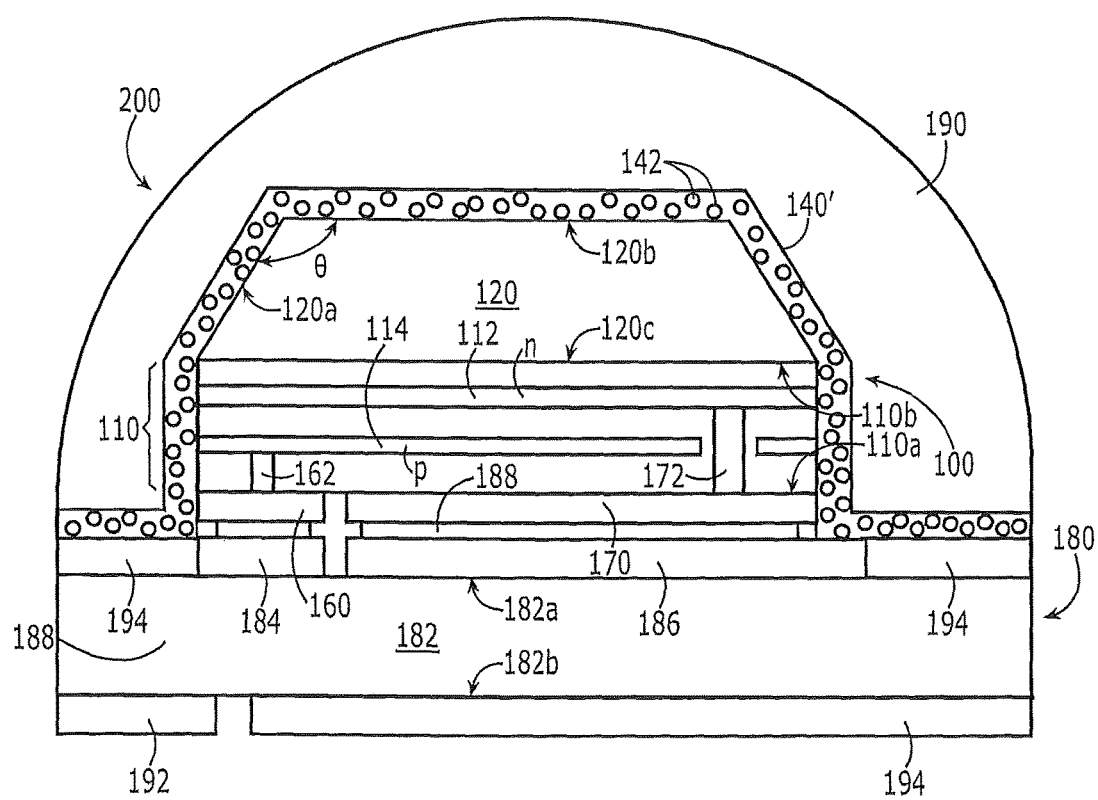

FIG. 2 is a cross-sectional view of LEDs and packaged LEDs according to various other embodiments. Compared to embodiments of FIG. 1, the phosphor layer 140' extends across the diode region 110 and/or on the first face 182 of the submount body 182. The phosphor layer may be fabricated to extend onto the submount as is described in the '281 Publication. Moreover, as shown in FIG. 2, the submount 180 may include a layer 194 on the first face 182a thereof. The layer 194 may be an extension of the anode pad 184 and the cathode pad 186 or may be distinct therefrom. In some embodiments, the layer 194 is a reflective layer that extends between the submount face 182a and the conformal layer 140' that includes phosphor that extends on the submount face 182a. This reflective layer 194 can reflect light that passes through the phosphor layer that is on the submount face 182a back toward the lens 190, and can thereby increase efficiency of the LED.

Packaged LEDs as described above in connection with FIGS. 1 and 2 may be embodied as a Cree® XLamp® XP-E High-Efficiency White (HEW) LED, as described, for example, in the *Cree® XLamp® XP-E High-Efficiency White LEDs Data Sheet*, Publication No. CLD-DS34, Rev. 0, dated Dec. 6, 2010, and available at cree.com/products/xlamp_xpe.asp, the disclosure of which is hereby incorporated herein by reference in its entirety as if set forth fully herein.

Figure 3C:
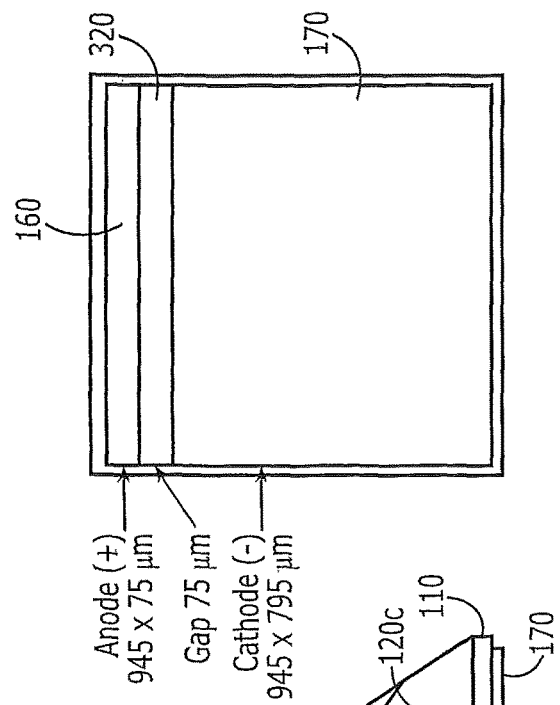
FIGS. 3A, 3B, and 3C are a top view, a cross-sectional view, and a bottom view, respectively, of an LED according to embodiments of FIG. 1 or 2.
Figure 3B:
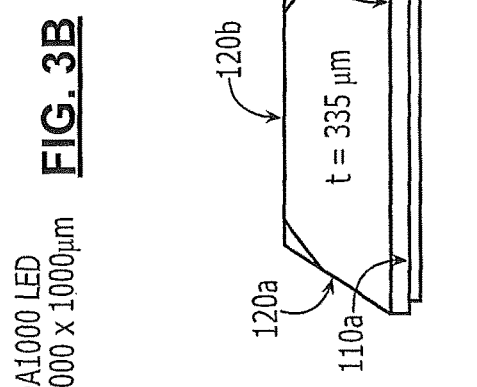
Figure 3A:
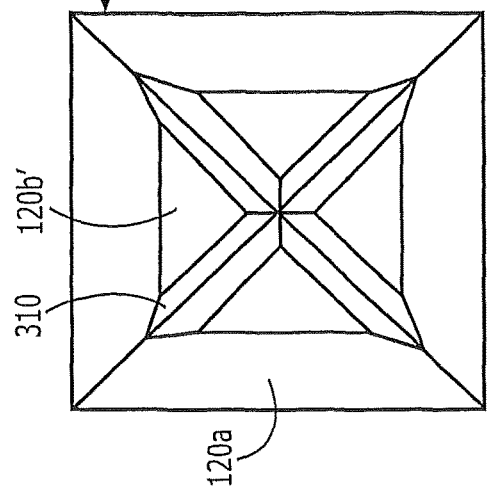

FIGS. 3A, 3B and 3C are a top view, a cross-section and a bottom view, respectively, of an LED 100 of FIG. 1 or 2. The phosphor layer 140/140' is not illustrated.

In FIGS. 1 and 2, the outer face 120b was planar. However, in embodiments of FIG. 3A, the outer face 120b' includes at least one groove, such as an X-shaped groove 310 therein. Multiple X-shaped grooves and/or other shaped grooves may also be provided. Moreover, as shown in FIG. 3C, in some embodiments, the anode contact 160 and the cathode contact 170 may collectively occupy at least about 90% of the active diode region area.

Specifically, FIGS. 3A-3C illustrate an embodiment wherein the inner face 120c of the substrate 120 is a square inner face 120c having sides that are about 1,000 μm long, the outer face 120b' is a square outer face having sides that are about 642 μm long, and a thickness or distance t between the square inner and outer faces (also referred to as "height") is about 335 μm, so as to define an area ratio between the outer face 120b and the inner face 120c of about 0.41. The diode region 110 may also be a square, having sides that are about 1,000 μm long. A small gap 320 of about 75 μm (micrometers) is provided. A calculation of the active attach area may be made as follows:

Total active area of diode region=751,275 μm²(cathode)+70,875 μm²(gap)+70,875 μm²(anode)
=893,025 μm².

Total active attach area=751,275 μm²(cathode)+70,875 μm²(anode)=822,150 μm².

Thus, the active attach area is at least about 90% of the active diode region area.

According to some embodiments, a total attach area (i.e., a combined surface area of anode contact 160 and cathode contact 170) may be greater than 70% of a total surface area of face 110a of the LED, greater than 80% of the total surface area of face 110a, or even greater than 90% of the total surface area of face 110a. As shown in FIGS. 3A to 3C, for example, face 110a of the LED may have a surface area of 1×10⁶ μm², anode contact 160 may have a contact surface area of 70,875 μm², and cathode contact 170 may have a contact surface area of 751,275 μm². Accordingly, anode contact 160 and cathode contact 170 may collectively occupy about 82% of the surface area of face 110a of the LED.

Surface areas of anode and cathode contacts 160 and 170 may be asymmetric, with cathode 170 accounting for at least 70% of the combined contact area, at least 80% of the combined contact area, or even at least 90% of the combined contact area. As shown in FIGS. 3A to 3C, for example, cathode contact 170 may occupy about 91% of the total contact area (i.e., 100%×751,275 μm²/(751,275 μm²+70,875 μm²)) or about 75% of the surface area of face 110a (i.e., 100%×751,275 μm²/(1×10⁶ μm²)) of the LED. As further shown in FIGS. 3A to 3C, for example, anode contact 160 may occupy about 9% of the total contact area (i.e., 100%×70,875 μm²/(751,275 μm²+70,875 μm²)), or about 7% of the surface area of face 110a (i.e., 100%×70,875 μm²/1×10⁶ μm²) of the LED. Accordingly, LED 100 may asymmetrically bridge anode and cathode pads 184 and 186 of submount 180 as shown in FIGS. 1 and 2.

As further shown in FIGS. 3A to 3C, widths of anode and cathode contacts 160 and 170 may be at least 60% of a width of face 110a of the LED, at least 70% of a width of face 110a of the LED, or even at least 90% of a width of face 110a of the LED. For example, each of anode and cathode contacts 160 and 170 may have a width of about 945 μm, and LED face 110A may have a width of 1,000 μm (taken in a same direction as the widths of anode and cathode contacts 160 and 170). Accordingly, each of anode and cathode contacts 160 and 170 of FIG. 3C may have a width that is about 95% of a width of LED face 110a.

Table 1 illustrates various configuration geometries of the substrate 120 that may be provided according to various other embodiments. It will be understood that the "area ratios" used herein are based on the dimensions of the sides of the faces and do not include any added surface area due to texturing, grooves and/or other light extraction features.

TABLE 1

| Designator | Base (Inner) Area, μm² | Top (Outer) Area, μm² | Area Ratio (Top/Base) | Aspect Ratio (Height/Base) |
|---|---|---|---|---|
| DA1000 | 1,000,000 | 412,164 | 0.412164 | 0.335 |
| DA850 | 722,500 | 242,064 | 0.335036678 | 0.394 |
| DA700 | 490,000 | 116,964 | 0.238702041 | 0.5 |

Figure 4:
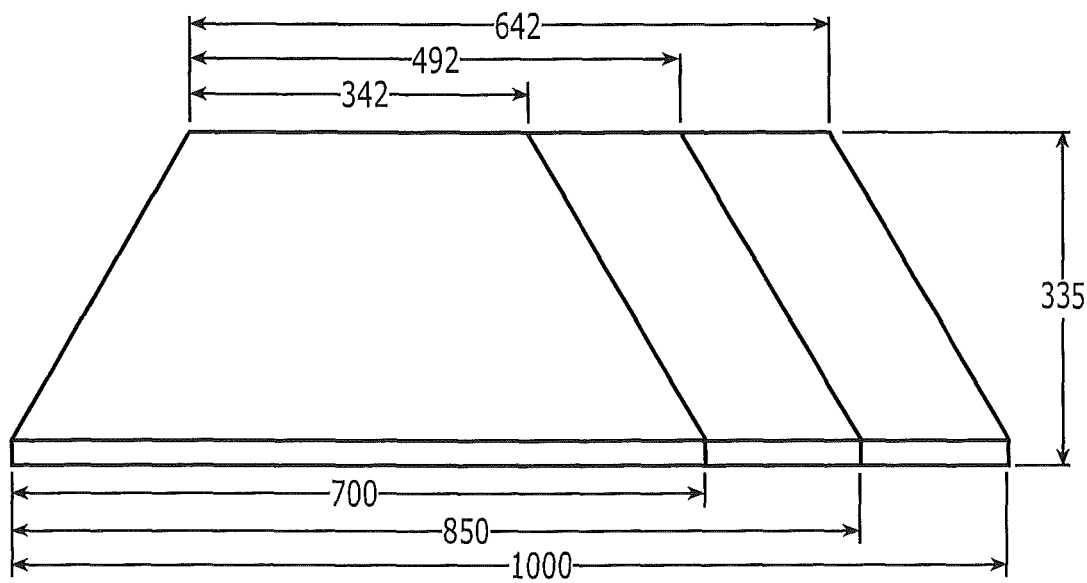
FIGS. 4 and 5 illustrate geometries of substrates of FIGS. 1-3, according to various embodiments described herein.

FIG. 4 illustrates these embodiments. Specifically, the top row of Table 1 illustrates various embodiments wherein the inner face 120c is a square inner face having sides that are about 1,000 μm (micrometer) long (total area 1,000,000 μm²), the outer face 120b is a square outer face having sides that are about 642 μm long (total area 412,164 μm²) and a distance (height) between the square inner and outer faces is about 335 μm so as to define an area ratio of the outer face to the inner face (top to base) of about 0.41, and an aspect ratio of height to a side of the inner face (base) of about 0.335. These embodiments are also illustrated in FIG. 3B. The second row of Table 1 illustrates embodiments wherein the inner face 120c is a square inner face having sides that are about 850 μm long (total area 722,500 μm²), the outer face 120b is a square outer face having sides that are about 492 μm long (total area 242,064 μm²) and a distance (height) between the square inner and outer faces is about 335 μm so as to define an area ratio of the outer face to the inner face of about 0.33 and an aspect ratio of height to base of about 0.39. Finally, the third row of Table 1 illustrates various embodiments wherein the inner face 120c is a square inner face having sides that are about 700 μm long (total area about 72,2500 μm²), the outer face 120b is a square outer face having sides that are about 342 μm long (total area about 116,964 μm²) and a distance height between the square inner and outer faces is about 335 μm so as to define an area ratio of the outer face to the inner face of about 0.24 and an aspect ratio of height to base of about 0.5.

Figure 5:
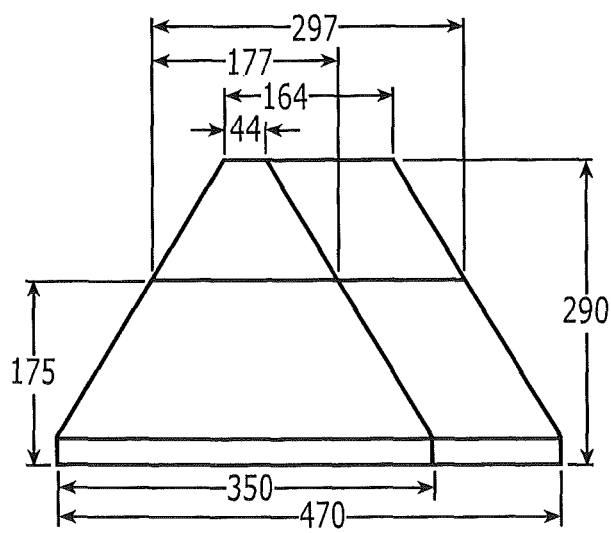

FIG. 5 and Table 2 illustrate other embodiments wherein the inner face 120c is a rectangular inner face of size 350 μm×470 μm. In the first line of Table 2, the height is about 175 μm thick, and the outer face 120b is a rectangle of size 177 μm×297 μm, so as to provide a base (inner) area of 164,500 μm² and a top (outer) area of 52,569 μm. The area ratio of top to base is about 0.32, and the ratio of height to base is about 0.5. The second line of Table 2 illustrates a thicker height of about 290 μm, so that the top has sides of about 44 μm×164 μm, leading to an area ratio of about 0.044 and a ratio of height to base of about 0.8.

TABLE 2

| Designator | Base (Inner) Area, μm² | Top (Outer) Area, μm² | Area Ratio (Top/Base) | Aspect Ratio (Height/Base) |
| --- | --- | --- | --- | --- |
| DA350-Standard 175 μm thick | 164,500 | 52,569 | 0.319568389 | 0.5 |
| DA350 Extreme-290 μm thick | 164,500 | 7,216 | 0.043866261 | 0.828 |

Accordingly, embodiments of Table 1 and Table 2, corresponding to FIGS. 4 and 5, can provide light emitting diodes wherein an area ratio of the outer face to the inner face is less than or about 0.4 and, in some of these embodiments, the aspect ratio of the height to a side of the inner face is at least about 0.3. These tables and figures also illustrate other embodiments wherein the area ratio of the outer face to the inner face is less than or about 0.33 and, in some embodiments, the aspect ratio of the height to a side of the inner face is at least about 0.4. These tables and figures also illustrate yet other embodiments wherein the area ratio of the outer face to the inner face is less than or about 0.04 and, in some embodiments, the height to base aspect ratio is at least about 0.8.

It has been found that light extraction may be improved as the ratio of the outer area to the inner area is reduced. The larger area devices, such as the DA1000 described on the first line of Table 1 can provide additional extraction by providing a groove, as was illustrated in FIG. 3A. This would appear to indicate that further extraction benefit would be obtained by a further reduction in the ratio of the top to base, but this may be expensive due to the blade width that may be needed for beveling the sidewalls. On the smaller devices, such as the DA350 described in the first row of Table 2, there may be no further gain at blue light in further increasing the ratio, so that an aspect ratio of about 0.32 may already be sufficient for maximum blue extraction.

Lateral LED configurations as were described in Tables 1 and 2 can allow for very low ratios of top to base (outer to inner surfaces of the substrate) compared to previous generation vertical chips, since the backside (top) contact area need not be considered for the electrical performance of the device. Moreover, improved light extraction of these devices may also be a factor in conversion efficiency, since the phosphor layers can scatter light back into the chips.

Figure 6A:
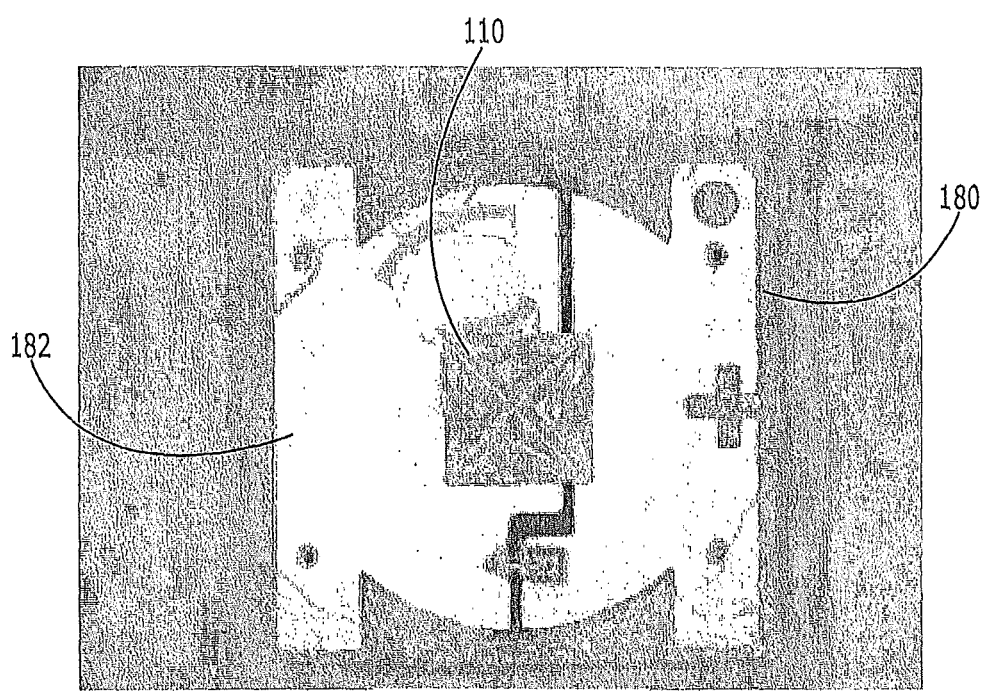
FIG. 6A is a photograph of a submount with an LED mounted thereon according to various embodiments of FIGS. 1-4.
Figure 6B:
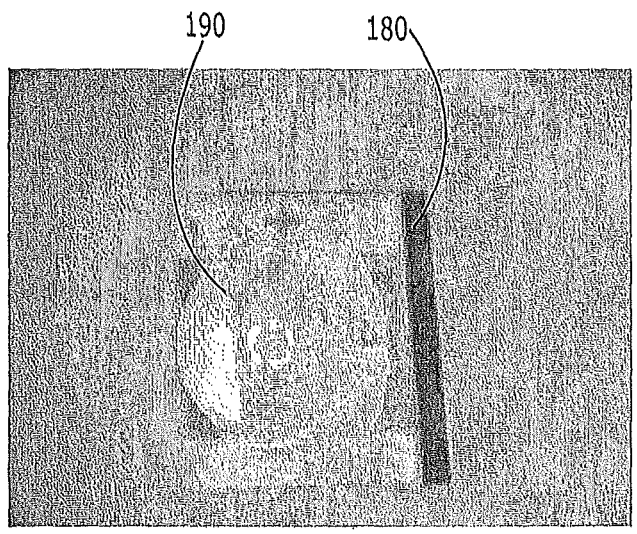
FIG. 6B is a photograph of a packaged LED according to various embodiments of FIGS. 1-4.

FIG. 6A is a photograph of a submount 180 with an LED 110 mounted thereon, as was described in connection with FIGS. 1-4. FIG. 6B is a photograph of a packaged LED 200 of FIGS. 1-4 including lens 190.

Various embodiments that were illustrated in FIGS. 1-6 may also be regarded as illustrating a light emitting diode 100 that comprises a diode region 110 having first and second opposing faces 110a, 110b and including therein an n-type layer 112 and a p-type layer 114. An anode contact 160 ohmically contacts the p-type layer and extends on the first face 110a. A cathode contact 170 ohmically contacts the n-type layer 112 and also extends on the first face 110a. A transparent substrate 120 is provided on the second face 110. The transparent substrate includes an inner face 120c adjacent the second face 110b, an outer face 120b remote from the second face that is of smaller area than the inner face 120c, and a sidewall 120a that extends from the outer face to the inner face. An area ratio of the outer face to the inner face is less than or about 0.4. In some embodiments, the sidewall is a stepped sidewall. In other embodiments, the sidewall comprises an oblique sidewall that extends at an oblique angle from the outer face towards the inner face. A conformal layer 140, 140' that comprises phosphor 142 having an average equivalent particle diameter d50 of at least about 10 μm is provided on the outer face 120b and on the sidewall 120a.

FIGS. 1-6 may also be regarded as describing other embodiments of a packaged light emitting diode die 200 that includes a light emitting diode die including a diode region, an anode contact and a cathode contact, as described above. A submount 180 is also provided as was described above. Moreover, a conformal layer 140, 140' that comprises phosphor 142 is spaced apart from the diode region 110 and extends conformally onto the submount face 182a away from the light emitting diode die 110. The conformal layer may be spaced apart from the diode region by the transparent substrate 120 and/or by other means, such as a dome.

LEDs of FIGS. 1, 2, 3A to 3C, 4, 5, and 6A to 6B may also be provided in arrays on a same packing substrate (e.g., submount) as discussed in greater detail below. For example, an array of LEDs may be provided with the LEDs electrically connected in series and/or parallel. Each of the LEDs may have a horizontal structure with anode and cathode contacts of each LED provided between the LED and respective pads of the submount. Using direct LED die attach as discussed above, arrays of LED die may be provided with spacings between LED die of less than about 250 micrometers, less than about 100 micrometers, or even less than about 50 micrometers.

Some embodiments may provide relatively small area LED submounts for LED arrays with higher voltages where LED die bonding areas are more efficiently utilized to balance desired operating voltage and chip area and balanced with practical aspects of maintaining a chip spacing that provides ease of manufacture and less light absorption to provide increased efficiency and increased light output. Spacings between LED die, for example, may be less than about 75 micrometers, less than about 60 micrometers, less than about 40 micrometers, and/or in the range of about 40 micrometers to about 75 micrometers. Generally, smaller spacings between light emitting diode die may be desired, provided that sufficient space (e.g., greater than about 10 micrometers, or greater than about 20 micrometers) is provided to allow manufacturing placement and/or to reduce light absorption between light emitting diode die. According to some embodiments, spacings between LED die may be in the range of about 20 micrometers to about 500 micrometers, in the range of about 40 micrometers to about 150 micrometers, or even in the range of about 50 micrometers to about 100 micrometers.

In embodiments discussed below, LED die, submounts, and elements thereof may be provided as discussed above with respect to FIGS. 1, 2, 3A to 3C, 4, 5, and 6A to 6B. For ease of illustration, however, elements may be omitted from the following figures where inclusion of such elements would be overly repetitious. For example, diode regions 110 may be illustrated below without showing elements thereof (e.g., without separately showing n-type layer 112, p-type layer 114, conductive vias 162/172, etc.). Each of diode regions 110 discussed below, however, may include elements discussed above with respect to FIGS. 1 and 2.

FIGS. 7A and 7B illustrate plan and cross-sectional views of an array of six LED die 100a to 100f electrically coupled in parallel between anode and cathode pads 184 and 186 of submount 180. In addition, an electrostatic discharge (ESD) protection device 194 may be electrically coupled between anode and cathode pads 184 and 186. As shown, portions of anode pad 184 may extend between opposing portions of cathode pad 186, and LED die 100a to 100f may bridge gap 196 between anode and cathode pads 184 and 186. Moreover, all of LED die 100a to 100f may be provided within a circular area of a same lens 190. While each LED die 100a to 100f is shown with an individual phosphor layer 140 as discussed above with respect to FIG. 1, a continuous phosphor layer may be provided over all of the LED die 100a to 100f as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100f may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100f over cathode pad 186 may be significantly greater than portions of LED die 100a to 100f over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 7A and 7B, LED die 100a to 100f are arranged in a rectangular array of 2 rows and 3 columns (with each row including a same number of LED die and with each column including a same number of LED die). Spacing between adjacent LED die may be about 0.1 mm, and all of the LED die may be provided within a circular perimeter of a lens 190 having a diameter of about 2.55 mm. Each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 7A and into the plane of FIG. 7B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100f are sufficiently spaced from a perimeter of lens 190, an efficiency of light transmission through lens 190 may be improved. While lens 190 is not shown in the cross-section of FIG. 7B, it will be understood that lens 190 may substantially form a hemisphere or hemispherical section on submount 180 surrounding all of LED die 100a to 100f.

FIGS. 8A and 8B illustrate plan and cross-sectional views of an array of six LED die 100a to 100f electrically coupled in parallel between anode and cathode pads 184 and 186 of submount 180. In addition, an electrostatic discharge (ESD) protection device 194 may be electrically coupled between anode and cathode pads 184 and 186. As shown, anode and cathode pads 184 and 186 may be interdigitated, and LED die 100a to 100f may bridge gap 196 between anode and cathode pads 184 and 186. Moreover, all of the LED die 100a to 100f may be provided within a circular area of a same lens 190. While each LED die 100a to 100f is shown with an individual phosphor layer 140 as discussed above with respect to FIG. 1, a continuous phosphor layer may be provided over all of LED die 100a to 100f as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100f may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100f over cathode pad 186 may be significantly greater than portions of LED die 100a to 100f over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 8A and 8B, LED die 100a to 100f are arranged in a rectangular array of 2 rows and 3 columns. Dimensions of LED die and spacings therebetween may be the same as discussed above with respect to the structure of FIGS. 7A and 7B. In contrast to the structure of FIGS. 7A and 7B, however, LED die 100*a* to 100*f* of both rows of FIGS. 8A and 8B may be aligned such that anode contacts 160 of both rows are oriented toward a first side of submount 180 and cathode contacts 170 of both rows are oriented toward a second side of submount opposite the first side. While lens 190 is not shown in the cross-section of FIG. 8B, it will be understood that lens 190 may substantially form a hemisphere on submount 180 surrounding all of LED die 100*a* to 100*f*.

FIGS. 9A and 9B illustrate plan and cross-sectional views of a substantially circular array of seven LED die 100*a* to 100*g* electrically coupled in parallel between anode and cathode pads 184 and 186 of submount 180. In addition, an electrostatic discharge (ESD) protection device 194 may be electrically coupled between anode and cathode pads 184 and 186. As shown, all of LED die 100*a* to 100*g* may be provided within a circular area of a same lens 190. Moreover, each of the LED die 100*a* to 100*g* may share a same spacing relative to a perimeter of lens 190, and each of LED die 100*a* to 100*g* may be oriented radially relative to center of the circular array and/or relative to a center of lens 190. By providing that LED die 100*a* to 100*g* of the circular array are spaced symmetrically relative to the perimeter of lens 190, a more uniform and/or efficient light output may be provided through lens 190. As before, LED die 100*a* to 100*g* may bridge gap 196 between anode and cathode pads 184 and 186. While each LED die 100*a* to 100*g* is shown with an individual phosphor layer 140 as discussed above with respect to FIG. 1, a continuous phosphor layer may be provided over all of the LED die 100*a* to 100*g* as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100*a* to 100*g* may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100*a* to 100*g* over cathode pad 186 may be significantly greater than portions of LED die 100*a* to 100*g* over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40µ.

In the assembly of FIGS. 9A and 9B, each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (into the plane of FIG. 9B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100*a* to 100*g* are sufficiently spaced from a perimeter of lens 190, an efficiency of light transmission through lens 190 may be improved. While lens 190 is not shown in the cross-section of FIG. 9B, it will be understood that lens 190 may substantially form a hemisphere on submount 180 surrounding all of LED die 100*a* to 100*g*.

FIGS. 10A and 10B illustrate plan and cross-sectional views of a substantially circular array of seven LED die 100*a* to 100*f* electrically coupled in parallel between anode and cathode pads 184 and 186 of submount 180. In addition, an electrostatic discharge (ESD) protection device 194 may be electrically coupled between anode and cathode pads 184 and 186 via respective metallic bonds 188. ESD protection device 194 may include contacts 195 electrically and mechanically coupled to anode and cathode pads 184 and 186. As shown, all of LED die 100*a* to 100*f* may be provided within a circular area of a same lens 190. Moreover, each of the LED die 100*a* to 100*f* may share substantially a same spacing relative to a perimeter of lens 190. In contrast to the circular array of FIGS. 9A and 9*b*, each of LED die 100*a* to 100*f* of FIGS. 10A and 10B may be oriented along a same axis (e.g., the vertical axis of FIG. 10A), and anode and cathode pads 184 and 186 may be interdigitated. By providing that LED die 100*a* to 100*f* of the circular array are spaced symmetrically relative to the perimeter of lens 190, a more uniform and/or efficient light output may be provided through lens 190. As before, LED die 100*a* to 100*f* may bridge gap 196 between anode and cathode pads 184 and 186. While each LED die 100*a* to 100*f* is shown with an individual phosphor layer 140 as discussed above with respect to FIG. 1, a continuous phosphor layer may be provided over all of the LED die 100*a* to 100*f* as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100*a* to 100*f* may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100*a* to 100*f* over cathode pad 186 may be significantly greater than portions of LED die 100*a* to 100*f* over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40µ.

In the assembly of FIGS. 10A and 10B, each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (into the plane of FIG. 7B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100*a* to 100*f* are sufficiently spaced from a perimeter of lens 190, an efficiency of light transmission through lens 190 may be improved. While lens 190 is not shown in the cross-section of FIG. 7B, it will be understood that lens 190 may substantially form a hemisphere on submount 180 surrounding all of LED die 100*a* to 100*f*.

Figure 11A:
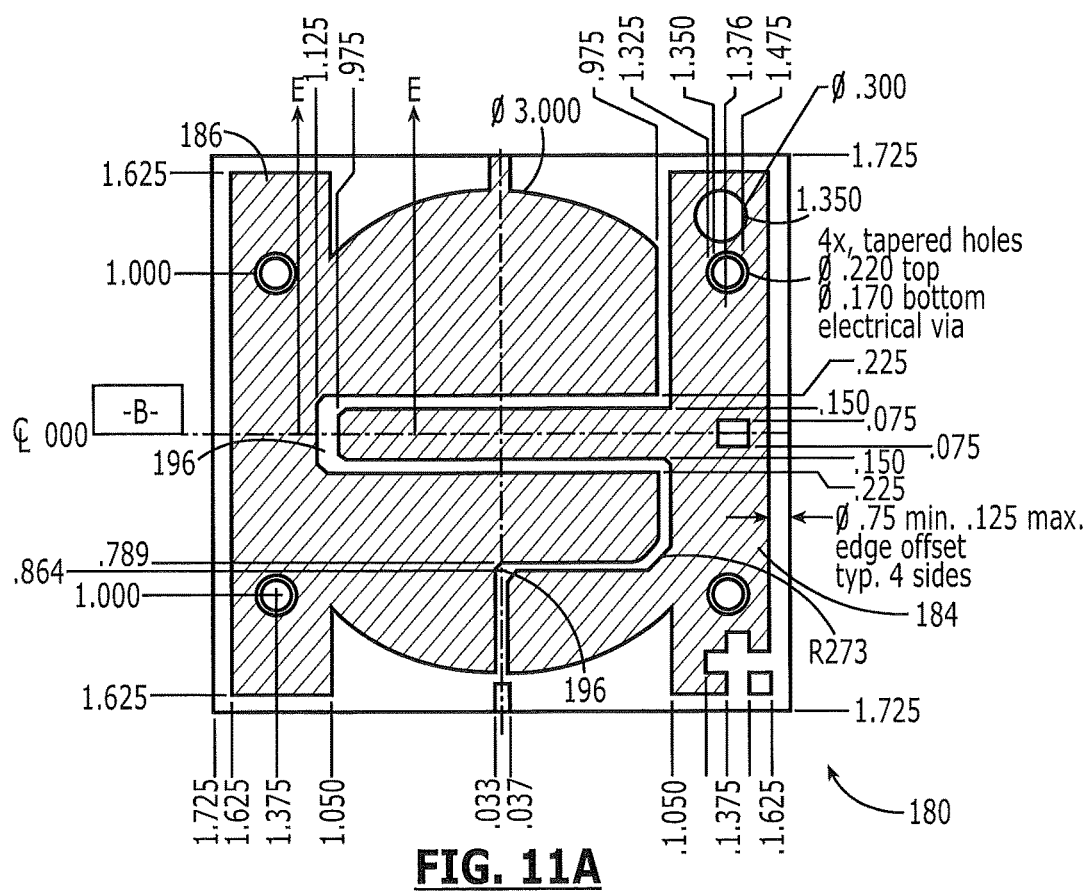
FIG. 11A is a plan view of a submount including cathode and anode pads for an array of LED die according to various embodiments described herein.
Figure 11B:
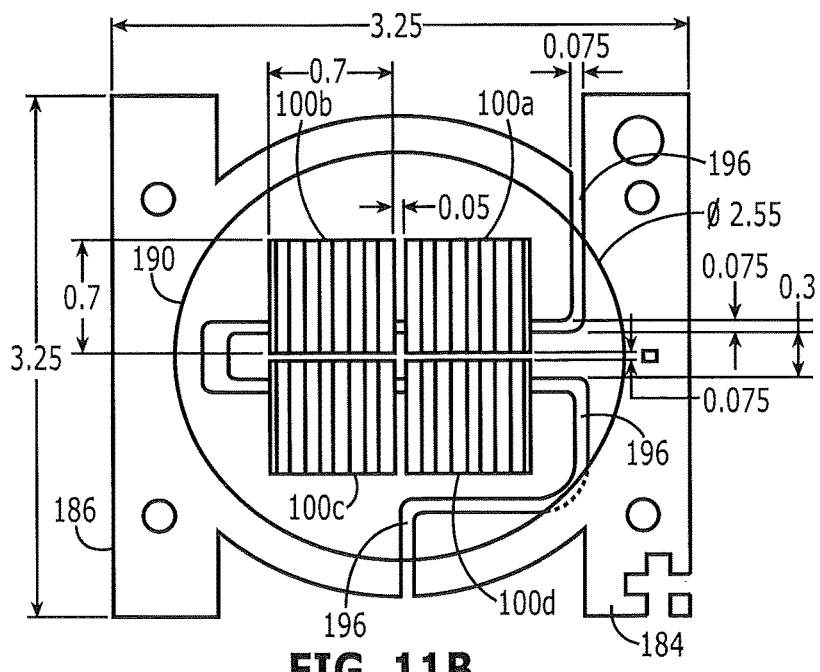
FIG. 11B is a plan view of an array of LED die electrically coupled in parallel on the submount of FIG. 11B.

FIG. 11A is a plan view of a submount 180 including anode and cathode pads 184 and 186 without LED die, and FIG. 11B is a plan view of an assembly including submount 180 with LED die 100*a* to 100*d* mounted thereon. A separate cross-sectional view is not provided for the structure of FIGS. 11A and 11B because the cross-sectional view would be substantially the same as that shown in FIG. 7A. As shown, four LED die 100*a* to 100*d* may be electrically coupled in parallel between anode and cathode pads 184 and 186 of submount 180. Moreover, portions of anode pad 184 may extend between opposing portions of cathode pad 186, and LED die 100*a* to 100*d* may bridge gap 196 between anode and cathode pads 184 and 186. Moreover, all of LED die 100*a* to 100*d* may be provided within a circular area of a same lens 190. Each LED die 100*a* to 100*d* may be provided with an individual phosphor layer 140 as discussed above with respect to FIG. 1, or a continuous phosphor layer may be provided over all of LED die 100*a* to 100*d* as discussed above with respect to FIG. 2.

As discussed above with respect to FIGS. 3A to 3C, surface areas of anode and cathode contacts (160 and 170) of LED die 100*a* to 100*d* may be asymmetric, with cathodes accounting for at least 70% of the combined contact area, at least 80% of the combined contact area, or even at least 90% of the combined contact area. Accordingly, LED die 100*a* to 100*d* may asymmetrically bridge the gap 196 between anode and cathode pads 184 and 186 of submount 180. Stated in other words, a contact area between cathode contacts and cathode pad 186 may be significantly greater than a contact area between anode contacts and anode pad 184, and portions of LED die 100*a* to 100*d* over cathode pad 186 may be significantly greater than portions of LED die 100*a* to 100*d* over anode pad 184.

As discussed above, a reflective and electrically insulating filler may be provided on submount body 182 between anode and cathode pads 184 and 186. By providing reflective filler between anode and cathode pads 184 and 186, light loss into a less reflective submount body may be reduced, and efficiency may thus be improved. A body of submount body 180, for example, may be alumina and/or aluminum nitride, and the filler may be white solder mask, a low modulus material (e.g., a silicone, a gel, etc.) loaded with titanium oxide particles, etc. A width of gap 196 (and filler therein) may be about 75 µm or less, or even less than about 40 µm. Further dimensions of submount 180 and LED die 100*a* to 100*d* are shown in FIGS. 11A and 11B with all dimensions given in units of millimeters (mm).

In the assembly of FIG. 11B, LED die 100*a* to 100*d* are arranged in a rectangular array of 2 rows and 2 columns (with each row including a same number of LED die and with each column including a same number of LED die). Spacing between adjacent columns of LED die may be about 0.05 mm, spacings between adjacent rows of LED die may be about 0.075 mm, and all of the LED die may be provided within a circular perimeter of a lens 190 having a diameter of about 2.55 mm. Each LED die may have a width of about 0.7 mm and a length of about 0.7 mm. As discussed above with respect to FIGS. 3A to 3C, widths of metallic bonds (i.e., solder layers 188) between LED anode contacts and anode pads 184 and between LED cathode contacts and cathode pads 186 (in the horizontal direction of FIG. 11B) may be at least 60% of a width of the LED die (e.g., at least 0.42 mm), at least 70% of a width of the LED die (e.g., at least 0.49 mm), or even at least 90% of a width of the LED die (e.g., at least 0.63 mm). By providing relatively large surface areas of contact, electrical and thermal resistances may be reduced. By providing that all of LEDs 100*a* to 100*d* are sufficiently spaced from a perimeter of lens 190, an efficiency of light transmission through lens 190 may be improved. While a cross-section of lens 190 is not shown, it will be understood that lens 190 may substantially form a hemisphere on submount 180 surrounding all of LED die 100*a* to 100*d*.

Figure 12A:
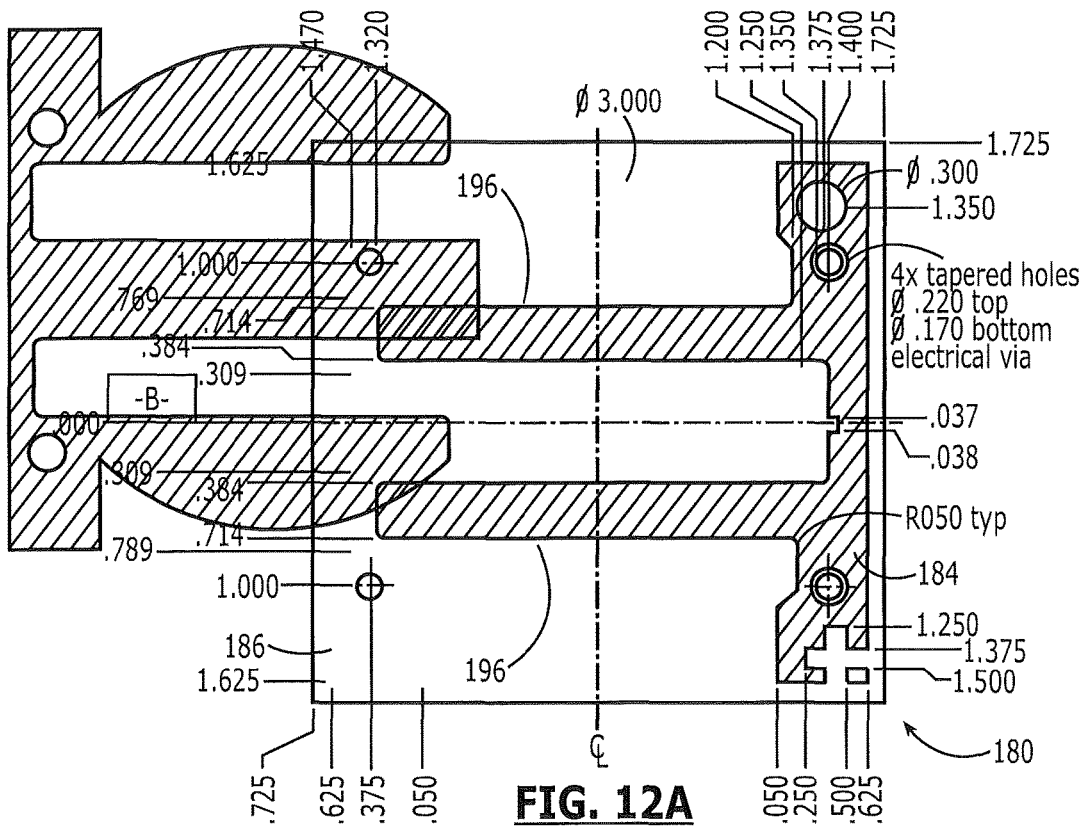
FIG. 12A is a plan view of a submount including interdigitated cathode and anode pads for an array of LED die according to various embodiments described herein.
Figure 12B:
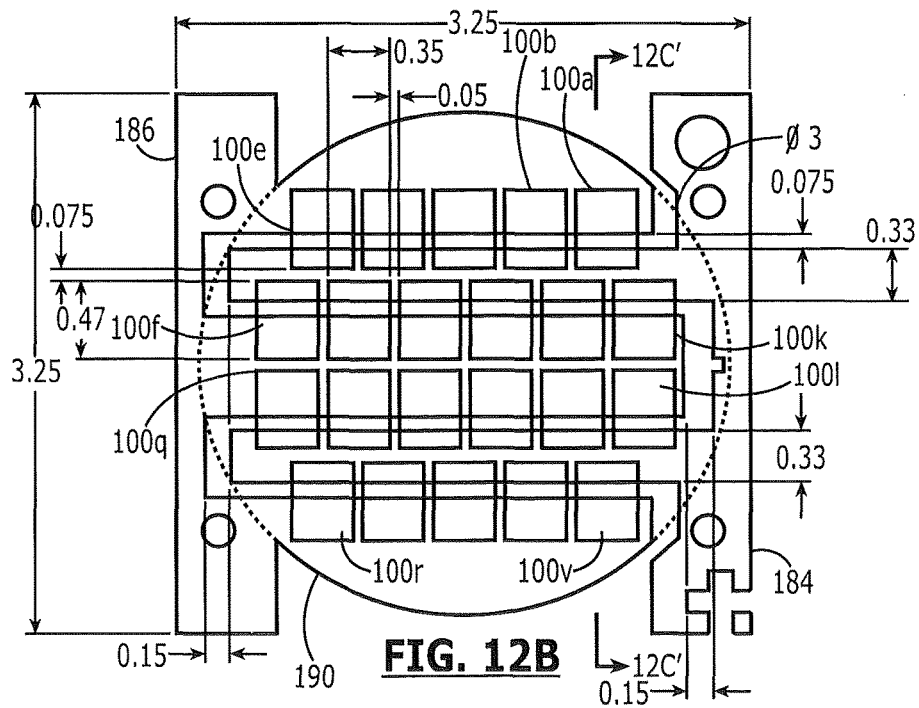
FIG. 12B is a plan view of an array of LED die electrically coupled in parallel on the submount of FIG. 12B.
Figure 12C:
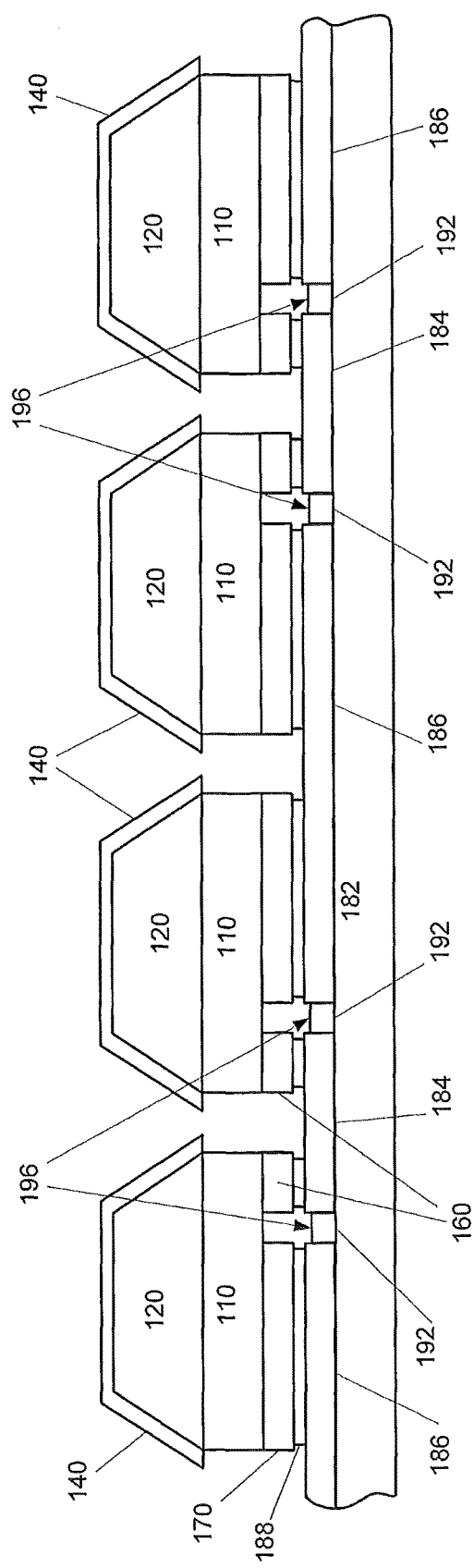
FIG. 12C is a cross-sectional view of a column of LED die from the array of FIG. 12B.

FIG. 12A is a plan view of a submount 180 including anode and cathode pads 184 and 186 without LED die, FIG. 12B is a plan view of an assembly including submount 180 with LED die 100*a* to 100*v* mounted thereon, and FIG. 12C is a cross-sectional view take through LED die 100*a*, 100*j*, 100*m*, and 100*v* (as indicated by section line 12C-12C'). In FIGS. 12A, 12B, and 12C, an array of twenty two LED die 100*a* to 100*v* are electrically coupled in parallel between anode and cathode pads 184 and 186 of submount 180. As shown, anode and cathode pads 184 and 186 may be interdigitated, and LED die 100*a* to 100*v* may bridge gap 196 between anode and cathode pads 184 and 186. Moreover, all of LED die 100*a* to 100*v* may be provided within a circular area of a same lens 190. While each LED die 100*a* to 100*v* is shown with an individual phosphor layer 140 as discussed above with respect to FIG. 1, a continuous phosphor layer may be provided over all of the LED die 100*a* to 100*v* as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100*a* to 100*v* may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100*a* to 100*v* over cathode pad 186 may be significantly greater than portions of LED die 100*a* to 100*v* over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40 µm.

In the assembly of FIGS. 12A, 12B, and 12C, LED die 100*a* to 100*v* are arranged in a linear array of four rows, and LED die of at least some adjacent rows may be offset so the array does not have conventional columns. By providing that central rows (or lines) of the array are longer than peripheral rows (or lines) of the array (e.g., that central rows include a greater number of LED die than peripheral rows), an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.075 mm, and all of the LED die may be provided within a circular perimeter of a lens 190 having a diameter of about 3 mm. Each LED die may have a width of about 0.35 mm and a length of about 0.47 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 12B and into the plane of FIG. 12C) may be at least 60% of a width of the LED die (e.g., at least 0.21 mm), at least 70% of a width of the LED die (e.g., at least 0.25 mm), or even at least 90% of a width of the LED die (e.g., at least 032 mm). By providing relatively large surface areas of contact, electrical and thermal resistances may be reduced. By providing that all of LEDs 100a to 100v are sufficiently spaced from a perimeter of lens 190, an efficiency of light transmission through lens 190 may be improved. While lens 190 is not shown in the cross-section of FIG. 12C, it will be understood that lens 190 may substantially form a hemisphere on submount 180 surrounding all of LED die 100a to 100v.

Figure 13A:
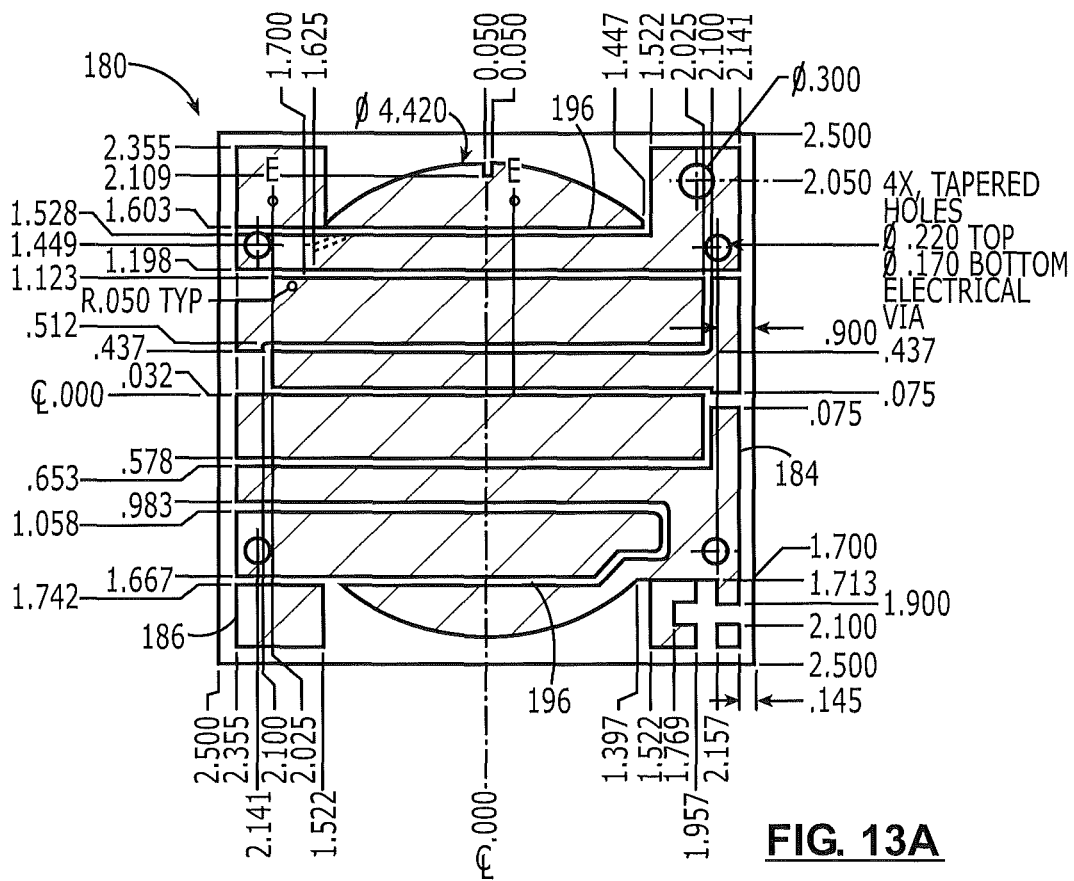
FIG. 13A is a plan view of a submount including interdigitated cathode and anode pads for an array of LED die according to various embodiments described herein.
Figure 13B:
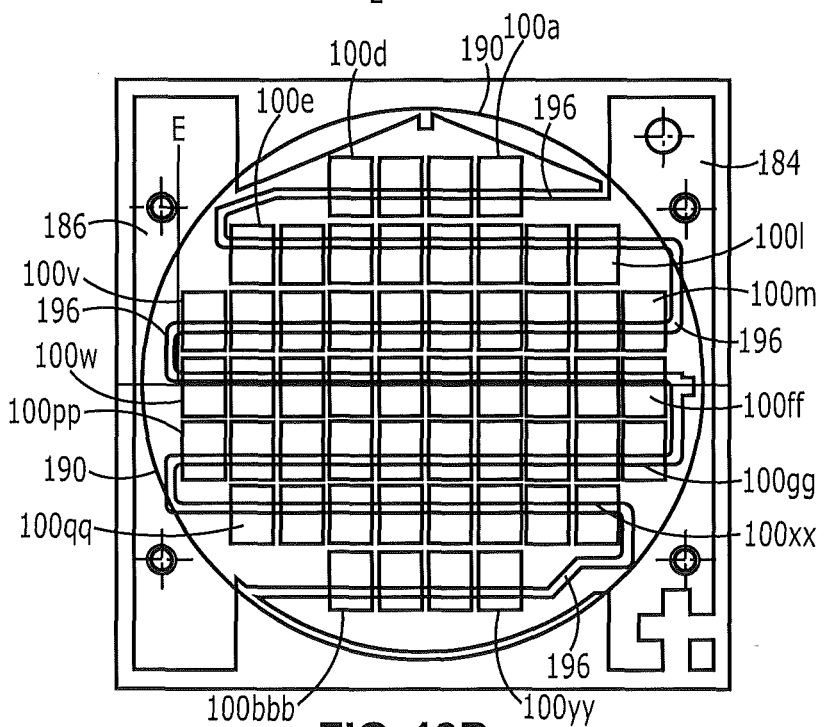
FIG. 13B is a plan view of an array of LED die electrically coupled in parallel on the submount of FIG. 13A.

FIG. 13A is a plan view of a submount 180 including anode and cathode pads 184 and 186 without LED die, and FIG. 13B is a plan view of an assembly including submount 180 with 54 LED die 100a to 100bbb mounted thereon. A separate cross-sectional view is not provided because the cross-sectional structure will be understood in light of the previously provided cross-sections. A cross-section taken through LED die 100a, 100j, 100p, and 100cc would be substantially the same as that illustrated in FIG. 12C.

In FIGS. 13A and 13B, an array of 54 LED die 100a to 100bbb are electrically coupled in parallel between anode and cathode pads 184 and 186 of submount 180. As shown, anode and cathode pads 184 and 186 may be interdigitated, and LED die 100a to 100bbb may bridge gap 196 between anode and cathode pads 184 and 186. Moreover, all of LED die 100a to 100bbb may be provided within a circular area of a same lens 190. While each LED die 100a to 100bbb may have an individual phosphor layer 140 as discussed above with respect to FIG. 1, a continuous phosphor layer may be provided over all of LED die 100a to 100bbb as discussed above with respect to FIG. 2.

As discussed above with respect to FIGS. 3A to 3C, surface areas of anode and cathode contacts of the LED die may be asymmetric, with cathode contacts accounting for at least 70% of the combined contact area, at least 80% of the combined contact area, or even at least 90% of the combined contact area. Accordingly, LED die 100a to 100bbb may asymmetrically bridge the gap 196 between anode and cathode pads 184 and 186 of submount 180. Stated in other words, a contact area between cathode contacts and cathode pad 186 may be significantly greater than a contact area between anode contacts and anode pad 184, and portions of LED die 100a to 100bbb over cathode pad 186 may be significantly greater than portions of LED die 100a to 100bbb over anode pad 184.

In addition, a reflective and electrically insulating filler may be provided on submount body 182 between anode and cathode pads 184 and 186. By providing reflective filler between anode and cathode pads 184 and 186, light loss into a less reflective submount body may be reduced, and efficiency may thus be improved. Submount body, for example, may be alumina and/or aluminum nitride, and filler may be white solder mask, a low modulus material (e.g., a silicone, a gel, etc.) loaded with titanium oxide particles, etc. A width of gap 196 (and filler therein) may be about 75 µm or less, or even less than about 40 µm.

In the assembly of FIGS. 13A and 13B, LED die 100a to 100bbb are arranged in a linear array of seven rows (or horizontal lines) and ten columns (or vertical lines). Moreover, central rows of the array are longer than peripheral rows of the array, so that central rows include a greater number of LED die than peripheral rows. Similarly, central columns of the array are longer than peripheral columns of the array, so that central rows include a greater number of LED die than peripheral columns. By providing that central rows and/or columns of the array are longer than peripheral rows and/or columns of the array, an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.075 mm, and all of the LED die may be provided within a circular perimeter of a lens 190 having a diameter of about 4.42 mm. Each LED die may have a width of about 0.35 mm and a length of about 0.47 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 12B and into the plane of FIG. 12C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100bbb are sufficiently spaced from a perimeter of lens 190, an efficiency of light transmission through lens 190 may be improved. While lens 190 is not shown in a cross-section, it will be understood that lens 190 may substantially form a hemisphere on submount 180 surrounding all of LED die 100a to 100bbb.

Figure 14A:
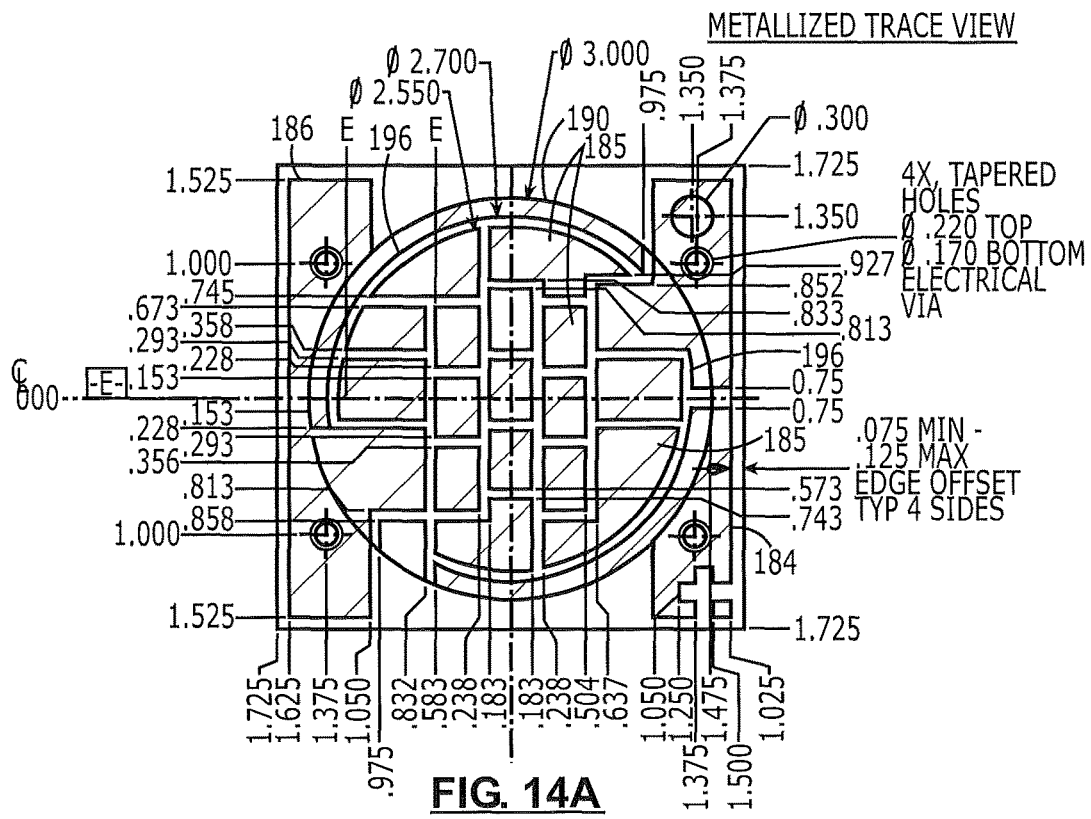
FIG. 14A is a plan view of a submount including cathode, island, and anode pads for an array of LED die according to various embodiments described herein.
Figure 14B:
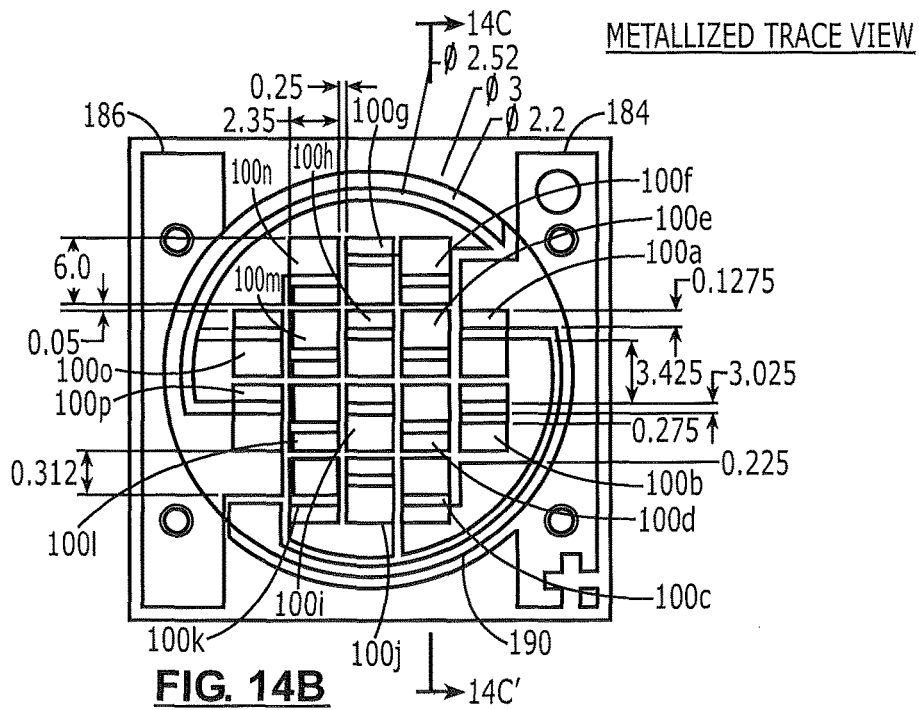
FIG. 14B is a plan view of an array of LED die electrically coupled in series on the submount of FIG. 14B.

FIG. 14A is a plan view of a submount 180 including anode pad 184, cathode pad 186, and island pads 185 without LED die, FIG. 14B is a plan view of an assembly including submount 180 with LED die 100a to 100p mounted thereon, and FIG. 14C is a cross-sectional view take through LED die 100c to 100f (as indicated by section line 14C-14C'). In FIGS. 14A, 14B, and 14C, an array of 16 LED die 100a to 100p are electrically coupled in series between anode and cathode pads 184 and 186 of submount 180.

More particularly, island pads 185 may provide electrical connection between LED die that are electrically adjacent in the series connection between anode and cathode pads 184 and 186. Moreover, anode, cathode and island pads 184, 186, and 185 may be separated by gaps 196 and/or reflective and electrically insulating filler 192. Electrical coupling may thus be provided from anode pad 184 through LED die 100*a*, 100*b*, 100*c*, . . . 100*p* (in alphabetical order) to cathode pad 105. Moreover, each island pad 185 may provide electrical coupling between an anode contact 160 and a cathode contact of electrically adjacent LED die, and each LED die may bridge a gap between anode pad 184 and an island pad 185, between two island pads 185, or between an island pad 185 and cathode pad 186.

In addition, all of LED die 100*a* to 100*p* may be provided within a circular area of a same lens 190. While each LED die 100*a* to 100*p* is shown with an individual phosphor layer 140 as discussed above with respect to FIG. 1, a continuous phosphor layer may be provided over all of the LED die 100*a* to 100*p* as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100*a* to 100*v* may asymmetrically bridge the gap 196 between anode and cathode pads 184 and 186 of submount 180, Stated in other words, a contact area between cathode contacts 170 and cathode pad 186 may be significantly greater than a contact area between anode contacts 160 and anode pad 184, and portions of LED die 100*a* to 100*v* over cathode pad 186 may be significantly greater than portions of LED die 100*a* to 100*v* over anode pad 184.

In addition, a reflective and electrically insulating filler 192 may be provided on submount body 182 between anode, island, and cathode pads 184, 185, and 186. By providing reflective filler 192 between pads 184, 185, and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc, A width of gap 196 (and filler 192 therein) may be less than about 75 µm or even less than about 40 µm.

In the assembly of FIGS. 14A, 14B, and 14C, LED die 100*a* to 100*p* are arranged in a linear array of four rows (or horizontal lines) and four columns (or vertical lines). Moreover, central rows of the array are longer than peripheral rows of the array so that central rows have a larger number of LED die than peripheral rows, and central columns of the array are longer than peripheral columns of the array so that central columns have a larger number of LED die than peripheral columns. By providing that central rows and/or columns of the array are longer than peripheral rows and/or columns of the array, an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.05 mm, and all of the LED die may be provided within a circular perimeter of a lens 190 having a diameter of about 3 mm. Each LED die may have a width of about 0.35 mm and a length of about 0.47 mm. As discussed above with respect to FIGS. 3A to 3C, widths of metallic bonds (i.e., solder layers 188) between anode contacts 160 and respective pads 184/185 and between cathode contacts 170 and respective pads 185/186 (in the horizontal direction of FIG. 14B and into the plane of FIG. 14C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100*a* to 100*p* are sufficiently spaced from a perimeter of lens 190, an efficiency of light transmission through lens 190 may be improved. While lens 190 is not shown in the cross-section of FIG. 14C, it will be understood that lens 190 may substantially form a hemisphere on submount 180 surrounding all of LED die 100*a* to 100*p*.

Figure 15A:
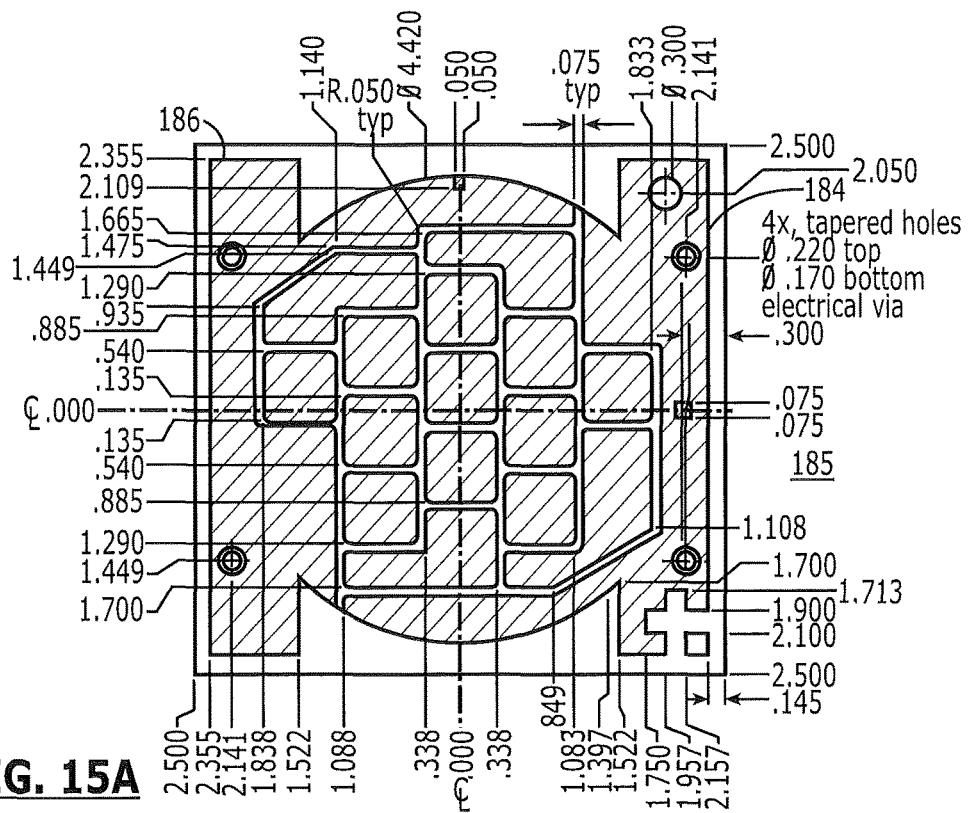
FIG. 15A is a plan view of a submount including cathode, island, and anode pads for an array of LED die according to various embodiments described herein.
Figure 15B:
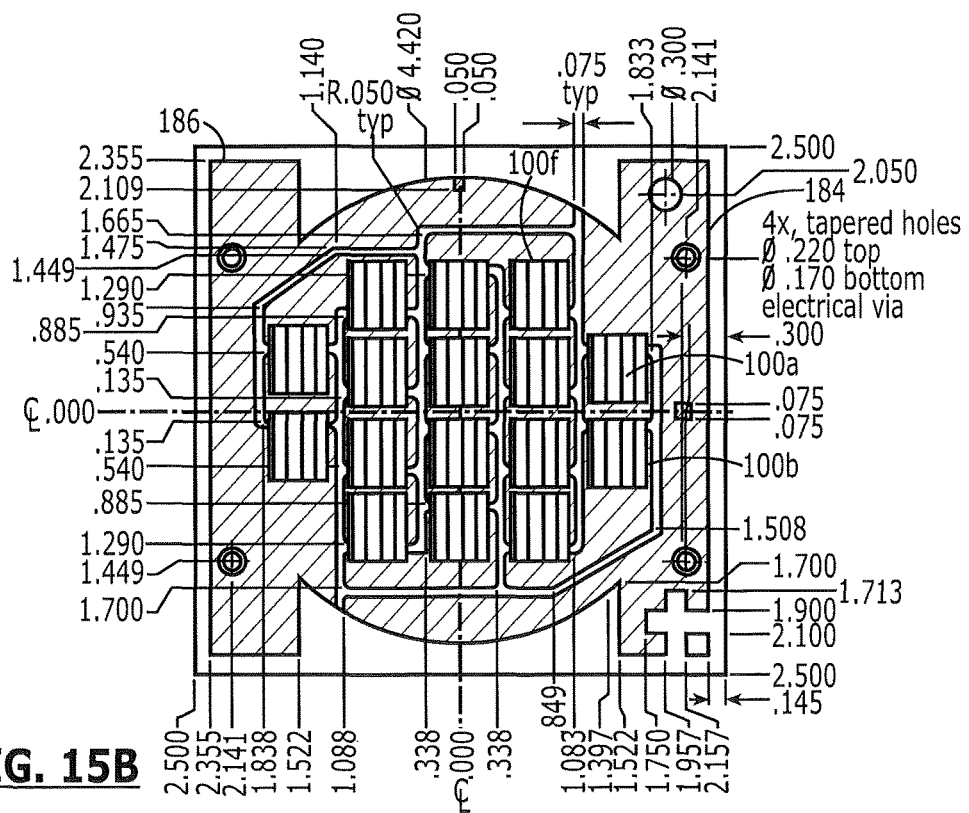
FIG. 15B is a plan view of an array of LED die electrically coupled in series on the submount of FIG. 15B.

FIG. 15A is a plan view illustrating a submount 180 with anode, island, and cathode pads 184, 185, and 186 for a series array of LED die, and FIG. 15B is a plan view of the submount of FIG. 15A populated with a serially connected array of LED die 100*a* to 100*p*. The structure of FIGS. 15A and 15B is similar to that of FIGS. 14A, 14B, and 14C, with the difference being that the submount of FIGS. 15A and 15B is provided for larger LED die having dimensions of 0.7 mm by 0.7 mm. Other dimensions of FIGS. 15A and 15B are provided in millimeters (mm). In FIG. 15B, the current path traverses vertically through each column from anode pad 184 to cathode pad 186. More particularly, the current path traverses down through the left most column (including LED die 100*a* to 100), up through the next column (including LED die 100*c* to 100*f*), down through the next column (including LED die 100*g* to 100*j*), up through the next column (including LED die 100*k* to 100*n*), and down through the left most column (including LED die 100*o* to 100*p*).

Figure 16A:
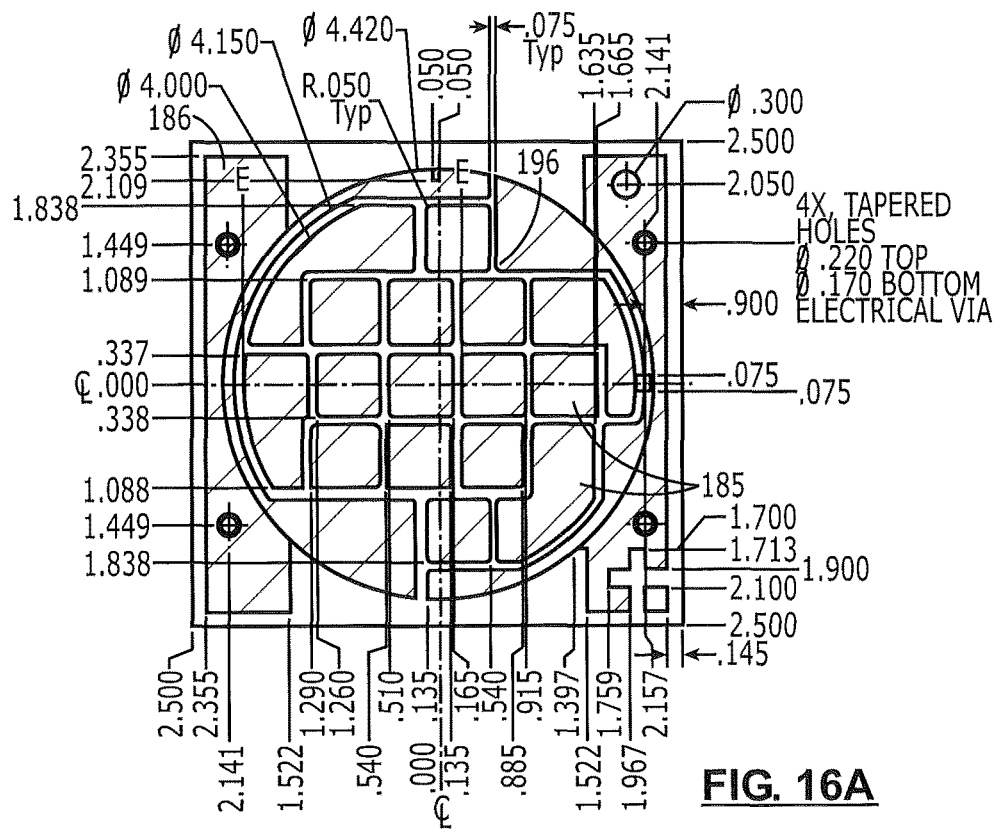
FIG. 16A is a plan view of a submount including cathode, island, and anode pads for an array of LED die according to various embodiments described herein.
Figure 16B:
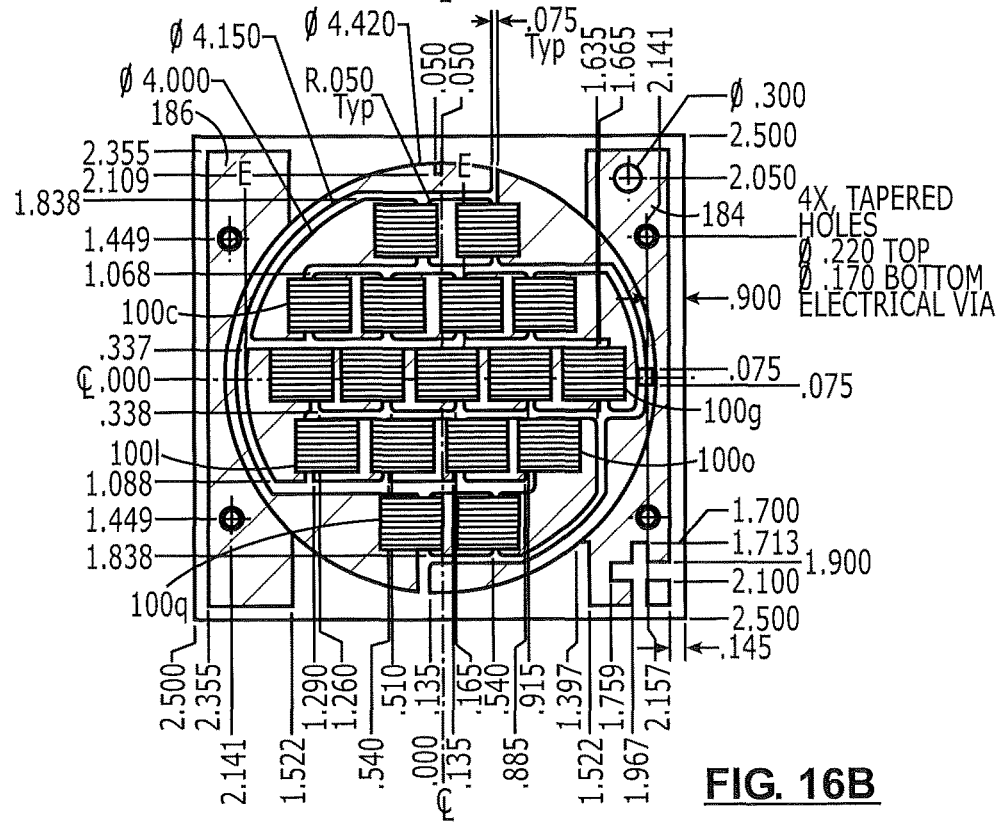
FIG. 16B is a plan view of an array of LED die with offset rows electrically coupled in series on the submount of FIG. 16B.

FIG. 16A is a plan view illustrating a submount 180 with anode, island, and cathode pads 184, 185, and 186 for a series array of LED die, and FIG. 16B is a plan view of the submount of FIG. 16A populated with a serially connected array of seventeen LED die 100*a* to 100*q*. The structure of FIGS. 16A and 16B is similar to that of FIGS. 15A and 15B, with differences being that the submount of FIGS. 16A and 16B provides horizontal current paths and offsets between LED die of adjacent rows. Dimensions of FIGS. 16A and 16B are provided in millimeters (mm). In FIG. 16B, the current path traverses horizontally through each row from anode pad 184 to cathode pad 186. More particularly, the current path traverses from right to left through the upper-most row (including LED die 100*a* to 100*b*), left to right through the next row (including LED die 100*c* to 100*f*), right to left through the next row (including LED die 100*g* to 100*k*), left to right through the next row (including LED die 100*l* to 100*o*), and right to left through the bottom most row (including LED die 100*p* to 100*q*).

Figure 17B:
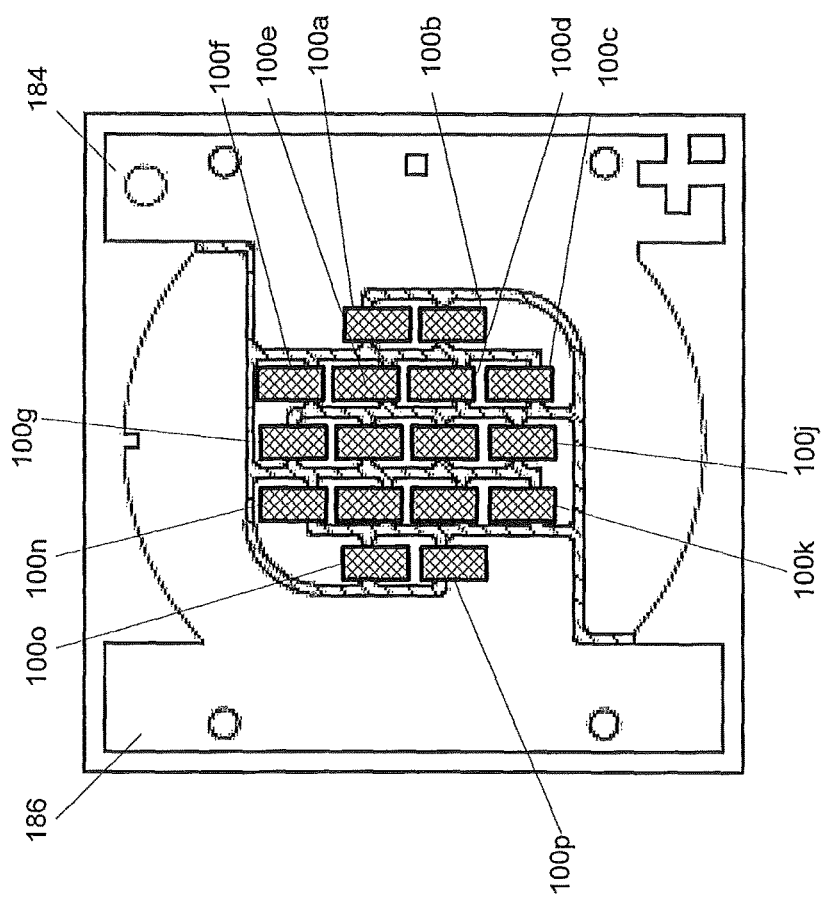
FIG. 17B is a plan view of an array of LED die with aligned rows and columns electrically coupled in series on the submount of FIG. 17B.
Figure 17A:
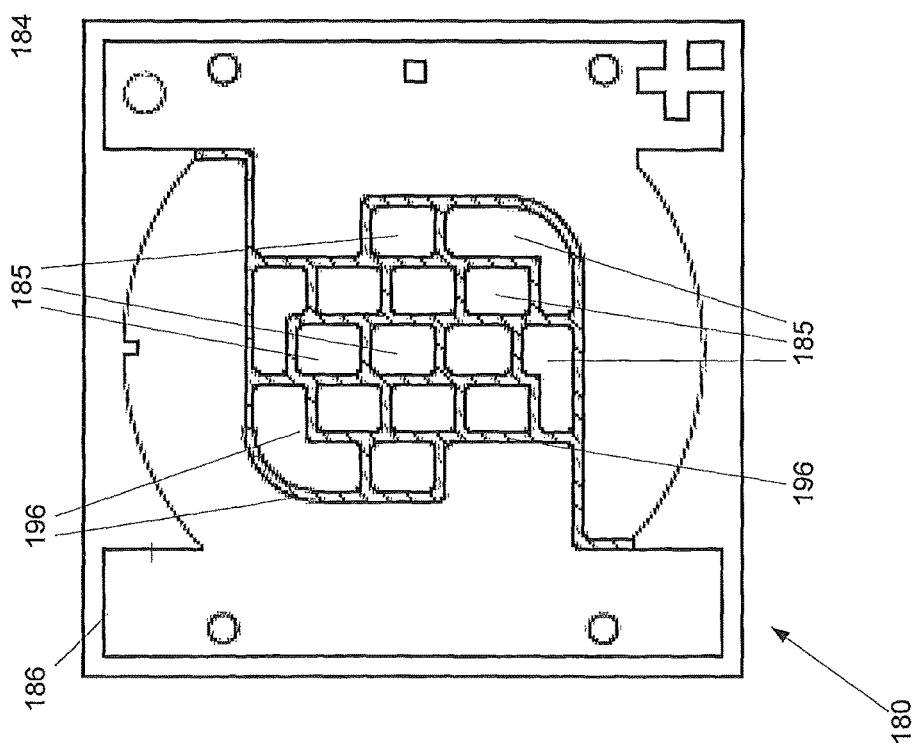
FIG. 17A is a plan view of a submount including cathode, island, and anode pads for an array of LED die according to various embodiments described herein.

FIG. 17A is a plan view illustrating yet another submount 180 with anode, island, and cathode pads 184, 185, and 186 for a series array of LED die, and FIG. 17B is a plan view of the submount of FIG. 17A populated with a serially connected array of sixteen LED die 100*a* to 100*p*. The structure of FIGS. 17A and 17B is similar to that of FIGS. 14A, 14B, and 14C. In FIG. 17B, the current path traverses vertically through each column from anode pad 184 to cathode pad 186. More particularly, the current path traverses down through the left most column (including LED die 100*a* to 100*b*), up through the next column (including LED die 100*c* to 100*f*), down through the next column (including LED die 100g to 100j), up through the next column (including LED die 100k to 100n), and down through the left most column (including LED die 100o to 100p).

Figure 19:
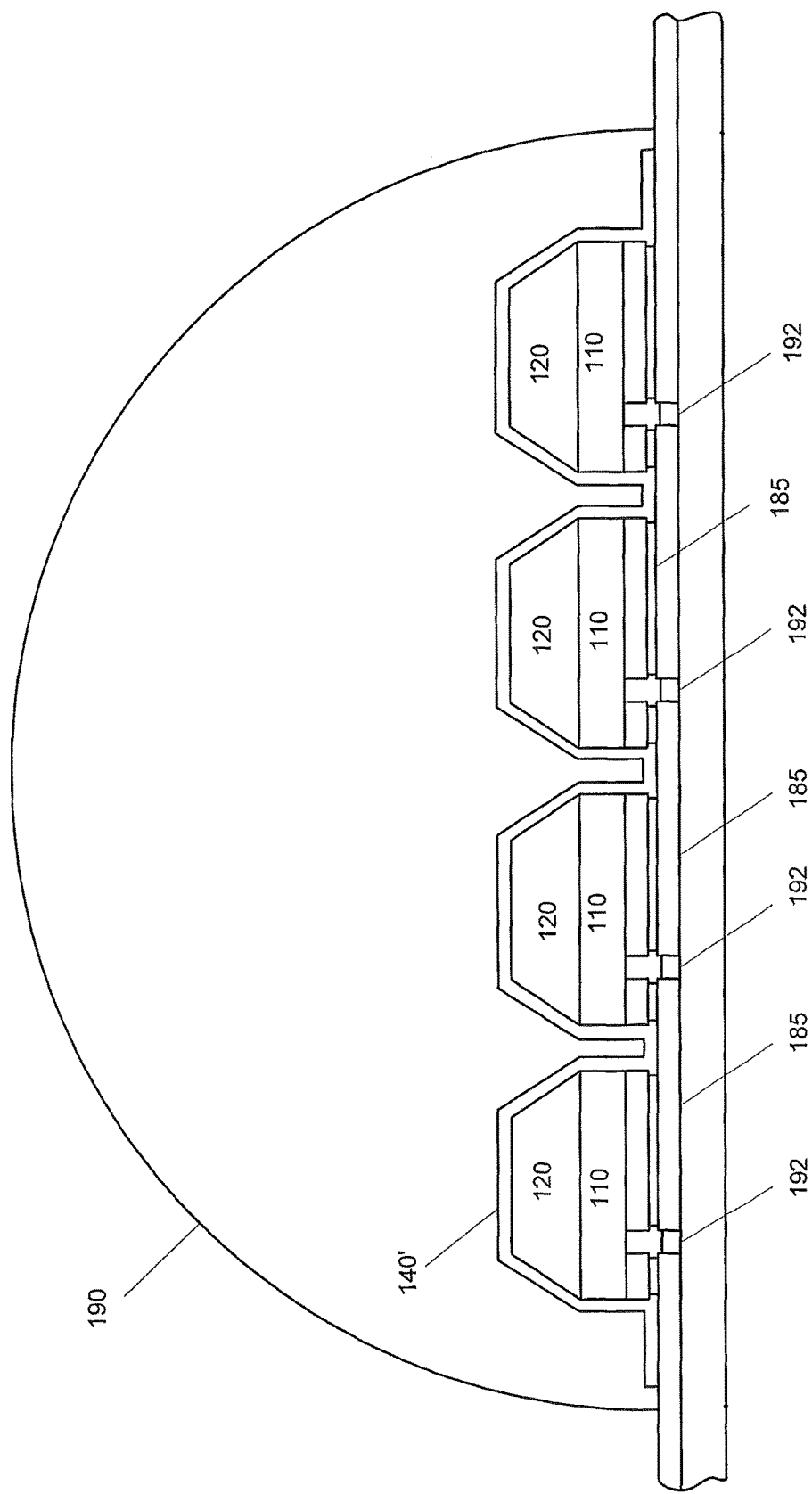
FIG. 19 is a cross-sectional view of an array of LED die with a l according to various embodiments described herein.

As discussed above, for example, with respect to FIGS. 7B, 8B, 9B, 10B, 12C, and 14C, individual phosphor layers 140 may be provided for each LED die 100. According to other embodiments, a continuous and conformal phosphor layer 140' may be provided on the array of LED die 100 and on portions of the submount between LED die as shown in FIG. 18. The conformal phosphor layer 140', for example, may have a thickness that is less than a thickness of the LED die 100 and that is less than half of a spacing between adjacent LED die 100. With either individual or continuous phosphor layers 140 or 140', a single lens 190 may be provided on the array as shown in FIG. 19. While FIGS. 18 and 19 show a series arrangement of LED die 100 on island pads 185, a continuous and conformal phosphor layer 140' and/or a lens may be provided on any of the parallel or series arrays discussed above.

Figure 20:
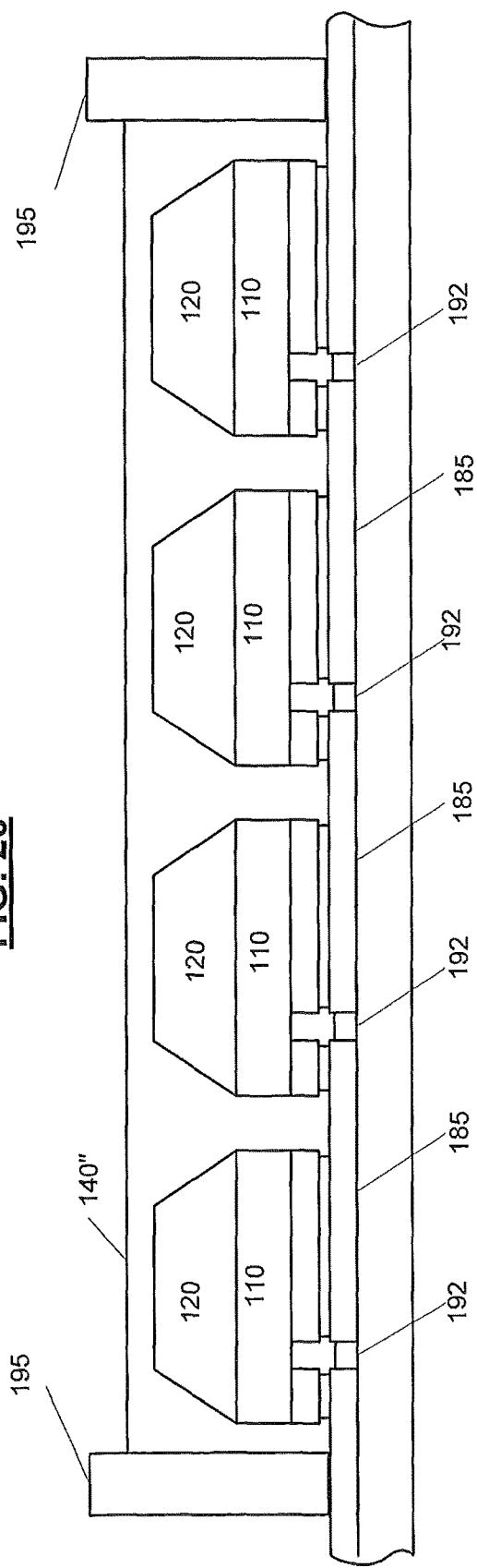
FIG. 20 is a cross-sectional view of an array of LED die with a dam containing a phosphor layer on the array according to various embodiments described herein.

According to still other embodiments, a dam 195 may surround the array of LED die 100 as shown in the cross-sectional view of FIG. 20, and the dam 195 may be used to confine a phosphor layer 140" that may be dispensed as a liquid therein and then solidified. The dam 195 and phosphor layer 140" may be substituted for a lens 190 and phosphor layer 140/140' in any of the structures discussed above. The dam 195, for example, may define a perimeter surrounding the array of LED die 100, wherein the perimeter defined by the dame 195 has a placement and dimensions corresponding to those of a perimeter of a lens 190 as discussed above with respect to FIGS. 7A, 8A, 9A, 10A, 11B, 12B, 13B, 14B, and 16B. As shown in FIG. 20, phosphor layer 140" may have a thickness that is greater than a thickness of LED die 100 (including cathode/anode contacts and bonding metal 188.) While dam 195 and thick phosphor layer 140" are shown with a series array of LED die 100 and island pads 185, dam 195 and thick phosphor layer 140" may be used with any of the parallel or series structures discussed above.

Figure 21A:
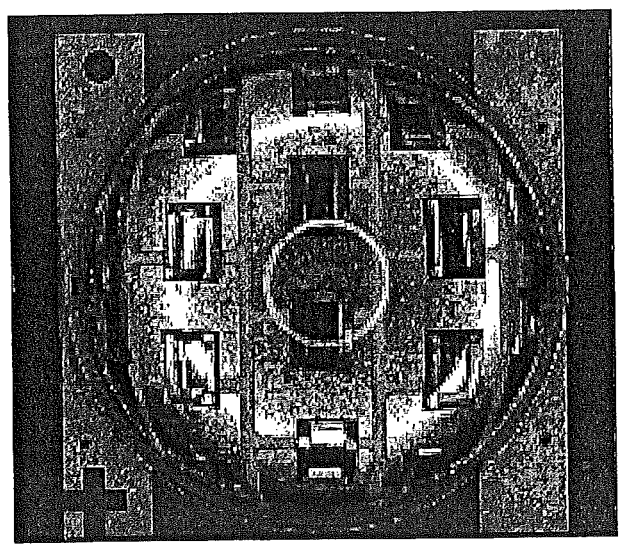
FIG. 21A is a photograph of a LED assembly including 16 LED die with a common encapsulating lens on a submount according to various embodiments described herein.

Examples of LED assemblies according to various embodiments will now be discussed with respect to the photographs of FIGS. 21A-B and 22A-D. In FIG. 21A, an LED assembly includes an array of sixteen LED die electrically coupled in series on a submount and encapsulated in a common lens, and in FIG. 21B, the LED assembly (including submount and LED die) is shown without the lens. Electrically conductive anode, island, and cathode pads of the submount of FIGS. 21A and 21B, for example, may be provided substantially as shown in FIG. 15A (with mirror image reversal). As shown, LED die of the array may be arranged in columns (more generally referred to as lines) with the serial current path defined up and down through columns of the array. Moreover, different columns of LEDs may include different numbers of LED die and/or LED die of adjacent columns may be offset so that the relatively large array of LED die may be arranged with sufficient spacing between a perimeter of the lens and all of the LED die of the array. Accordingly, an efficiency of light output from the array of LED die through the lens may be improved.

Figure 21B:
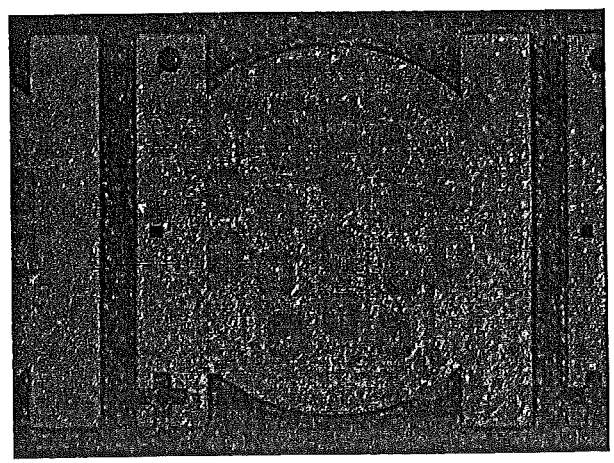
FIG. 21B is a photograph of the assembly of FIG. 21A without the encapsulating lens.

In the LED assembly of FIGS. 21A-B, sixteen LED die may be solder bonded to electrically conductive pads of the submount as discussed above, for example, with respect to FIGS. 1-6 and 15A-B. Each LED die of the array may have dimensions of about 350 micrometers by about 470 micrometers (for a surface area of about 164,500 square micrometers or about 0.1645 square mm), to provide a total active light emitting area for the LED assembly of about 2.63 square mm. The submount may have dimensions of about 5 mm by 5 mm for a surface area of about 25 square mm. Spacings between adjacent LED die may be about 425 micrometers. Moreover, LED die arrangements/spacings shown in FIG. 21B may provide improved luminous flux, for example, by reducing light absorption between LED die and/or by maintaining adequate spacings between all LED die of the array and a perimeter of the lens.

After testing, each of the 16 LED die may have a forward operating voltage Vf of about 3 volts, and the serially coupled array of the 16 LED die may have a forward operating voltage of about 46 volts. With an operating current of about 21.9 mA through the serially coupled array of 16 LED die, a forward operating voltage of about 46 volts, and a resulting power of about 1 Watt, the LED assembly of FIGS. 21A-B provided a luminous flux of about 146 lm and a color rendering index (CRI) of about 70.

Figures 22A, 22B, 22C, 22D:
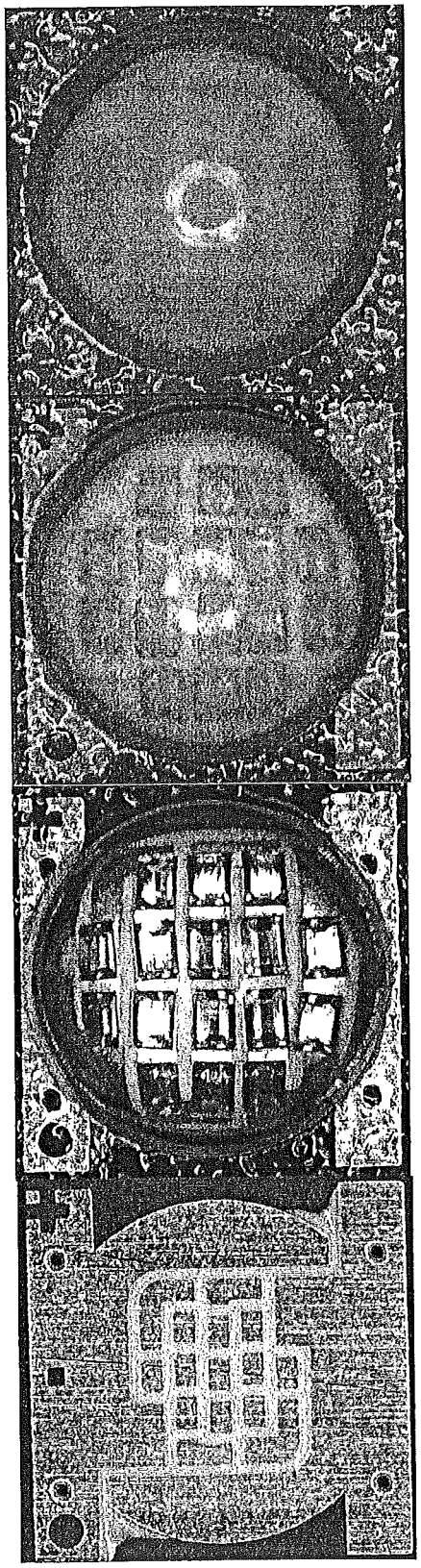
FIG. 22A is a photograph of a submount including electrically conductive pads for an array of serially connected LED die according to various embodiments described herein.
FIGS. 22B, 22C, and 22D are photographs of LED assemblies including the submount of FIG. 22A.

A similar LED assembly with a smaller submount and a serially coupled array of smaller LED die may be provided as shown in FIGS. 22A-D. In FIG. 22A, an LED submount is provided for an array of sixteen LED die electrically coupled in series, and FIG. 22B-C show arrays of LED die packaged on the submount of FIG. 22A with different lenses/phosphors. Electrically conductive anode, island, and cathode pads of the submount of FIGS. 22A-D, for example, may be provided substantially as shown in FIGS. 14A and/or 17A. As shown, LED die of the array may be arranged in rows (more generally referred to as lines) with the serial current path defined to the left and right through rows of the array. Moreover, different rows and/or columns of LEDs may include different numbers of LED die so that the relatively large array of LED die may be arranged with sufficient spacing between a perimeter of the lens and all of the LED die of the array. Accordingly, an efficiency of light output from the array of LED die through the lens may be improved.

In the LED assembly of FIGS. 22A-D, sixteen LED die may be solder bonded to electrically conductive pads of the submount as discussed above, for example, with respect to FIGS. 1-6, 14A-C, and 17A-B. Each LED die of the array may have dimensions of about 240 micrometers by about 470 micrometers (for a surface area of about 76,800 square micrometers or about 0.0768 square mm), to provide a total active light emitting area for the LED assembly of about 1.23 square mm. The submount may have dimensions of about 3.5 mm by 3.5 mm for a surface area of about 12.25 square mm. Moreover, LED die arrangements/spacings for the LED arrays of FIGS. 22A-D may provide improved luminous flux, for example, by reducing light absorption between LED die and/or by maintaining adequate spacings between all LED die of the array and a perimeter of the lens.

After testing, each of the 16 LED die may have a forward operating voltage Vf of about 3.08 volts, and the serially coupled array of the 16 LED die may have a forward operating voltage of about 49.4 volts. With an operating current of about 21.9 mA through the serially coupled array of 16 LED die, a forward operating voltage of about 49.4 volts, and a resulting power of about 1.08 Watts (electrical Watts) consumed by the array of 16 LED die, the LED assembly of FIG. 22B provided a radiant flux of about 537 mW at a wavelength of 454 nm, the LED assembly of FIG. 22C provided a cool white output measured as 133 lumens at 6500K, and the LED assembly of FIG. 22D provided a warm white output measured as 104 lumens at 3080K. The different outputs of the assemblies of FIGS. 22B-D resulted from different phosphor combinations/compositions/concentrations/etc. used with the different assemblies. Measured individually, each LED die of FIGS. 22B-D may generate a light output having a wavelength of about 454 nm with an operating current of about 20 ma at a power of about 32 mw.

Accordingly, some embodiments may enable relatively small area LED submounts (e.g., 25 square mm or less, or even 12.25 square mm or less) for higher voltage application LED arrays. Such LEDs, for example, may provide Vfs of at least about 12V, at least about 24V, at least about 36V, at least about 42V, at least about 48V, at least about 50V, or even greater than 54V (assuming that each LED die has a Vf of about 3 V) with corresponding higher efficiencies due to lower current requirements. Certain embodiments may enable very high voltage operation (e.g., greater than about 45V as discussed above with respect to FIGS. 21A-B and 22A-D) with efficiency numbers for individual LED die as set forth, for example, in U.S. application Ser. No. 13/018,013 filed Jan. 31, 2011, the disclosure of which is hereby incorporated herein in its entirety by reference.

According to some embodiments discussed above, LED assemblies may include serially coupled LED die on a submount having a total surface area in the range of about 0.5 square mm to about 5.0 square mm, and more particularly, in the range of about 1 square mm to about 3 square mm. Each individual LED die have a surface area in the range of about 0.01 square mm to about 0.3 square mm, and more particularly, in the range of about 0.05 square mm to about 0.2 square mm. Accordingly, a serially coupled array of 16 LED die may provide a combined LED die surface area in the range of about 0.16 square mm to about 4.8 square mm, and more particularly, in the range of about 0.8 square mm to about 3.2 square mm. With an array of 16 LED die electrically coupled in series, the array may provide a total forward operating voltage greater than about 45 volts, greater than about 48 volts, greater than about 50 volts, or even greater than about 54 volts. As discussed above, the LED die may be solder bonded to submount pads eliminating wirebonds between LED die of the array and improving electrical coupling between LED die of the array.

The numerous embodiments discussed above may thus provide an electronic device including a plurality of light emitting diode (LED) die electrically and mechanically bonded to a submount, with each LED die including a diode region, an anode contact, and a cathode contact. More particularly, each LED die may include the diode region having first and second opposing faces and including therein an n-type layer and a p-type layer with the first face between the second face and the packaging substrate. The anode contact of each LED die may ohmically contact the p-type layer and may extend on the first face between the first face and the packaging substrate, and the cathode contact may ohmically contact the n-type layer and may extend on the first face between the first face and the packaging substrate. Moreover, adjacent LED die may be spaced apart by distances in the range of about 20 micrometers to about 500 micrometers, by distances in the range of about 40 micrometers to about 150 micrometers, or even by distances in the range of about 50 micrometers to about 100 micrometers.

These electronic devices may be assembled by sequentially (and individually) placing each of a plurality of light emitting diode (LED) die on the submount, and by performing a reflow operation to provide a metallic bond between anode and cathode contacts of each of the LED die and the submount. Moreover, the metallic bonds may be provided using eutectic solder bonds. By sequentially/individually placing relatively small LED die, the LED die can be individually tested to provide improved yield relative to large area LED die and/or relative to arrays of LED die maintained on a growth substrate during placement operations. According to some embodiments, flux may be provided between the LED die and the submount, and the reflow operation may be performed after placing all of the LED die on the submount. According to some other embodiments, a temperature of the submount may be maintained above a reflow temperature for metallic bonding while the plurality of LED die are placed on the submount.

The plurality of LED die may be electrically coupled in series, wherein each of the plurality of LED die has a forward operating voltage in the range of about 2 volts to about 4 volts, and wherein a forward operating voltage of the serially coupled plurality of LED die is at least about 12 volts. More particularly, each of the LED die may have a forward operating voltage in the range of about 2.5 volts to about 3.5 volts (e.g., about 3 volts), and the forward operating voltage of the serially coupled plurality of LED die may be at least about 12 volts, at least about 24 volts, at least about 36 volts, at least about 48 volts, or even at least about 54 volts. For example, the plurality of serially coupled LED die may include at least about 4 LED die, at least about 8 LED die, at least about 12 LED die, or even at least about 16 LED die.

According to some other embodiments, the plurality of LED die may be electrically coupled in parallel. By using an array of a larger number of smaller LED die in parallel as opposed to using fewer or even one larger LED die, an effective yield of LED die may be improved because a larger percentage of a fabrication wafer will be converted to useful LED die when smaller die are produced. For example, the plurality of parallel LED die may include at least about 4 LED die, at least about 8 LED die, at least about 12 LED die, or even at least about 16 LED die. Going to LED die sizes beyond 1 mm or 1.4 mm may be prohibitive from a cost and manufacturing perspective to provide desired performance and light extraction. Instead of a 1.4 mm LED die, for example, four 700 micrometer LED die may be used. Die yield percentage per wafer may increase as LED die size is reduced. For a 700 micrometer LED die, an extraction efficiency per chip may improve because the rations of outer to inner surface is reduced. Increasing a thickness of a large LED die (e.g., a 1.4 mm LED die) to increase extraction efficiency may be impractical due to costs for dicing saw blades and for starting substrate thickness.

Moreover, the plurality of LED die may be bonded to a surface of the submount having a surface are of less than about 85 mm$^2$, less than about 65 mm$^2$, less than about 30 mm$^2$, or even less than about 15 mm$^2$. As noted above, arrays of LED die including at least 4, at least 8, at least 12, or even at least 16 LED die may be provided on these relatively small submounts.

Figure 23A:
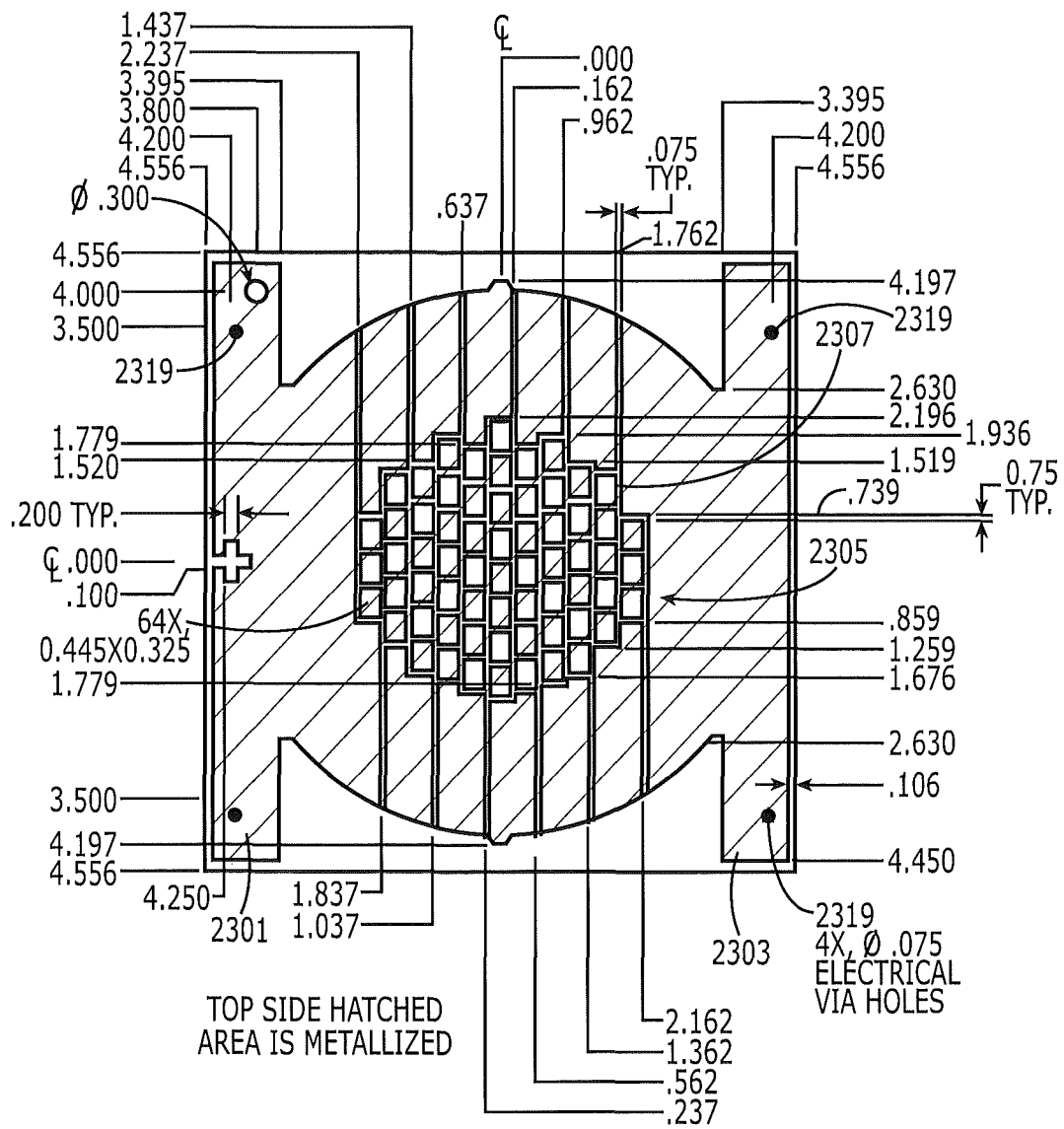
FIGS. 23A, 23B, and 23C, are respective top side, edge, and bottom side views of an LED (light emitting diode) packaging submount (with dimensions shown in mm) according to additional embodiments described herein.
Figure 23B:
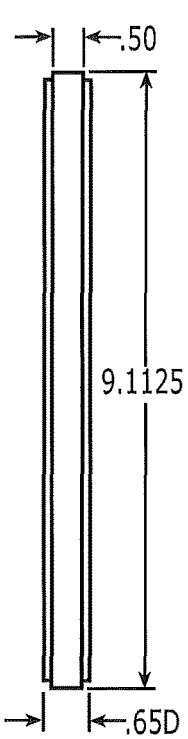
Figure 23C:
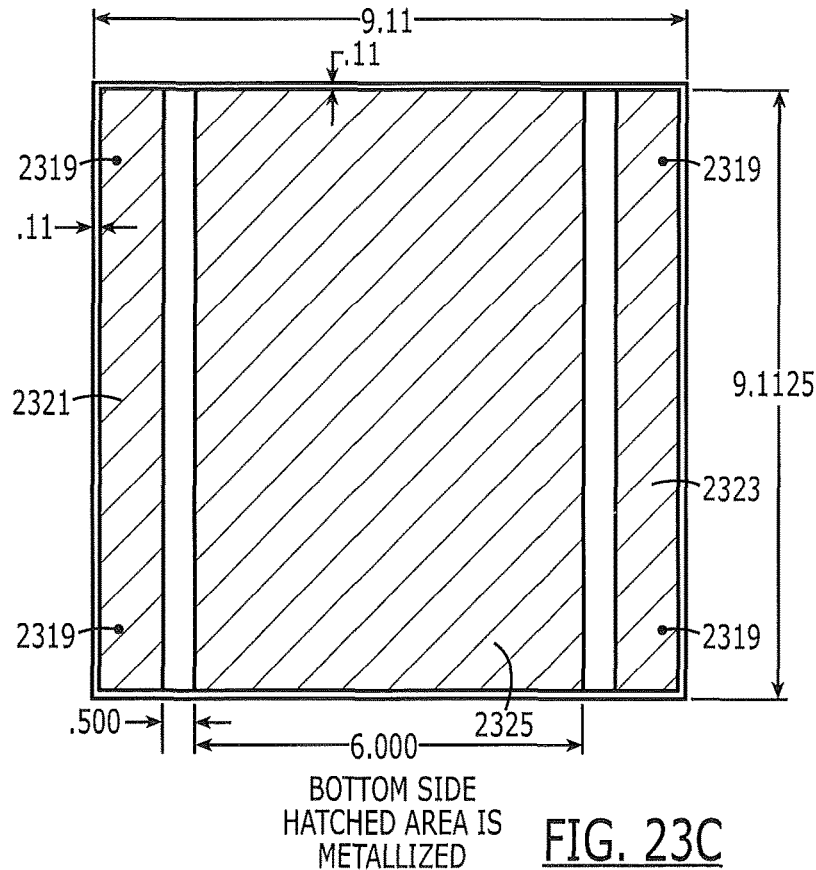
Figure 23D:
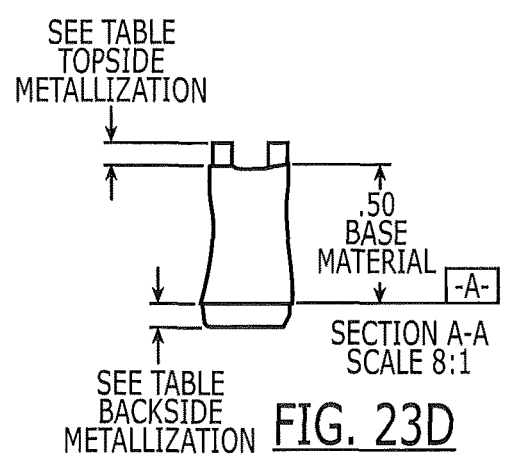
FIG. 23D is a enlarged cross sectional view of the submount of FIGS. 23A, 23B, and 23C illustrating dimensions of top side and bottom side metallizations according to embodiments described herein.

FIGS. 23A, 23B, and 23C, are respective top side, edge, and bottom side views of an LED (light emitting diode) packaging submount (with dimensions shown in mm) according to additional embodiments of the present invention. FIG. 23D is a enlarged cross sectional view of the submount of FIGS. 23A, 23B, and 23C illustrating dimensions of top side and bottom side metallizations, and FIG. 23E is a table providing a legend of materials and dimensions. A patterned metallization (e.g., including electroless copper on titanium and/or gold) on the top side of the submount may provide a positive electrical contact 2301, a negative electrical contact 2303, and a plurality of interconnection islands 2305 therebetween. As discussed above, each of the interconnection islands may provide an electrical coupling between two serially coupled LEDs in an assembled device. Moreover, electrically insulating gaps 2307 may separate the positive electrical contact 2301, the negative electrical contact 2303, and the interconnection islands 2305. By providing an optically reflective surface of the metallization and by providing a reflective material (e.g., white solder mask) in the electrically insulating gaps, a light output of the assembled device may be improved.

Moreover, electrically conductive via holes 2319 may provide electrical coupling between positive and negative electrical contacts 2301 and 2303 on the submount top side and respective positive and negative electrical contacts on the submount bottom side. Backside electrical contacts 2321 and 2323 may thus be soldered to a next level packaging substrate (e.g., a printed circuit board or PCB) to provide electrical and mechanical coupling between the submount and the next level packaging substrate without requiring wirebonds between the submount of FIGS. 23A-E. In addition, thermally conductive pad 2325 may be provided on the backside of the submount between backside electrical contacts 2321 and 2323, and thermally conductive pad 2325 may be soldered to the next level packaging substrate to increase thermal coupling between the submount and the next level packaging substrate. Use of thermally conductive pad 2325 on a thermally conductive but electrically insulating submount substrate (e.g., an aluminum nitride substrate) may thus increase conduction of heat away from light emitting diodes on the front side of the submount. More particularly, backside electrical contacts 2321 and 2323 and thermally conductive pad 2325 may be patterned from a same layer of a same electrically and thermally conductive material(s) (e.g., one or more layers of metals and/or metal alloys) so that electrically conductive gaps 2327 are provided therebetween. More particularly, back side electrical contacts 2321 and 2323 and thermally conductive pad 2325 may be patterned from a metallization including electroless copper on titanium and/or gold. Thermally conductive pad 2325 may thus be electrically isolated from electrical contact 2321, electrical contact 2323, positive electrical contact 2301, negative electrical contact 2303, and/or interconnection islands 2305.

Figure 24:
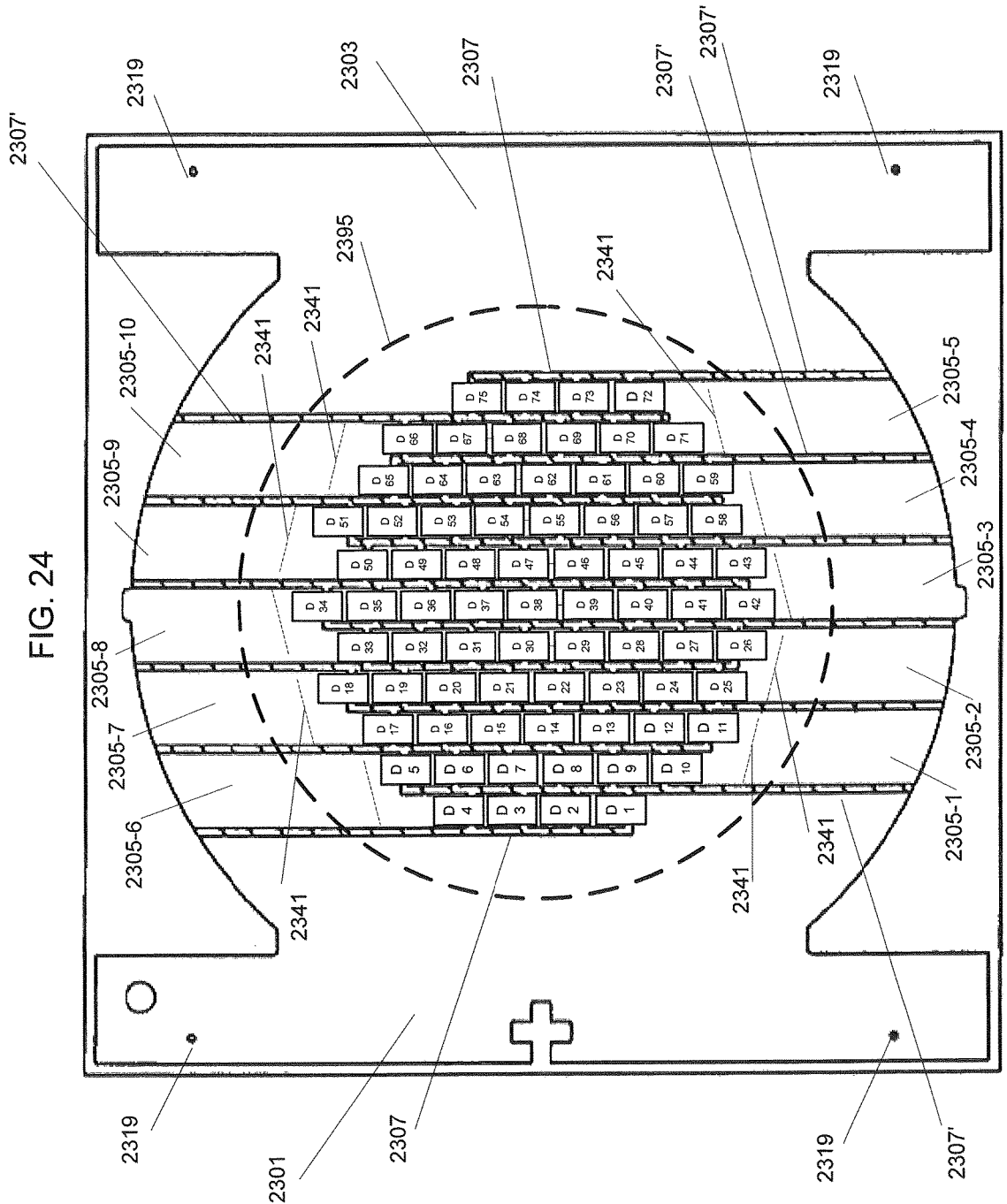
FIG. 24 is an enlarged top view of the submount of FIGS. 23A-23E populated with 75 serially connected LEDs according to embodiments described herein.

FIG. 24 illustrates an enlarged top view of the submount of FIGS. 23A-23E populated with 75 serially connected LEDs D1 to D75, and each LED may have a forward voltage drop in the range of about 2.5 volts to about 3.5 volts. By providing 75 serially connected LEDs with each LED having a forward voltage drop of about 3 volts, for example, a voltage drop of about 225 to 230 volts may be provided between positive and negative electrical contacts 2301 and 2303. More particularly, the 75 LEDs of FIG. 24 may be electrically coupled in series between positive and negative electrical contacts 2301 and 2303 through the interconnection islands 2305 (seventy four of which are included in the embodiment of FIGS. 23A-E and 24). Accordingly, a voltage of about 225 volts may be applied between positive and negative electrical contacts 2301 and 2303 to power the device.

The order of connection between the LEDs is according to the numbers thereof in the vertical columns of FIG. 24. For example, LED D1 is coupled between positive electrical contact 2301 and LED D2; LED D2 is coupled between LEDs D1 and D3; LED D3 is coupled between LEDs D2 and D4; LED D4 is coupled between LEDs D3 and D5; LED D5 is coupled between LEDs D4 and D6; etc. At the other end of the string, LED D72 is coupled between LEDs D71 and D73; LED 73 is coupled between LEDs D72 and D74; LED D74 is coupled between LEDs D73 and D75; and LED D75 is coupled between LED D74 and negative electrical contact 2303.

Metallization of positive/negative electrical contacts 2301 and 2303 and interconnection islands 2305 and reflective solder mask material provided in the insulating gaps 2307 therebetween may thus provide a reflective surface to improve light output from the LEDs in the completed device. Moreover, a reflective surface provided by the metallization and reflective solder mask material may extend well beyond the LEDs to provide a reflective backing over an entirety of a lens provided on the LEDs. According to some embodiments, a single optical element (e.g., phosphor layer and/or lens) may be provided on the submount including the 75 LEDs, the metallization, and the reflective material as discussed above with respect to FIG. 19. Moreover, the 75 LEDs may be confined within a substantially circular area of the submount having a diameter of no more than about 6 mm, and more particularly, no more than about 5 mm, and still more particularly, no more than about 4.5 mm. A 225 to 230 volt device with 75 LEDs may thus be assembled on a single submount with a single optical element (e.g., a phosphor layer, a lens, etc.) thereon, and all 75 LEDs may be provided in a central area of an 8 mm lens to improve light output in a submount package having dimensions of about 9 mm by 9 mm.

According to other embodiments, a phosphor light converting layer may be provided on the LEDs as discussed above with respect to FIGS. 18 and 20. In embodiments without a lens (e.g., in embodiments including phosphor layers as discussed above with respect to FIGS. 18 and 20), the tightly packed LEDs may be provided on a still smaller submount (e.g., having dimensions of about 5 mm by 5 mm) using the layout of FIGS. 23A-E and 24.

More particularly, a dam (illustrated by the dashed circle 2395 of FIG. 24) may surround the array of LEDs as discussed above with respect to dam 195 of FIG. 20, and the dam 2395 may be used to confine a phosphor layer that may be dispensed as a liquid therein and then solidified. The phosphor layer may thus define a continuous optical coating on the plurality of LEDs and on the submount so that LEDs D1 to D75 are between the optical coating and the submount. More particularly, the phosphor layer may include a layer of a transparent and/or translucent material including a phosphor material (e.g., a yellow phosphor that converts blue light to yellow light) therein. Blue emitting LEDs may thus be assembled on the submount with a yellow phosphor layer provided thereon so that a blue shifted yellow light output is generated. According to some other embodiments, the phosphor layer may include first and second different phosphor materials configured to emit different wavelengths of light responsive to light generated by the assembled LEDs.

According to still other embodiments, the phosphor layer may include first, second, and third different phosphor materials configured to emit respective first, second, and third different wavelengths of light responsive to light generated by the assembled LEDs. For example, the assembled LEDs may generate blue light, and the phosphor layer may include a binder, a first phosphor (e.g., an aluminum garnet-based phosphor) that is configured to down-convert blue light to radiation having a peak wavelength in the green color range that has a full width half maximum bandwidth that extends into the cyan color range, a second phosphor (e.g., an aluminum garnet-based phosphor) that is configured to down-convert blue light to radiation having a peak wavelength in the yellow color range, and a third phosphor (e.g., a nitride-based and/or oxynitride-based phosphor) that is configured to down-convert blue light to radiation having a peak wavelength in the red color range. Three phosphor systems are discussed, for example, in U.S. Patent Publication No. 2011/0220929, to Collins et al., entitled Warm White LEDs Having High Color Rendering Index Values And Related Luminophoric Mediums, assigned to the assignee of the present application, the entire disclosure of which is hereby incorporated by reference as if set forth fully herein (hereinafter referred to as "the '929 Publication").

In addition, a thickness of the continuous optical coating may be greater than a thickness of each of the LEDs relative to the top surface of the submount, and a surface of the continuous optical coating opposite the submount may be substantially planar over the area including the LEDs. While a planar phosphor layer may be used as discussed above, other optical elements may be used on LEDs for the submounts of FIGS. 23A-E and 24 such as a conformal phosphor layer(s) as discussed above with respect to FIG. 18 and/or a convex lens element(s) as discussed above with respect to FIG. 19.

Moreover, an optic area may be defined by an area of the submount covered by the continuous optical coating (e.g., an area of the submount within dam 2395, and/or an area of the submount covered by a convex lens element), and the LEDs on the submount (e.g., LEDs D1 to D75) may be configured to generate at least 20 lumens per square millimeter of the optic area while delivering at least 100 lumens per watt of power consumed by the plurality of light emitting diodes between the continuous optical coating and the submount while delivering at least 600 absolute lumens from the plurality of light emitting diodes between the continuous optical element (e.g., phosphor layer) and the submount. More particularly, the LEDs on the submount may be configured to generate at least 25 lumens per square millimeter of the optic area while delivering at least 100 lumens per watt of power consumed. According to some embodiments, the optic area may be in the range of about 20 square millimeters to about 200 square millimeters.

Each LED of FIG. 24 (e.g., LEDs D1 to D75) may have a structure as discussed above, for example, with respect to FIGS. 1 and 2. Each LED, for example, may include a diode region having first and second opposing faces including therein an n-type layer and a p-type layer, an anode contact that ohmically contacts the p-type layer and extends on the first face, and a cathode contact that ohmically contacts the n-type layer and extends on the first face. In addition, a support substrate may be provided on the second face of the diode region, with the diode region being between the support substrate and the anode and cathode contacts, and with the support substrate having a thickness of at least about 50 micrometers. The support substrate, for example, may be a portion of an epitaxial growth substrate remaining after dicing the LED from a processing wafer so that the support substrate and the diode region have aligned crystal structures. According to some other embodiments, the support substrate may be bonded to the diode region after removing the diode region from a growth substrate. Once the LED is assembled on the submount as shown in FIG. 24, the diode region may thus be between the support substrate and the submount.

Each LED (e.g., each of LEDs D1 to D75) may be mechanically and electrically coupled to respective interconnection islands 2905, positive electrical contact 2901, and/or negative electrical contact 2903 using first and second metallic (e.g., solder) bonds located physically between the LED and the submount as discussed above, for example, with respect to FIGS. 1 and/or 2. More particularly, each LED may include an anode contact electrically and mechanically coupled to one of interconnection islands 2905, positive electrical contact 2901, and/or negative electrical contact 2903 using a first metallic bond physically located between the anode contact and the submount. Similarly, each LED may include a cathode contact electrically and mechanically coupled to another of interconnection islands 2905, positive electrical contact 2901, and/or negative electrical contact 2903 using a second metallic bond physically located between the cathode contact and the submount. Accordingly, LEDs may be assembled on the submount of FIGS. 23A and 24 without wirebonding. Adjacent LEDs of the array illustrated in FIG. 24 may thus be spaced apart by a distance in the range of about 20 micrometers to about 500 micrometers.

As further shown in FIGS. 23A and 24, portions of metallization islands (e.g., 2305-1 to 2305-5) and gaps 2307 therebetween may extend to a perimeter of the metallization. Accordingly, positive and negative electrical contacts 2301 and 2303 may be separated by electrically isolated/separated portions of the metallization (e.g., extensions of metallization islands used to interconnect LEDs of the array). A difference in voltage between any two adjacent metallization regions may thus be reduced thereby reducing a possibility of metal migration (e.g., silver migration) between two adjacent areas of metallization. For example, a voltage difference between any two adjacent metallization regions may be less than 60 volts, and more particularly, less than 40 volts, and still more particularly, less than 30 volts, even though 225 volts is applied between positive and negative electrical contacts 2301 and 2303.

As shown in FIG. 24, metallization region 2305-1 may be an oversized interconnection island providing electrical connection between LEDs D10 and D11; metallization region 2305-1 may be an oversized interconnection island providing electrical connection between LEDs D10 and D11; metallization region 2305-2 may be an oversized interconnection island providing electrical connection between LEDs D25 and D26; metallization region 2305-3 may be an oversized interconnection island providing electrical connection between LEDs D42 and D43; metallization region 2305-4 may be an oversized interconnection island providing electrical connection between LEDs D58 and D59; metallization region 2305-5 may be an oversized interconnection island providing electrical connection between LEDs D71 and D72; metallization region 2305-6 may be an oversized interconnection island providing electrical connection between LEDs D4 and D5; metallization region 2305-7 may be an oversized interconnection island providing electrical connection between LEDs D17 and D18; metallization region 2305-8 may be an oversized interconnection island providing electrical connection between LEDs D33 and D34; metallization region 2305-9 may be an oversized interconnection island providing electrical connection between LEDs D50 and D51; and metallization region 2305-10 may be an oversized interconnection island providing electrical connection between LEDs D65 and D66. By providing that regions 2305-1 to 2305-10 are used to interconnect respective LEDs of the array, an operating voltage of each region 2305-1 to 2305-10 may be defined by LEDs to which it is connected.

While portions of metallization islands 2305-1 to 2305-10 shown extending to the perimeter of the metallization pattern are also used to couple LEDs of adjacent columns, electrically isolated/floating reflective portions of the metallization may provide the desired reflectivity. Additional (optional) reflective and insulating gaps, for example, may be provided along the dashed lines 2341 of FIG. 24 to electrically isolate extended portions of metallization islands 2305-1 to 2305-10 from the array of LEDs. According to still other embodiments, gaps 2307 between one or more of separate electrically isolated portions 2305-1 to 2305-5 may be omitted and gaps 2307 between one or more of separate electrically isolated portions 2305-6 to 2305-10 may be omitted provided that the extended portions are isolated from the LED array with gaps along the dashed lines 2341.

At 6 watts and 85 degrees C., the LED assembly of FIGS. 23A-D and 24 may provide a flux output (at a color temperature of about 3,000K) in the range of about 625 lumens to about 675 lumens, thereby providing an efficacy in the range of 100 lumens/watt to about 110 lumens/watt. At 15 watts and 85 degrees C., the LED assembly of FIG. 24 may provide a flux output (at a color temperature of about 3,000K) in the range of about 1250 lumens to about 1350 lumens, thereby providing an efficacy in the range of 83 lumens/watt to about 90 lumens/watt. At 25 degrees C., the assembly may provide greater than 125 lumens per watt (at a color temperature of 3000K). The LED assembly may be available over a full range of color temperatures from 2700K to 5000K (e.g., 2700K, 3000K, 3500K, 4000K, or 5000K) and with options for minimum CRIs of 80, 85, or 90. A viewing angle of 120 degrees may be provided with submount dimensions of 9 mm by 9 mm, and with an optical source (e.g., lens) having a diameter of 8 mm. Moreover, easywhite 4 and 2 step binning may be available, and lifetimes greater than 50,000 hours may be available.

Figure 25:
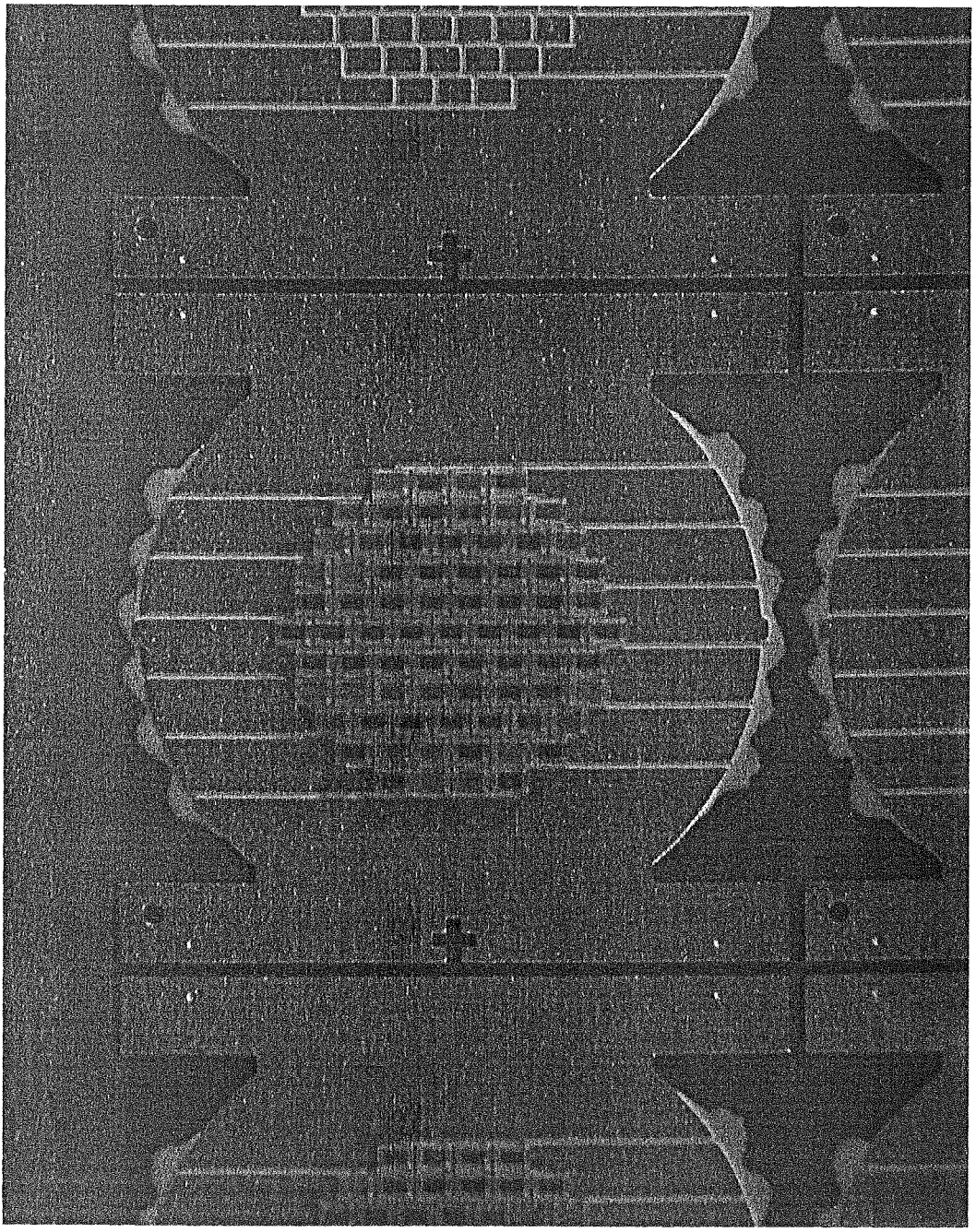
FIG. 25 is a photograph illustrating an array of submounts according to FIGS. 23A-23E populated with LEDs according to FIG. 24.
Figure 26:
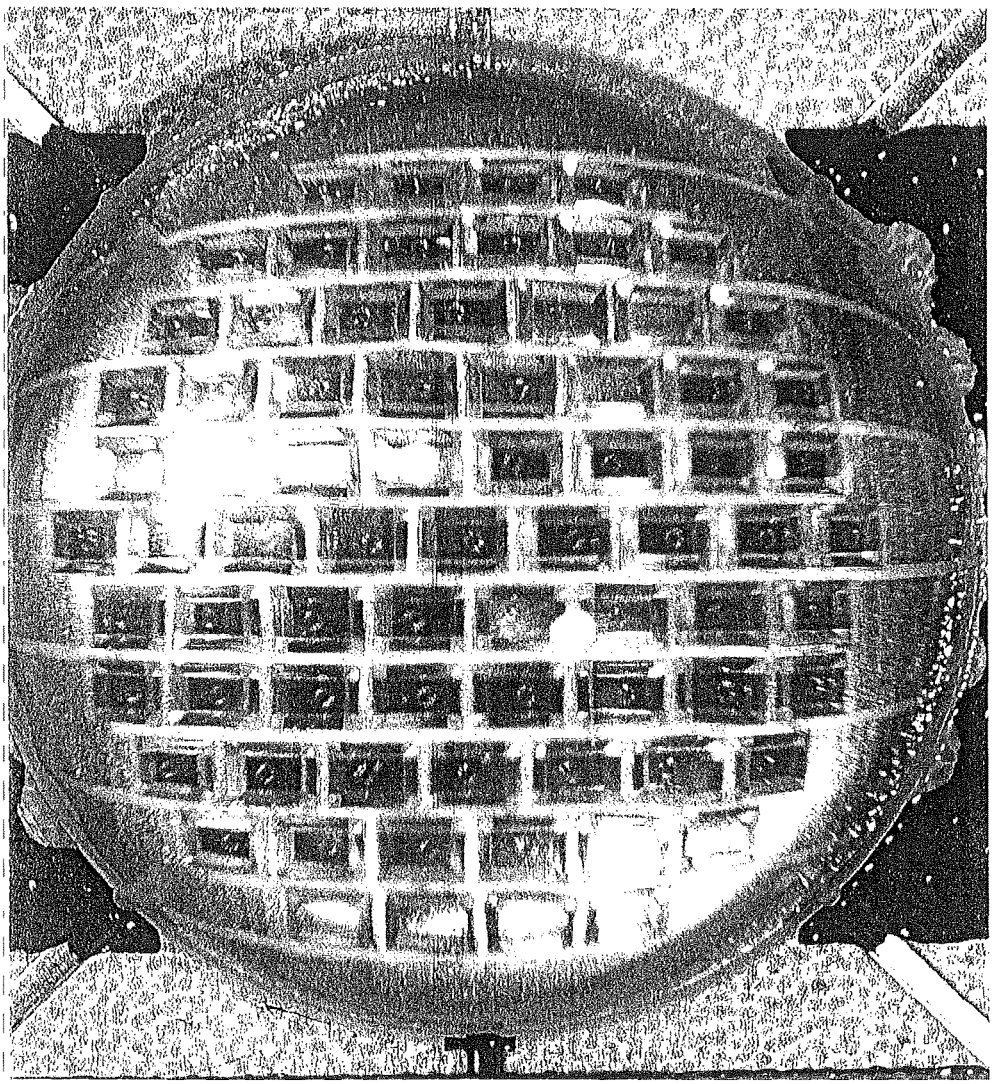
FIG. 26 is a photograph illustrating a submount populated with LEDs according to FIG. 24 with a lens thereon according to FIG. 19 (without a phosphor layer).
Figure 27:
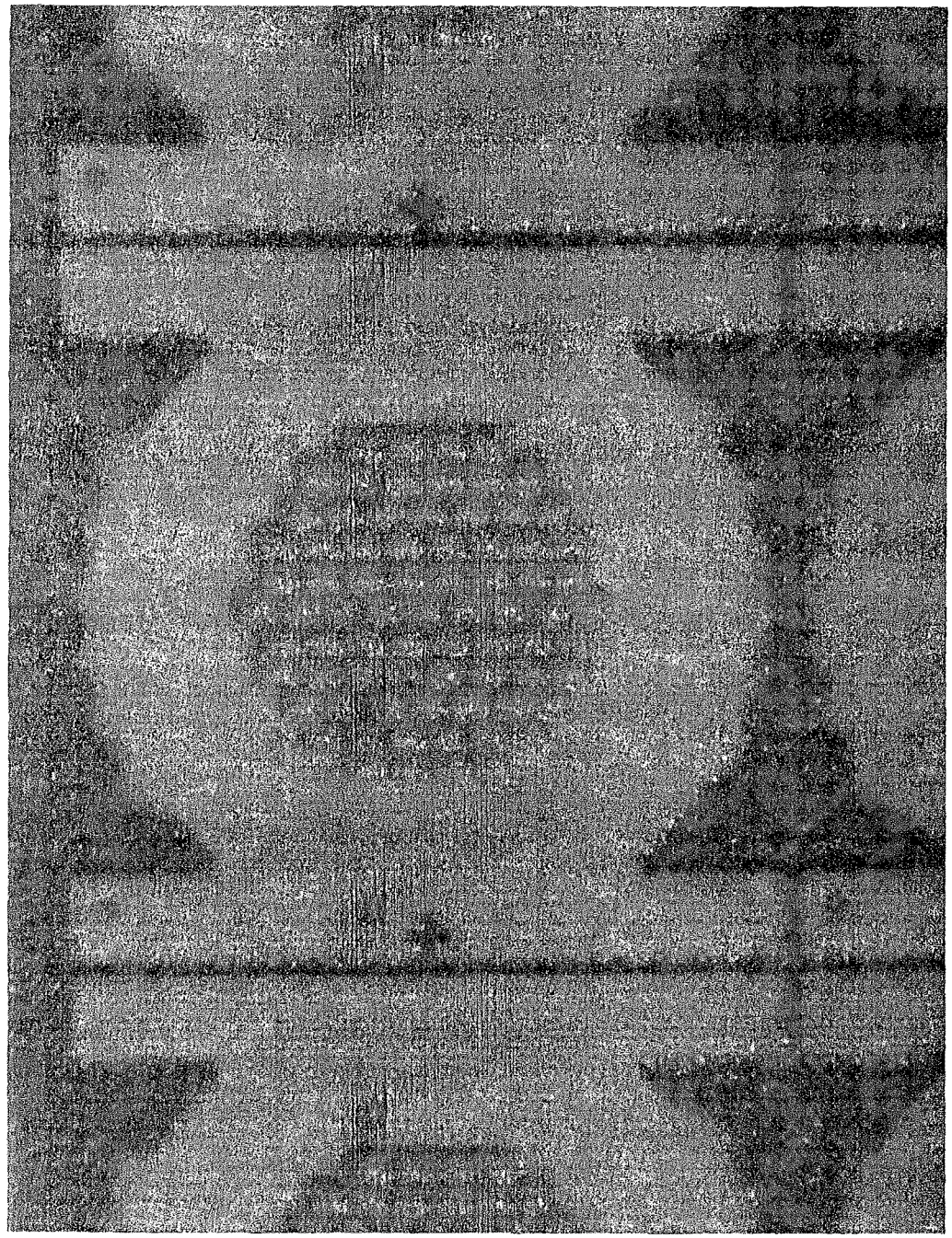
FIG. 27 is a photograph illustrating a an array of submounts according to FIGS. 23A-23E populated with LEDs according to FIG. 24 with a phosphor layer thereon according to FIG. 19.
Figure 28:
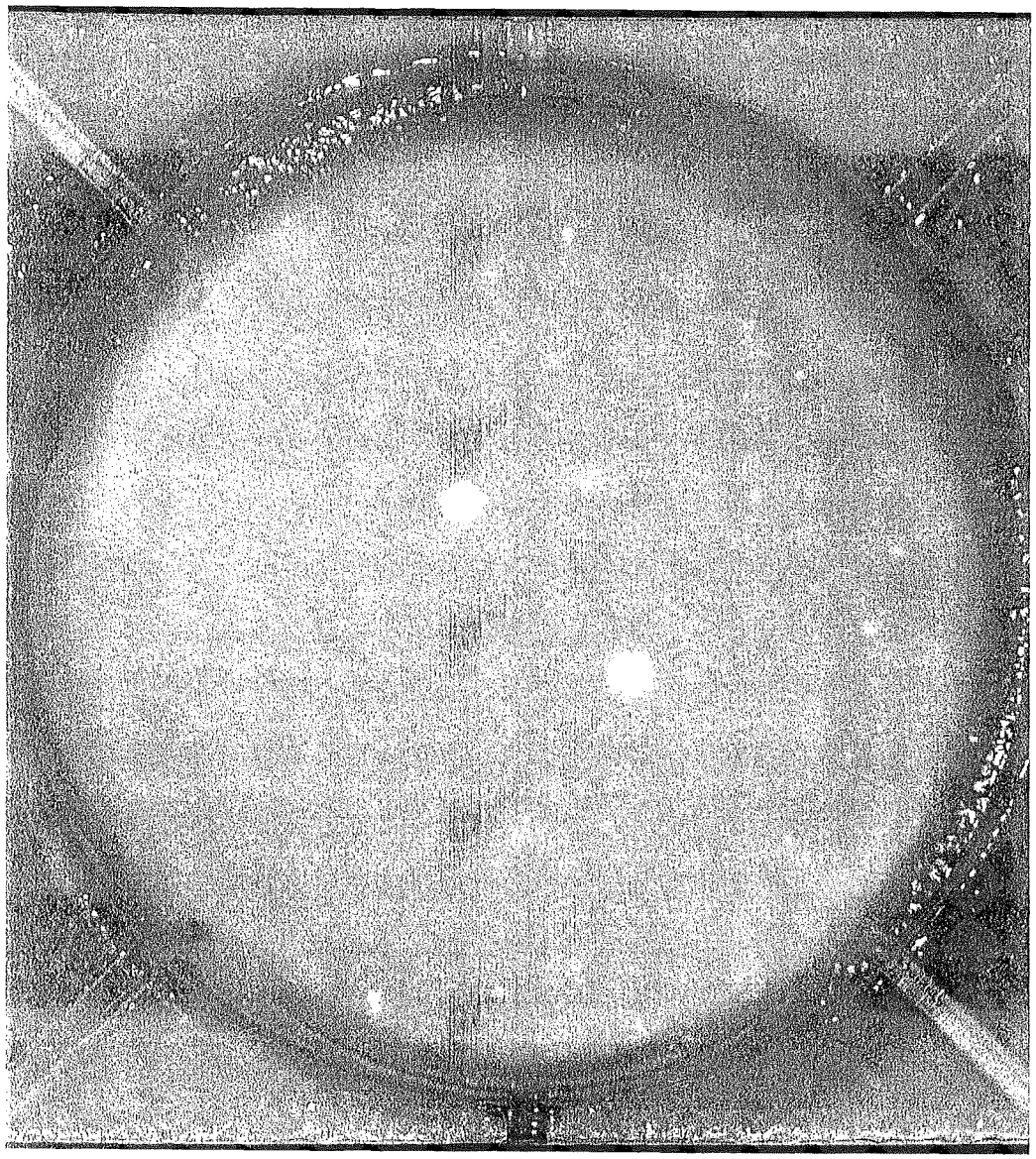
FIG. 28 is a photograph illustrating a submount populated with LEDs according to FIG. 24 with a phosphor layer and lens thereon according to FIG. 19.

FIG. 25 is a photograph illustrating an array of submounts according to FIGS. 23A-23E populated with LEDs according to FIG. 24. FIG. 26 is a photograph illustrating a submount populated with LEDs according to FIG. 24 with a lens thereon according to FIG. 19 (without a phosphor layer). FIG. 27 is a photograph illustrating a an array of submounts according to FIGS. 23A-23E populated with LEDs according to FIG. 24 with a phosphor layer thereon according to FIG. 19. FIG. 28 is a photograph illustrating a submount populated with LEDs according to FIG. 24 with a phosphor layer and lens thereon according to FIG. 19.

Figure 29A:
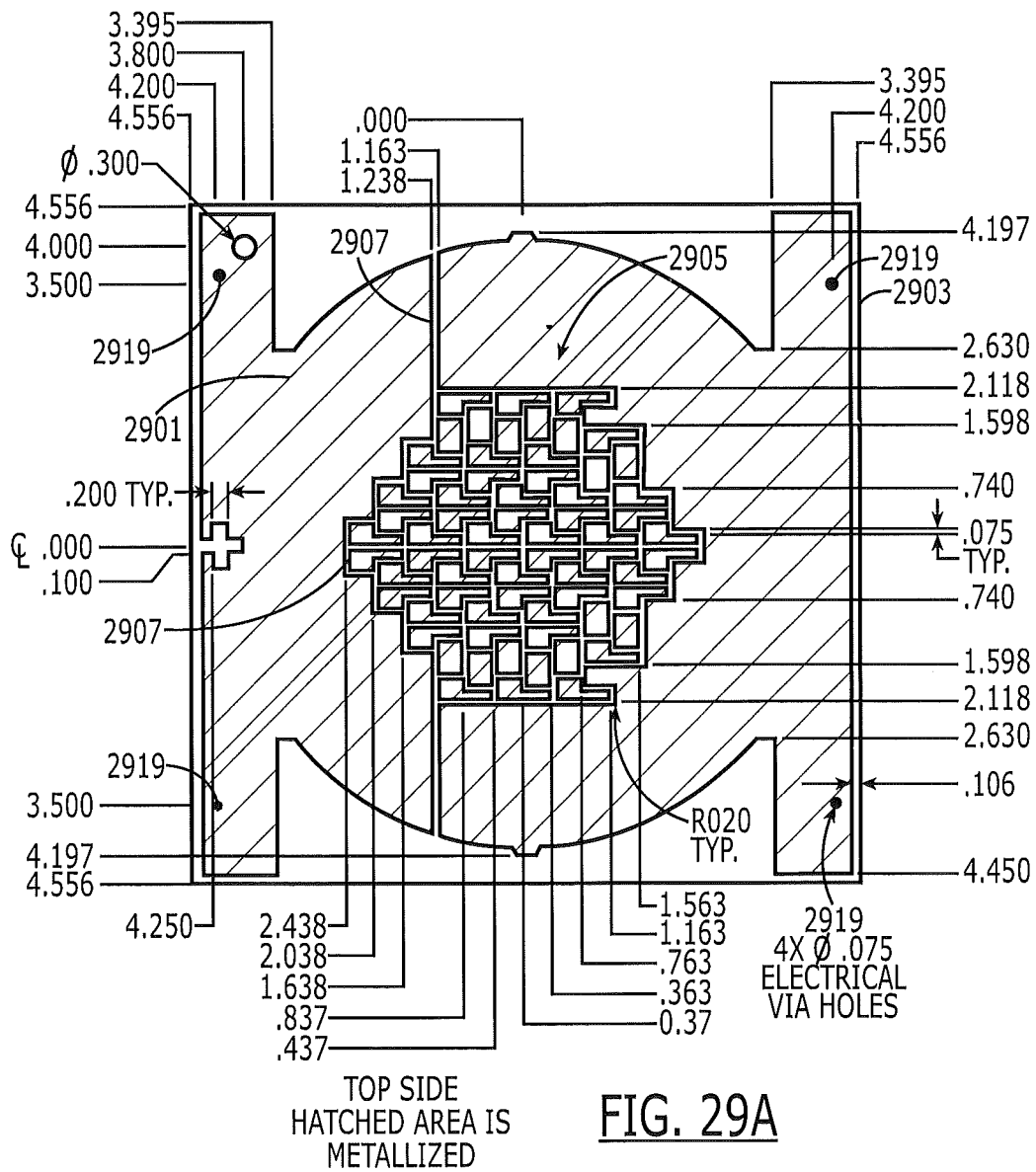
FIGS. 29A, 29B, and 29C, are respective top side, edge, and bottom side views of an LED (light emitting diode) packaging submount (with dimensions shown in mm) according to additional embodiments described herein.
Figure 29B:
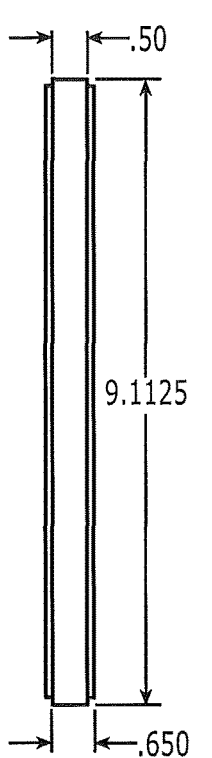
Figure 29C:
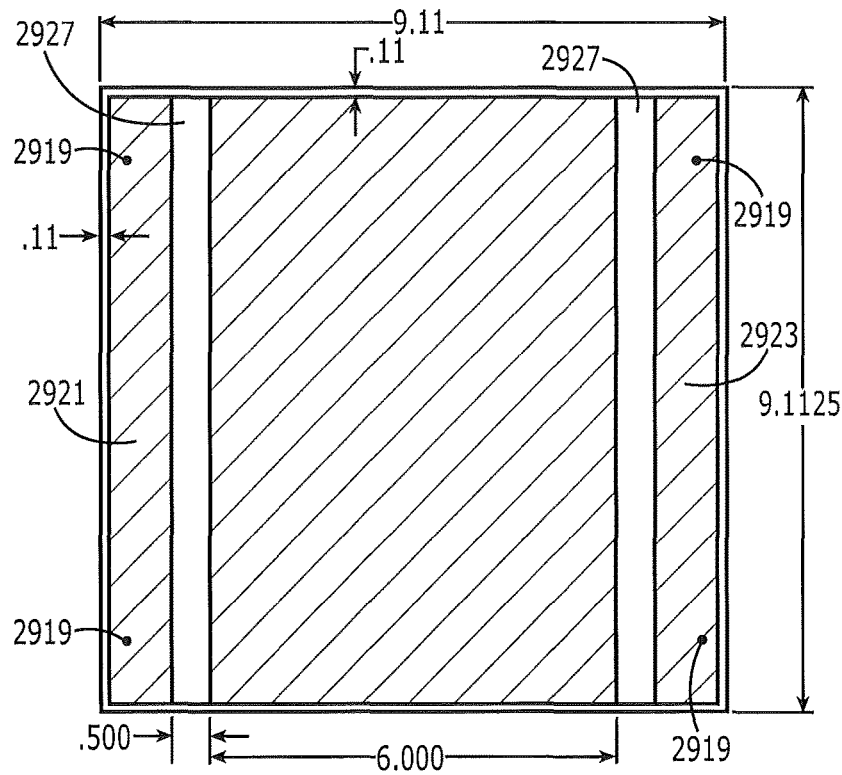
Figure 29D:
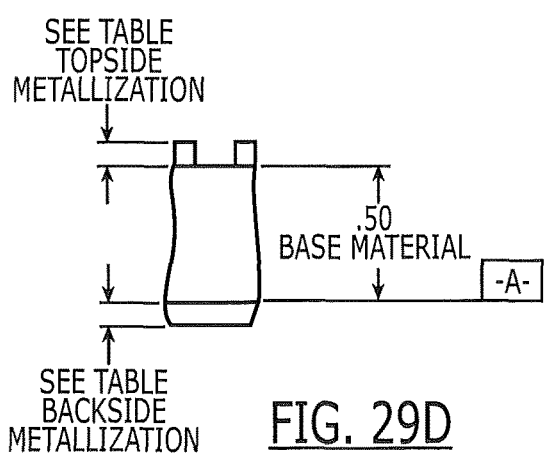
FIG. 29D is a enlarged cross sectional view of the submount of FIGS. 29A, 29B, and 29C illustrating dimensions of top side and bottom side metallizations according to embodiments described herein.

FIGS. 29A, 29B, and 29C, are respective top side, edge, and bottom side views of an LED (light emitting diode) packaging submount (with dimensions shown in mm) according to additional embodiments of the present invention. FIG. 29D is a enlarged cross sectional view of the submount of FIGS. 29A, 29B, and 29C illustrating dimensions of top side and bottom side metallizations, and FIG. 29E is a table providing a legend of materials and dimensions. A patterned metallization (e.g., including electroless copper on titanium and/or gold) on the top side of the submount may provide a positive electrical contact 2901, a negative electrical contact 2903, and a plurality of interconnection islands 2905 therebetween. As discussed above, each of the interconnection islands may provide an electrical coupling between two serially coupled LEDs in an assembled device. Moreover, electrically insulating gaps 2907 may separate the positive electrical contact 2901, the negative electrical contact 2903, and the interconnection islands 2905. By providing an optically reflective surface of the metallization and by providing a reflective material (e.g., white solder mask) in the electrically insulating gaps, a light output of the assembled device may be improved.

Moreover, electrically conductive via holes 2919 may provide electrical coupling between positive and negative electrical contacts 2901 and 2903 on the submount top side and respective backside electrical contacts 2921 and 2923 on the submount bottom side. Backside electrical contacts 2921 and 2923 may thus be soldered to a next level packaging substrate (e.g., a printed circuit board or PCB) to provide electrical and mechanical coupling between the submount and the next level packaging substrate without requiring wirebonds. In addition, thermally conductive pad 2925 may be provided on the backside of the submount between backside electrical contacts 2921 and 2923, and thermally conductive pad 2925 may be soldered to the next level packaging substrate to increase thermal coupling between the submount and the next level packaging substrate. Use of thermally conductive pad 2925 on a thermally conductive but electrically insulating submount substrate (e.g., an aluminum nitride substrate) may thus increase conduction of heat away from light emitting diodes on the front side of the submount. More particularly, backside electrical contacts 2921 and 2923 and thermally conductive pad 2925 may be patterned from a same layer of a same electrically and thermally conductive material(s) (e.g., one or more layers of metals and/or metal alloys) so that electrically conductive gaps 2927 are provided therebetween. More particularly, back side electrical contacts 2921 and 2923 and thermally conductive pad 2925 may be patterned from a metallization including electroless copper on titanium and/or gold. Thermally conductive pad 2925 may thus be electrically isolated from electrical contact 2921, electrical contact 2923, positive electrical contact 2901, negative electrical contact 2903, and/or interconnection islands.

Figure 30B:
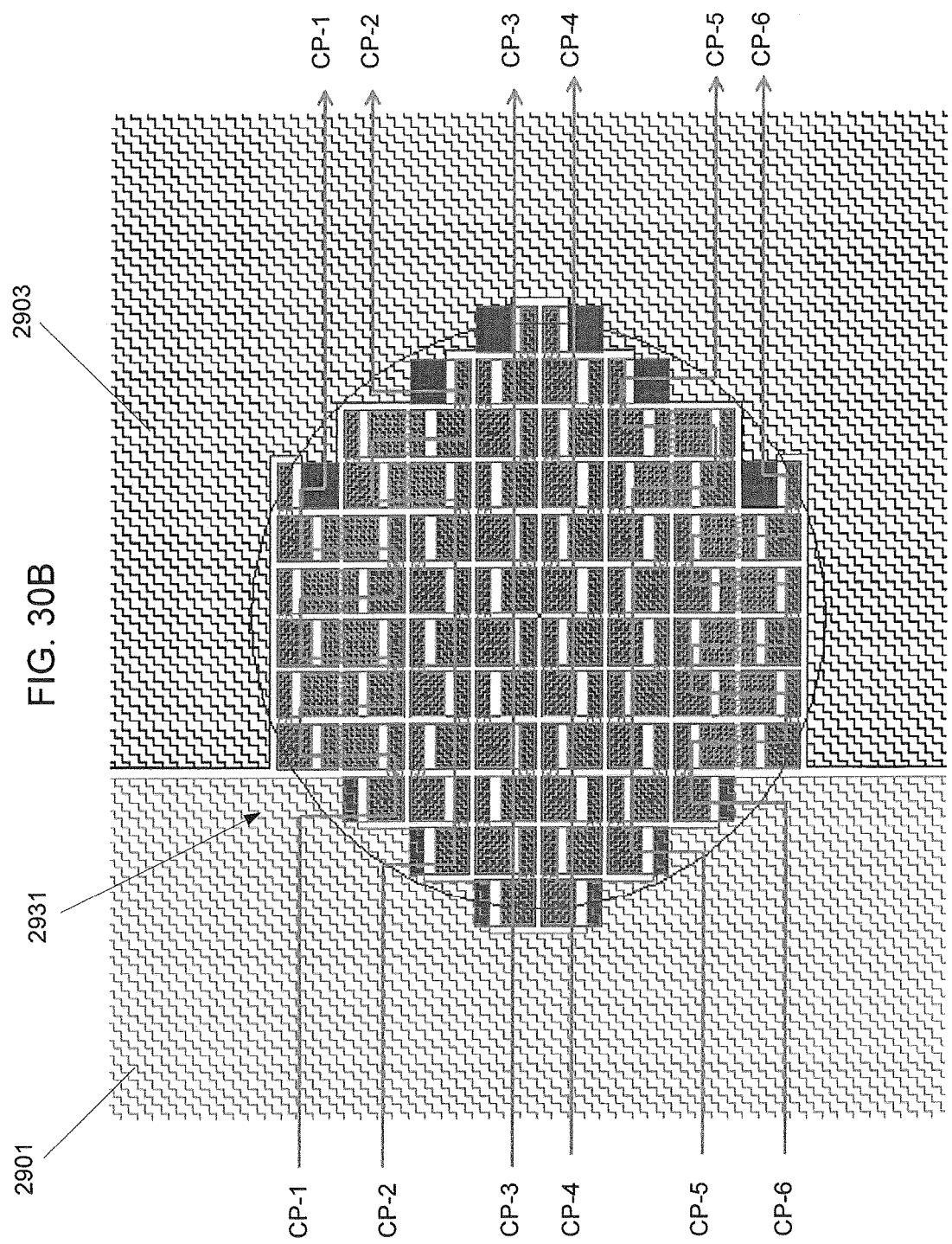
FIG. 30B illustrates the submount of FIGS. 29A-29E populated with 6 strings of 12 serially connected LEDs according to embodiments described herein.

FIG. 30A illustrates an enlarged view of the top side of the submount of FIG. 29A. As discussed in greater detail below, the submount of FIG. 30A may be populated with 6 strings of serially coupled LEDs with each of the strings being electrically coupled in parallel, and each LED may have a forward voltage drop of about 3 volts. More particularly, the strings of serially coupled LEDs may be electrically coupled between positive and negative electrical contacts 2901 and 2903 through the interconnection islands 2905 (sixty six of which are included in the embodiment of FIGS. 29A-E and 30A-C). Accordingly, a voltage of about 36 volts may be applied across positive and negative electrical contacts 2901 and 2903 to power the device.

Moreover, gaps 2907' may extend from a central regions of the submount surrounding interconnection islands 2905 to electrically separate positive and negative electrical contacts 2901 and 2903. With only a single pair of such gaps 2907' separating positive and negative electrical contacts 2901 and 2903, the full voltage difference between positive and negative electrical contacts 2901 and 2903 may be provided across gaps 2907'. To reduce a risk of shorting between electrical contacts 2901 and 2903 due to metal migration across gaps 2907', additional gaps 2907" may be provided as indicated by dashed lines to reduce a voltage drop across any one of gaps 2907' and/or 2907" thereby reducing a risk of metal migration across gaps. By including all of gaps 2907' and 2907", six electrically isolated regions may be provided to increase an electrical separation between positive and negative electrical contacts 2901 and 2903 while maintaining a substantially circular reflective surface surrounding LEDs subsequently assembled on the submount. Each of the electrically isolated regions may thus define an electrically conductive reflector that is electrically isolated from each of positive electrical contact 2901, negative electrical contact 2903, and electrically conductive islands 2905.

According to some other embodiments, each of the six regions defined by gaps 2907' and 2907" may extend from (and thus be electrically connected to) a respective one of interconnection islands 2905 so that each of the six regions is fixed to an electrical potential of a respective interconnection island during device operation so that none of the six regions is allowed to float electrically. Accordingly, each of the three regions on one side of the submount may be fixed to respective different intermediate voltages between voltages of positive and negative electrical contacts 2901 and 2903, and each of the three regions on the other side of the submount may be fixed to respective different intermediate voltages between voltages of positive and negative electrical contacts 2901 and 2903.

FIG. 30B illustrates the submount of FIGS. 29A-29E and 30A populated with 6 strings of 12 serially connected LEDs 2931 according to embodiments described herein. Seventy two LEDs may thus be provided within a substantially circular area having a diameter of less than about 6 mm, and more particularly, less than about 5 mm, and still more particularly, less than about 4.5 mm. The 6 strings of LEDs may be electrically coupled in parallel between positive and negative contacts 2901 and 2903. Each of the lines CP-1 to CP-6 represents a current path from positive electrical contact 2901 through a respective string of twelve LEDs 2931 to negative electrical contact 2903. Moreover, each LED may have a forward voltage drop in the range of about 2.5 volts to about 3.5 volts. More particularly, each LED may have a forward voltage drop of about 3 volts so that each string of 12 LEDs has a voltage drop of about 36 volts to provide a lighting device having an operating voltage of about 36 volts. Moreover, a layout of the LEDs may be symmetrical above and below a horizontal line through the center of the array.

Figure 30C:
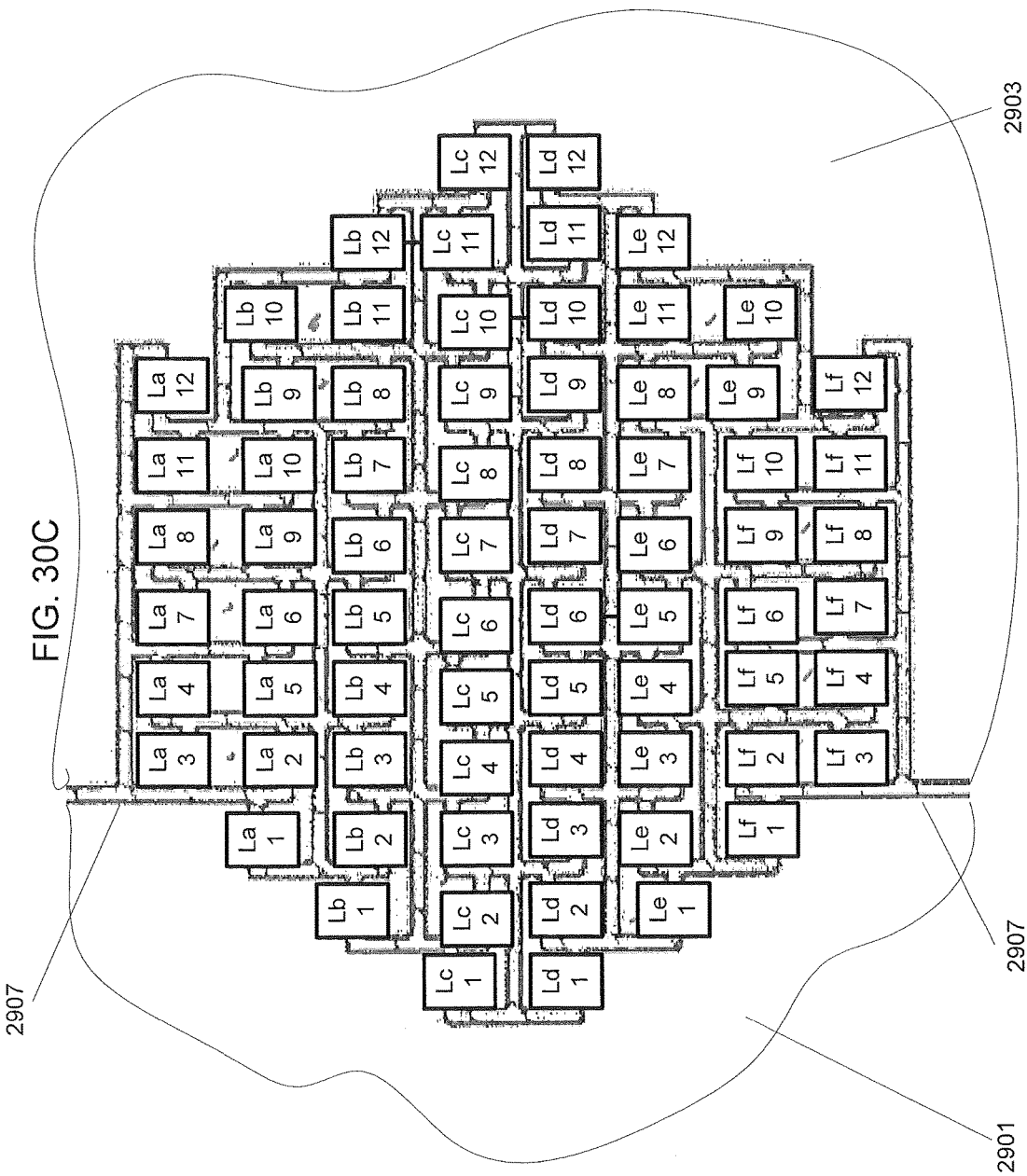
FIG. 30C is a greatly enlarged view of a central portion of the submount of FIG. 30A populated with LEDs according to embodiments described herein.

FIG. 30C is a greatly enlarged view of a central portion of the submount of FIGS. 29A-E and 30A-B populated with six strings of twelve serially coupled LEDs as discussed above. The first string includes LEDs La1 to La12 serially coupled between positive electrical contact 2901 and negative electrical contact 2903 in an order from La1 to La12, the sixth string includes LEDs Lf1 to Lf12 serially coupled between positive electrical contact 2901 and negative electrical contact 2903 in an order from Lf1 to Lf12, and the first and sixth strings may be symmetrical about a horizontal line through the center of the array. The second string includes LEDs Lb1 to Lb12 serially coupled between positive electrical contact 2901 and negative electrical contact 2903 in an order from Lb1 to Lb12, the fifth string includes LEDs Le1 to Le12 serially coupled between positive electrical contact 2901 and negative electrical contact 2903 in an order from Le1 to Le12, and the second and fifth strings may be symmetrical about the horizontal line through the center of the array. The third string includes LEDs Lc1 to Lc12 serially coupled between positive electrical contact 2901 and negative electrical contact 2903 in an order from Lc1 to Lc12, the fourth string includes LEDs Ld1 to Ld12 serially coupled between positive electrical contact 2901 and negative electrical contact 2903 in an order from Ld1 to Ld12, and the third and fourth strings may be symmetrical about the horizontal line through the center of the array.

In addition, a dam (illustrated by the dashed circle 2995 of FIG. 30A) may surround the array of LEDs as discussed above with respect to dam 195 of FIG. 20, and the dam 2995 may be used to confine a phosphor layer that may be dispensed as a liquid therein and then solidified. The phosphor layer may thus define a continuous optical coating on the plurality of LEDs and on the submount so that the LEDs are between the optical coating and the submount. More particularly, the phosphor layer may include a layer of a transparent and/or translucent material including a phosphor material (e.g., a yellow phosphor that converts blue light to yellow light) therein. Blue emitting LEDs may thus be assembled on the submount with a yellow phosphor layer provided thereon so that a blue shifted yellow light output is generated. According to some other embodiments, the phosphor layer may include first and second different phosphor materials configured to emit different wavelengths of light responsive to light generated by the assembled LEDs.

According to still other embodiments, the phosphor layer may include first, second, and third different phosphor materials configured to emit respective first, second, and third different wavelengths of light responsive to light generated by the assembled LEDs. For example, the assembled LEDs may generate blue light, and the phosphor layer may include a binder, a first phosphor (e.g., an aluminum garnet-based phosphor) that is configured to down-convert blue light to radiation having a peak wavelength in the green color range that has a full width half maximum bandwidth that extends into the cyan color range, a second phosphor (e.g., an aluminum garnet-based phosphor) that is configured to down-convert blue light to radiation having a peak wavelength in the yellow color range, and a third phosphor (e.g., a nitride-based and/or oxynitride-based phosphor) that is configured to down-convert blue light to radiation having a peak wavelength in the red color range. Three phosphor systems are discussed, for example, in U.S. Patent Publication No. 2011/0220929, to Collins et al., entitled Warm White LEDs Having High Color Rendering Index Values And Related Luminophoric Mediums, assigned to the assignee of the present application, the entire disclosure of which is hereby incorporated by reference as if set forth fully herein (hereinafter referred to as "the '929 Publication").

In addition, a thickness of the continuous optical coating may be greater than a thickness of each of the LEDs relative to the top surface of the submount, and a surface of the continuous optical coating opposite the submount may be substantially planar over the area including the LEDs. While a planar phosphor layer may be used as discussed above, other optical elements may be used on LEDs for the submounts of FIGS. 29A-E and 30A-C such as a conformal phosphor layer(s) as discussed above with respect to FIG. 18 and/or a convex lens element(s) as discussed above with respect to FIG. 19.

Moreover, an optic area may be defined by an area of the submount covered by the continuous optical coating (e.g., an area of the submount within dam 2995, and/or an area of the submount covered by a convex lens element), and the LEDs on the submount (e.g., LEDs La1-La12, Lb1-Lb12, Lc1-Lc12, Ld1-Ld12, Le1-Le12, and Lf1-Lf12) may be configured to generate at least 20 lumens per square millimeter of the optic area while delivering at least 100 lumens per watt of power consumed by the plurality of light emitting diodes between the continuous optical coating and the submount while delivering at least 600 absolute lumens from the plurality of light emitting diodes between the continuous optical element (e.g., phosphor layer) and the submount. More particularly, the LEDs on the submount may be configured to generate at least 25 lumens per square millimeter of the optic area while delivering at least 100 lumens per watt of power consumed. According to some embodiments, the optic area may be in the range of about 20 square millimeters to about 200 square millimeters.

Each LED of FIGS. 30B and 30C (e.g., LEDs La1-La12, Lb1-Lb12, Lc1-Lc12, Ld1-Ld12, Le1-Le12, and Lf1-Lf12) may have a structure as discussed above, for example, with respect to FIGS. 1 and 2. Each LED, for example, may include a diode region having first and second opposing faces including therein an n-type layer and a p-type layer, an anode contact that ohmically contacts the p-type layer and extends on the first face, and a cathode contact that ohmically contacts the n-type layer and extends on the first face. In addition, a support substrate may be provided on the second face of the diode region, with the diode region being between the support substrate and the anode and cathode contacts, and with the support substrate having a thickness of at least about 50 micrometers. The support substrate, for example, may be a portion of an epitaxial growth substrate remaining after dicing the LED from a processing wafer so that the support substrate and the diode region have aligned crystal structures. According to some other embodiments, the support substrate may be bonded to the diode region after removing the diode region from a growth substrate. Once the LED is assembled on the submount as shown in FIGS. 30B and 30C, the diode region may thus be between the support substrate and the packaging substrate.

Each LED (e.g., each of LEDs La1-La12, Lb1-Lb12, Lc1-Lc12, Ld1-Ld12, Le1-Le12, and Lf1-Lf12) may be mechanically and electrically coupled to respective interconnection islands 2905, positive electrical contact 2901, and/or negative electrical contact 2903 using first and second metallic (e.g., solder) bonds located physically between the LED and the submount as discussed above, for example, with respect to FIGS. 1 and/or 2. More particularly, each LED may include an anode contact electrically and mechanically coupled to one of interconnection islands 2905, positive electrical contact 2901, and/or negative electrical contact 2903 using a first metallic bond physically located between the anode contact and the submount. Similarly, each LED may include a cathode contact electrically and mechanically coupled to another of interconnection islands 2905, positive electrical contact 2901, and/or negative electrical contact 2903 using a second metallic bond physically located between the cathode contact and the submount. Accordingly, LEDs may be assembled on the submount of FIGS. 29A-E and 30A-C without wirebonding. Adjacent LEDs of the array illustrated in FIGS. 30B and 30C may thus be spaced apart by a distance in the range of about 20 micrometers to about 500 micrometers.

At 6 watts and 85 degrees C., the LED assembly of FIG. 30B may provide a flux output (at a color temperature of about 3,000K) in the range of about 625 lumens to about 675 lumens, thereby providing an efficacy in the range of 100 lumens/watt to about 110 lumens/watt. At 15 watts and 85 degrees C., the LED assembly of FIG. 30B may provide a flux output (at a color temperature of about 3,000K) in the range of about 1250 lumens to about 1350 lumens, thereby providing an efficacy in the range of 83 lumens/watt to about 90 lumens/watt. At 25 degrees C., the assembly may provide greater than 125 lumens per watt (at a color temperature of 3000K). The LED assembly may be available over a full range of color temperatures from 2700K to 5000K (e.g., 2700K, 3000K, 3500K, 4000K, or 5000K) and with options for minimum CRIs of 80, 85, or 90. A viewing angle of 120 degrees may be provided with submount dimensions of 9 mm by 9 mm, and with an optical source (e.g., lens) having a diameter of 8 mm. Moreover, easywhite 4 and 2 step binning may be available, and lifetimes greater than 50,000 hours may be available.

Figure 31A:
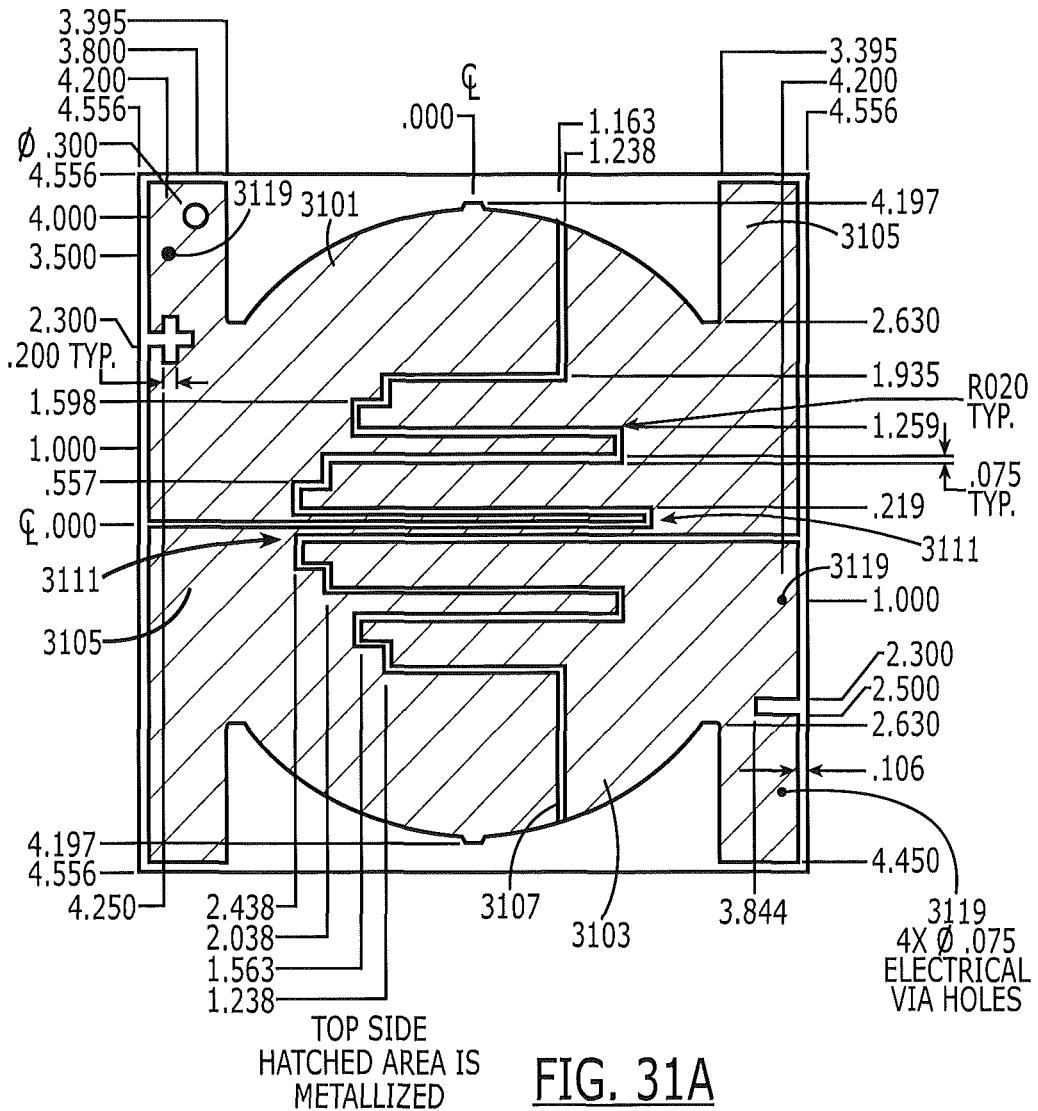

FIGS. 31A, 31B, and 31C, are respective top side, edge, and bottom side views of an LED (light emitting diode) packaging submount (with dimensions shown in mm) according to additional embodiments of the present invention. FIG. 31D is a enlarged cross sectional view of the submount of FIGS. 31A, 31B, and 31C illustrating dimensions of top side and bottom side metallizations, and FIG. 31E is a table providing a legend of materials and dimensions. A patterned metallization (e.g., including electroless copper on titanium and/or gold) on the top side of the submount may provide a positive electrical contact 3101, a negative electrical contact 3103, and an interconnection structure 3105. Moreover, electrically insulating gap(s) 3107 may separate the positive electrical contact 2901, the negative electrical contact 2903, and the interconnection structure 3105. By providing an optically reflective surface of the metallization and by providing a reflective material (e.g., white solder mask) in the electrically insulating gap(s) 3107, a light output of the assembled device may be improved.

Moreover, electrically conductive via holes 3119 may provide electrical coupling between positive and negative electrical contacts 3101 and 3103 on the submount top side and respective positive and negative electrical contacts 3121 and 3123 on the submount bottom side. Backside electrical contacts 3121 and 3123 may thus be soldered to a next level packaging substrate (e.g., a printed circuit board or PCB) to provide electrical and mechanical coupling between the submount and the next level packaging substrate without requiring wirebonds. In addition, thermally conductive pad 3125 may be provided on the backside of the submount between backside electrical contacts 3121 and 3123, and thermally conductive pad 3125 may be soldered to the next level packaging substrate to increase thermal coupling between the submount and the next level packaging substrate. Use of thermally conductive pad 3125 on a thermally conductive but electrically insulating submount substrate (e.g., an aluminum nitride substrate) may thus increase conduction of heat away from light emitting diodes on the front side of the submount. More particularly, backside electrical contacts 3121 and 3123 and thermally conductive pad 3125 may be patterned from a same layer of a same electrically and thermally conductive material(s) (e.g., one or more layers of metals and/or metal alloys) so that electrically conductive gaps 3127 are provided therebetween. More particularly, back side electrical contacts 3121 and 3123 and thermally conductive pad 3125 may be patterned from a metallization including electroless copper on titanium and/or gold. Thermally conductive pad 3125 may thus be electrically isolated from electrical contact 3121, electrical contact 3123, positive electrical contact 3101, negative electrical contact 3103, and/or interconnection islands.

Figure 32A:
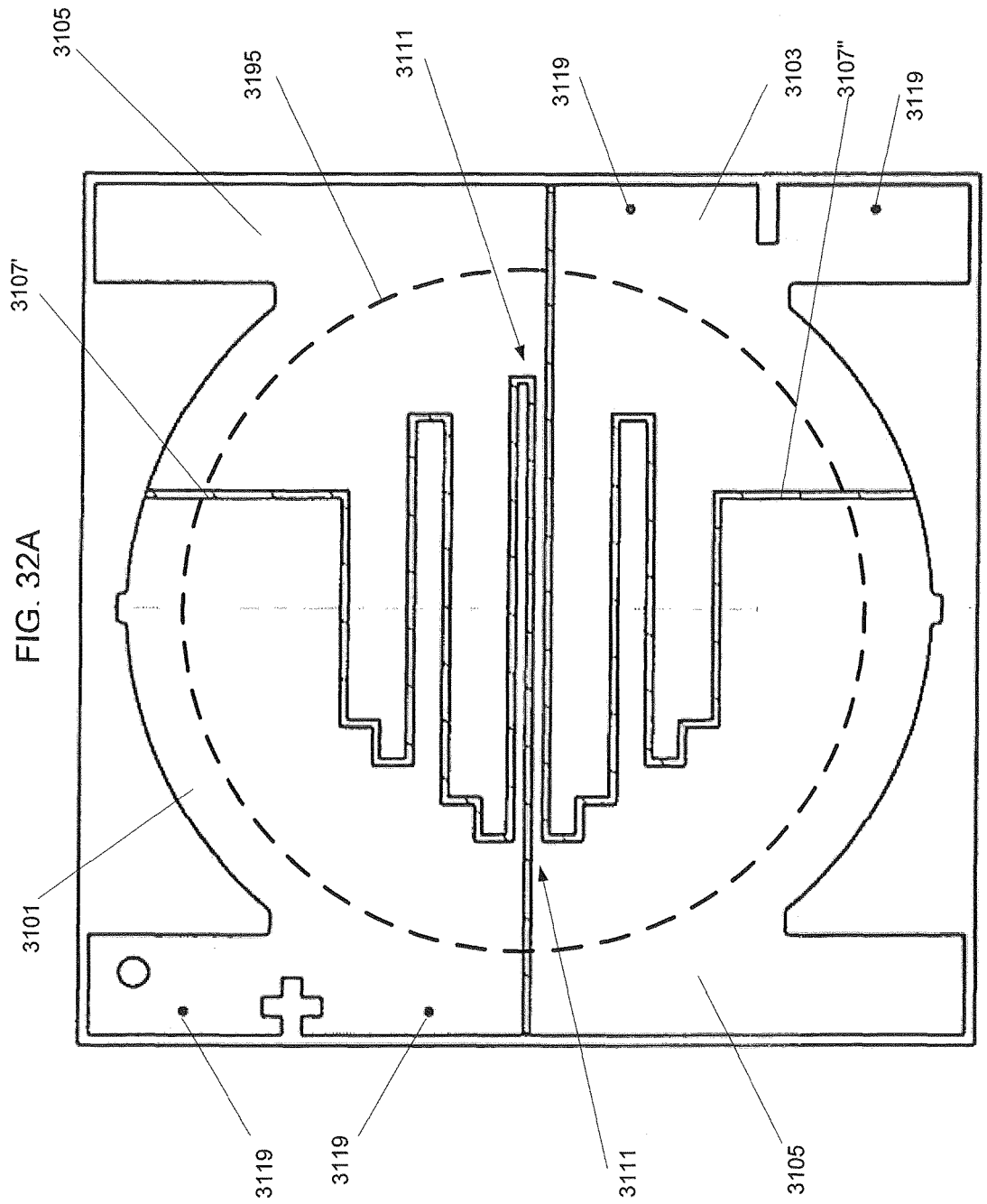
FIG. 32A is an enlarged top view of the submount of FIGS. 31A-31E according to embodiments described herein.
Figure 32B:
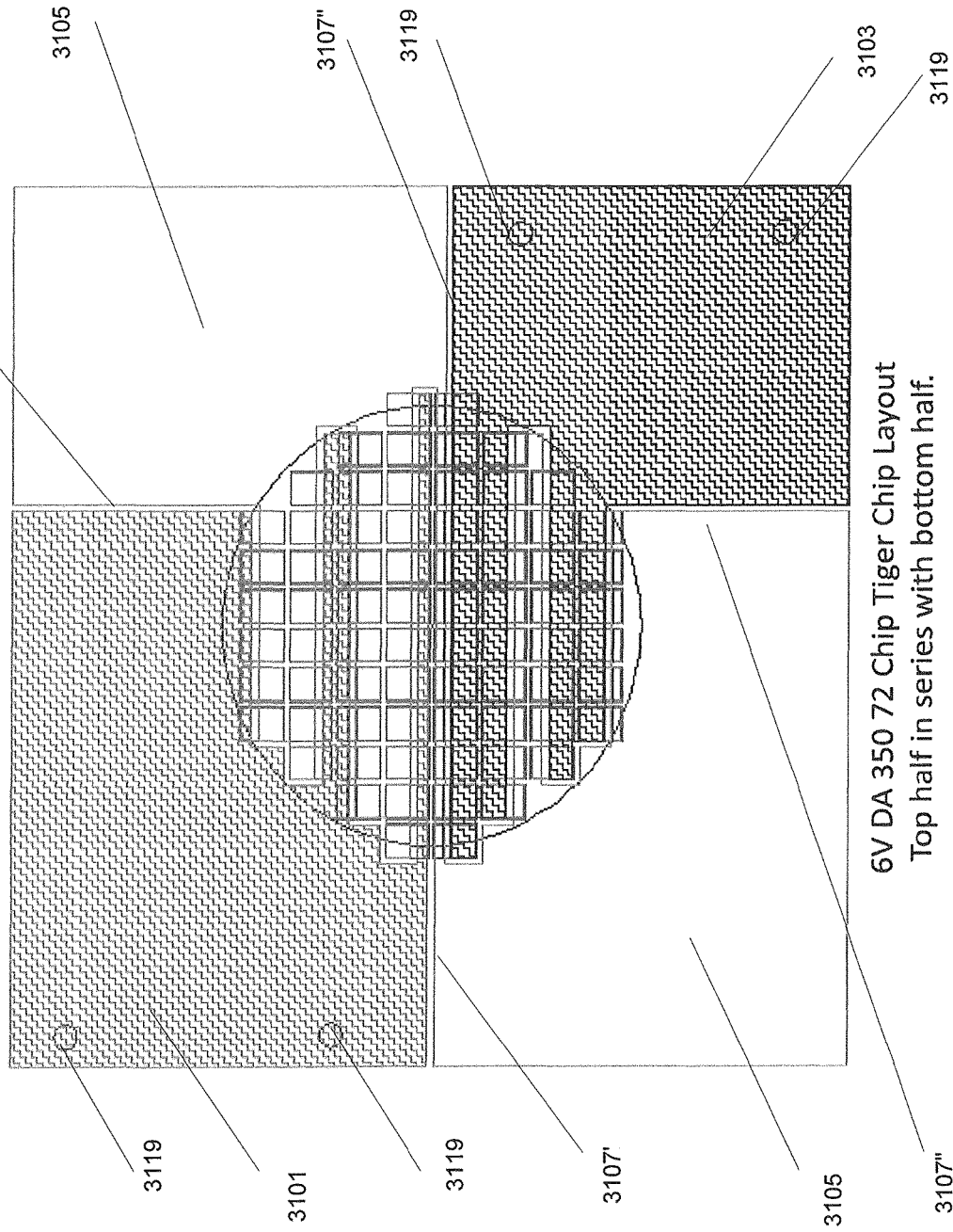
FIG. 32B illustrates the submount of FIGS. 31A-31E populated 72 LEDs according to embodiments described herein.
Figure 32C:
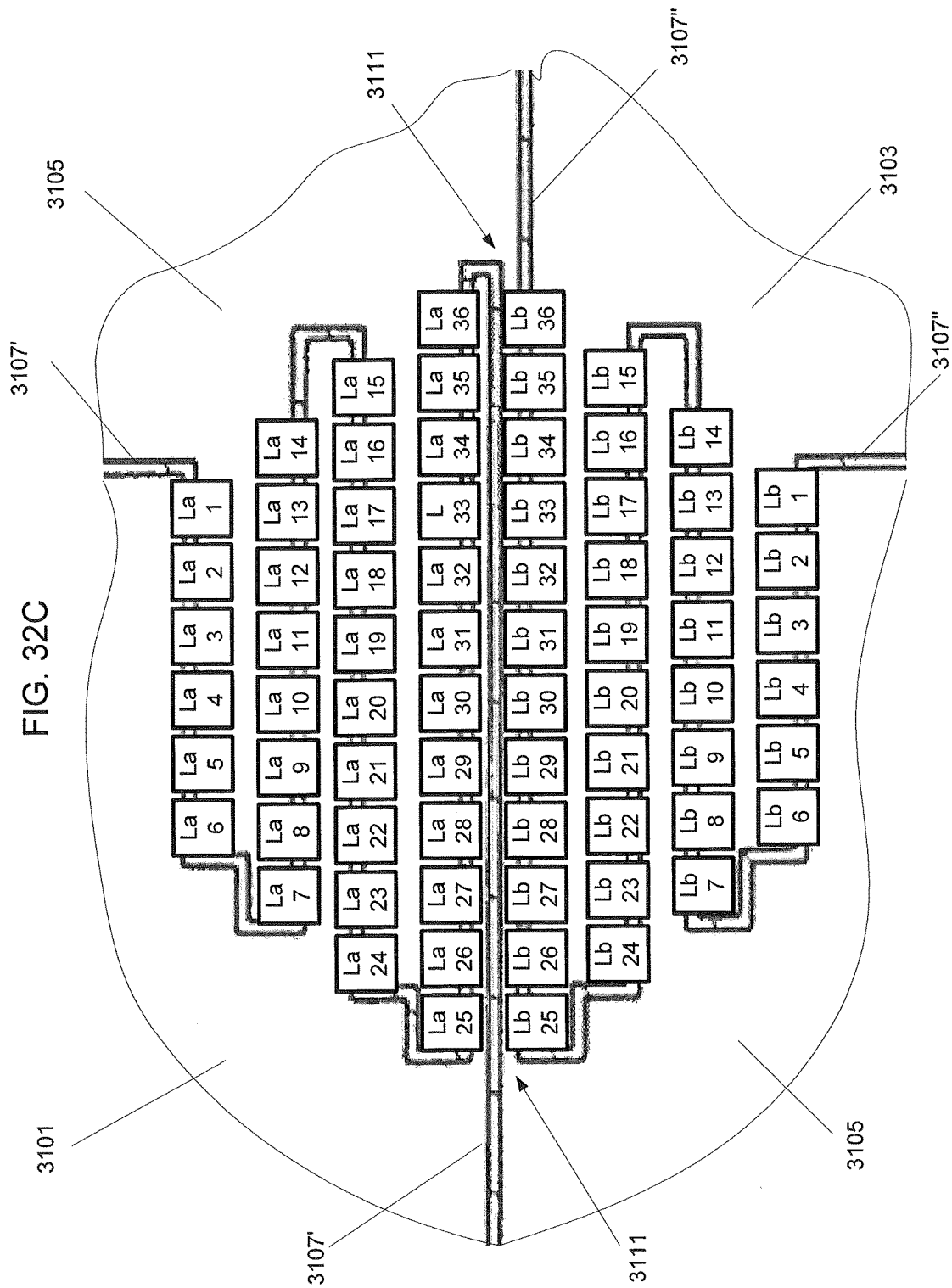
FIG. 32C is a greatly enlarged view of a central portion of the submount of FIG. 32A populated with 72 LEDs according to embodiments described herein.

FIG. 32A is an enlarged view of the top side of the submount of FIG. 31A, and FIG. 32B is an enlarged view of the top side of the submount of FIG. 31A populated with 36 LEDs electrically coupled in parallel between positive electrical contact 3101 and interconnection structure 3105 (in the upper half of the figure) and with 36 LEDs electrically coupled in parallel between interconnection structure 3105 and negative electrical contact 3103. FIG. 32C is a greatly enlarged view of a central portion of the submount of FIGS. 31A-E and 32A-B including the LEDs (e.g., LEDs LA1 to La36 and Lb1 to Lb36). The two groups of parallel LEDs (e.g., LEDs LA1 to La36 electrically coupled in parallel between positive electrical contact 3101 and interconnection structure 3105 and LEDs Lb1 to Lb36 electrically coupled in parallel between interconnection structure 3105 and negative electrical contact 3103) are electrically coupled in series between positive and negative electrical contacts 3101 and 3103 because the two portions of the interconnection structure 3105 are electrically coupled through the center of the submount and through the center of the LED array as indicated by reference numbers 3111 of FIGS. 32A and 32C. Seventy two LEDs may thus be provided within a substantially circular area having a diameter of less than about 6 mm, and more particularly, less than about 5 mm, and still more particularly, less than about 4.5 mm. Moreover, each LED may have a forward voltage drop of about 3 volts so that each group of parallel LEDs may has a voltage drop of about 3 volts and so that the lighting device may have an operating voltage of about 6 volts. Moreover, a layout of the LEDs may be symmetrical above and below a horizontal line through the center of the array.

As shown more clearly in FIGS. 32A and 32C, the gaps 3107 of FIG. 31A may include two gaps 3107' and 3107". Gap 3107' may separate positive electrical contact 3101 from interconnection structure 3105, gap 3107" may separate interconnection structure 3015 from negative electrical contact 3103, and upper and lower portions of interconnection structure 3105 may be electrically connected between gaps 3107' and 3107" as indicated by reference numeral 3111. To increase light output, positive electrical contact 3101, negative electrical contact 3103, and interconnection structure 3105 may be patterned from a same layer(s) of a reflective metal(s) and/or metal alloy(s) (e.g., a metallization including electroless copper on titanium and/or gold), and insulating gaps 3107' and 3107" may be electrically insulating and reflective.

In the structure of FIGS. 31A-E and 32A-C, a first group of thirty six LEDs La1-La36 may be electrically coupled in parallel, and a second group of thirty six LEDs Lb1-Lb36 may be electrically coupled in parallel, and each LED may have a forward voltage drop in the range of about 2.5 volts to about 3.5 volts. With forward voltage drops of about 3 volts for each of the LEDs, for example, the device of FIGS. 31A-E and 32A-C may operate with a potential of six volts applied across positive and negative electrical contacts 3101 and 3103. Moreover, the parallel arrangement of LEDs provides redundancy so that operation of the device may be maintained even if one or more of the LEDs fails. Stated in other words, interconnection structure 3105 may act as a common node between the two groups of LEDs so that failure of any one of the LEDs will not block current through any of the other LEDs. In addition, the seventy two LEDs in the structure of FIGS. 31A-E and 32A-C may be provided within a substantially circular area having a diameter of less than about 6 mm, and more particularly, less than about 5 mm, and still more particularly, less than about 4.5 mm.

In addition, a dam (illustrated by the dashed circle 3195 of FIG. 32A) may surround the array of LEDs as discussed above with respect to dam 195 of FIG. 20, and the dam 3195 may be used to confine a phosphor layer that may be dispensed as a liquid therein and then solidified. The phosphor layer may thus define a continuous optical coating on the plurality of LEDs and on the submount so that the LEDs are between the optical coating and the submount. More particularly, the phosphor layer may include a layer of a transparent and/or translucent material including a phosphor material (e.g., a yellow phosphor that converts blue light to yellow light) therein. Blue emitting LEDs may thus be assembled on the submount with a yellow phosphor layer provided thereon so that a blue shifted yellow light output is generated. According to some other embodiments, the phosphor layer may include first and second different phosphor materials configured to emit different wavelengths of light responsive to light generated by the assembled LEDs.

According to still other embodiments, the phosphor layer may include first, second, and third different phosphor materials configured to emit respective first, second, and third different wavelengths of light responsive to light generated by the assembled LEDs. For example, the assembled LEDs may generate blue light, and the phosphor layer may include a binder, a first phosphor (e.g., an aluminum garnet-based phosphor) that is configured to down-convert blue light to radiation having a peak wavelength in the green color range that has a full width half maximum bandwidth that extends into the cyan color range, a second phosphor (e.g., an aluminum garnet-based phosphor) that is configured to down-convert blue light to radiation having a peak wavelength in the yellow color range, and a third phosphor (e.g., a nitride-based and/or oxynitride-based phosphor) that is configured to down-convert blue light to radiation having a peak wavelength in the red color range. Three phosphor systems are discussed, for example, in U.S. Patent Publication No. 2011/0220929, to Collins et al., entitled Warm White LEDs Having High Color Rendering Index Values And Related Luminophoric Mediums, assigned to the assignee of the present application, the entire disclosure of which is hereby incorporated by reference as if set forth fully herein (hereinafter referred to as "the '929 Publication").

In addition, a thickness of the continuous optical coating may be greater than a thickness of each of the LEDs relative to the top surface of the submount, and a surface of the continuous optical coating opposite the submount may be substantially planar over the area including the LEDs. While a planar phosphor layer may be used as discussed above, other optical elements may be used on LEDs for the submounts of FIGS. 31A-E and 32A-C such as a conformal phosphor layer(s) as discussed above with respect to FIG. 18 and/or a convex lens element(s) as discussed above with respect to FIG. 19.

Moreover, an optic area may be defined by an area of the submount covered by the continuous optical coating (e.g., an area of the submount within dam 3195, and/or an area of the submount covered by a convex lens element), and the LEDs on the submount (e.g., LEDs La1-La36 and Lb1-Lb36) may be configured to generate at least 20 lumens per square millimeter of the optic area while delivering at least 100 lumens per watt of power consumed by the plurality of light emitting diodes between the continuous optical coating and the submount while delivering at least 600 absolute lumens from the plurality of light emitting diodes between the continuous optical element (e.g., phosphor layer) and the submount. More particularly, the LEDs on the submount may be configured to generate at least 25 lumens per square millimeter of the optic area while delivering at least 100 lumens per watt of power consumed. According to some embodiments, the optic area may be in the range of about 20 square millimeters to about 200 square millimeters.

Each LED of FIGS. 32B and 32C (e.g., LEDs La1-La36 and Lb1-Lb36) may have a structure as discussed above, for example, with respect to FIGS. 1 and 2. Each LED, for example, may include a diode region having first and second opposing faces including therein an n-type layer and a p-type layer, an anode contact that ohmically contacts the p-type layer and extends on the first face, and a cathode contact that ohmically contacts the n-type layer and extends on the first face. In addition, a support substrate may be provided on the second face of the diode region, with the diode region being between the support substrate and the anode and cathode contacts, and with the support substrate having a thickness of at least about 50 micrometers. The support substrate, for example, may be a portion of an epitaxial growth substrate remaining after dicing the LED from a processing wafer so that the support substrate and the diode region have aligned crystal structures. According to some other embodiments, the support substrate may be bonded to the diode region after removing the diode region from a growth substrate. Once the LED is assembled on the submount as shown in FIGS. 32B and 32C, the diode region may thus be between the support substrate and the packaging substrate.

Each LED (e.g., each of LEDs La1-La36 and Lb1-Lb36) may be mechanically and electrically coupled between positive electrical contact 3101 and interconnection structure 3105 or between interconnection structure 3105 and negative electrical contact 3103 using first and second metallic (e.g., solder) bonds located physically between the LED and the submount as discussed above, for example, with respect to FIGS. 1 and/or 2. More particularly, each LED may include an anode contact electrically and mechanically coupled to one of positive electrical contact 3101, interconnection structure 3105, or negative electrical contact 3103 using a first metallic bond physically located between the anode contact and the submount. Similarly, each LED may include a cathode contact electrically and mechanically coupled to another of positive electrical contact 3101, interconnection structure 3105, or negative electrical contact 3103 using a second metallic bond physically located between the cathode contact and the submount. Accordingly, LEDs may be assembled on the submount of FIGS. 31A-E and 32A-C without wirebonding. Adjacent LEDs of the array illustrated in FIGS. 32B and 32C may thus be spaced apart by a distance in the range of about 20 micrometers to about 500 micrometers.

At 6 watts and 85 degrees C., the LED assembly of FIG. 32B may provide a flux output (at a color temperature of about 3,000K) in the range of about 625 lumens to about 675 lumens, thereby providing an efficacy in the range of 100 lumens/watt to about 110 lumens/watt. At 15 watts and 85 degrees C., the LED assembly of FIG. 32B may provide a flux output (at a color temperature of about 3,000K) in the range of about 1250 lumens to about 1350 lumens, thereby providing an efficacy in the range of 83 lumens/watt to about 90 lumens/watt. At 25 degrees C., the assembly may provide greater than 125 lumens per watt (at a color temperature of 3000K). The LED assembly may be available over a full range of color temperatures from 2700K to 5000K (e.g., 2700K, 3000K, 3500K, 4000K, or 5000K) and with options for minimum CRIs of 80, 85, or 90. A viewing angle of 120 degrees may be provided with submount dimensions of 9 mm by 9 mm, and with an optical source (e.g., lens) having a diameter of 8 mm. Moreover, easywhite 4 and 2 step binning may be available, and lifetimes greater than 50,000 hours may be available.

Figure 33A:
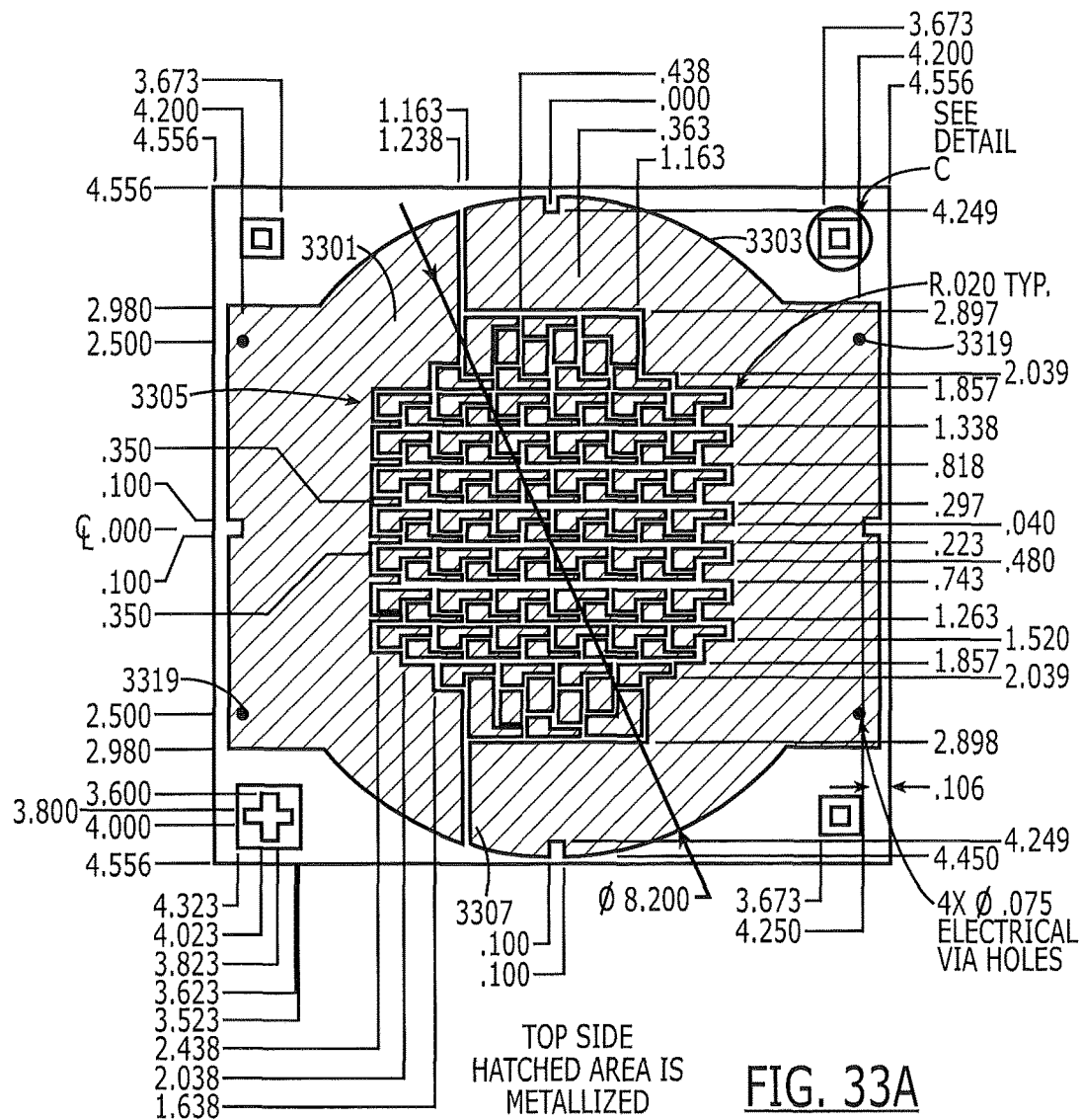

FIGS. 33A, 33B, and 33C, are respective top side, edge, and bottom side views of an LED (light emitting diode) packaging submount (with dimensions shown in mm) according to additional embodiments of the present invention. FIG. 33D is an enlarged cross sectional view of the submount of FIGS. 33A, 33B, and 33C illustrating dimensions of top side and bottom side metallizations, and FIG. 33E is a table providing a legend of materials and dimensions. A patterned metallization (e.g., including electroless copper on titanium and/or gold) on the top side of the submount may provide a positive electrical contact 3301, a negative electrical contact 3303, and interconnection islands 3305. Moreover, electrically insulating gap 3307 may separate the positive electrical contact 3301, the negative electrical contact 3303, and the interconnection islands 3305. By providing an optically reflective surface of the metallization and by providing a reflective material (e.g., white solder mask) in the electrically insulating gaps, a light output of the assembled device may be improved.

Moreover, electrically conductive via holes 3319 may provide electrical coupling between positive and negative electrical contacts 3301 and 3303 on the submount top side and respective electrical contacts 3321 and 3323 on the submount bottom side. Backside electrical contacts 3321 and 323 may thus be soldered to a larger packaging substrate (e.g., a printed circuit board or PCB) to provide electrical and mechanical coupling between the submount and next level packaging substrate without requiring wirebonds. In addition, thermally conductive pad 3325 may be provided on the backside of the submount between backside electrical contacts 3321 and 3323, and thermally conductive pad 3325 may be soldered to the larger packaging substrate to increase thermal coupling between the submount and next level packaging substrate. Use of thermally conductive pad 3325 on a thermally conductive but electrically insulating submount substrate (e.g., an aluminum nitride substrate) may thus increase conduction of heat away from light emitting diodes on the front side of the submount. More particularly, backside electrical contacts 3321 and 3323 and thermally conductive pad 3325 may be patterned from a same layer of a same electrically and thermally conductive material(s) (e.g., one or more layers of metals and/or metal alloys) so that electrically conductive gaps 3327 are provided therebetween. More particularly, back side electrical contacts 3321 and 3323 and thermally conductive pad 3325 may be patterned from a metallization including electroless copper on titanium and/or gold. Thermally conductive pad 3325 may thus be electrically isolated from electrical contact 3321, electrical contact 3323, positive electrical contact 3301, negative electrical contact 3303, and/or interconnection islands.

Figure 34A:
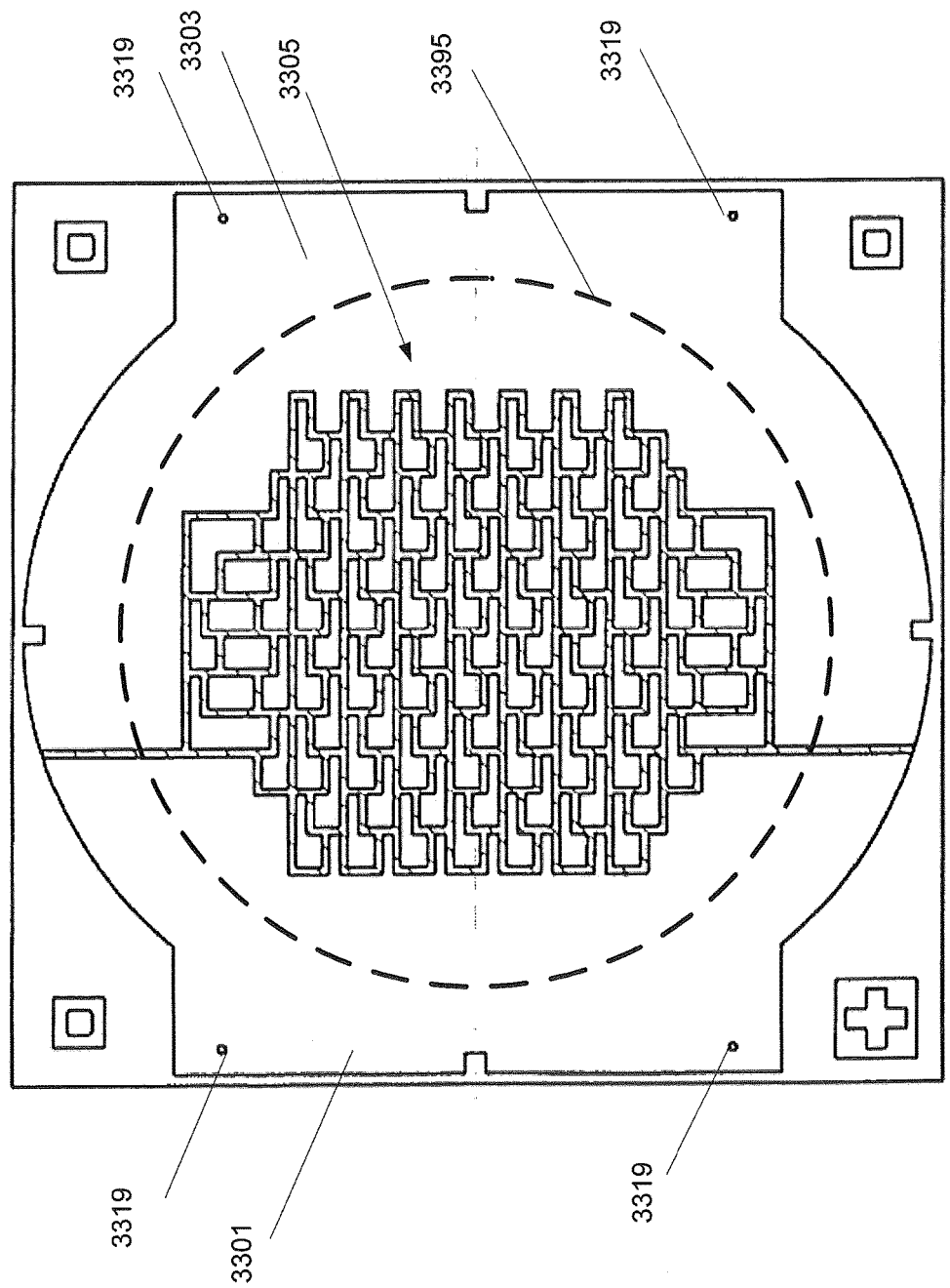
FIG. 34A is an enlarged top view of the submount of FIGS. 33A-33E according to embodiments described herein.
Figure 34B:
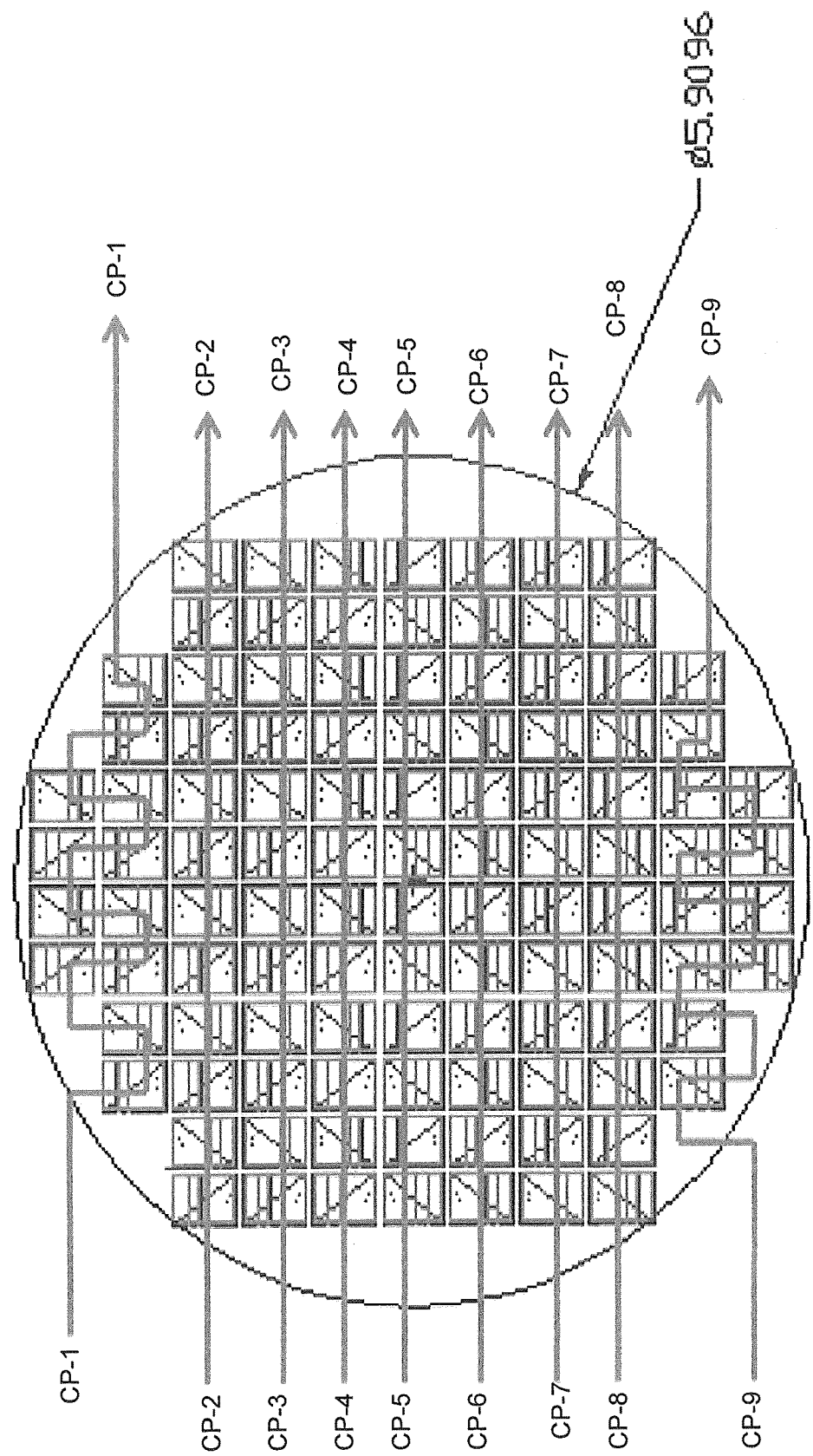
FIG. 34B illustrates the submount of FIGS. 33A-33E populated with 108 LEDs according to embodiments described herein.
Figure 34C:
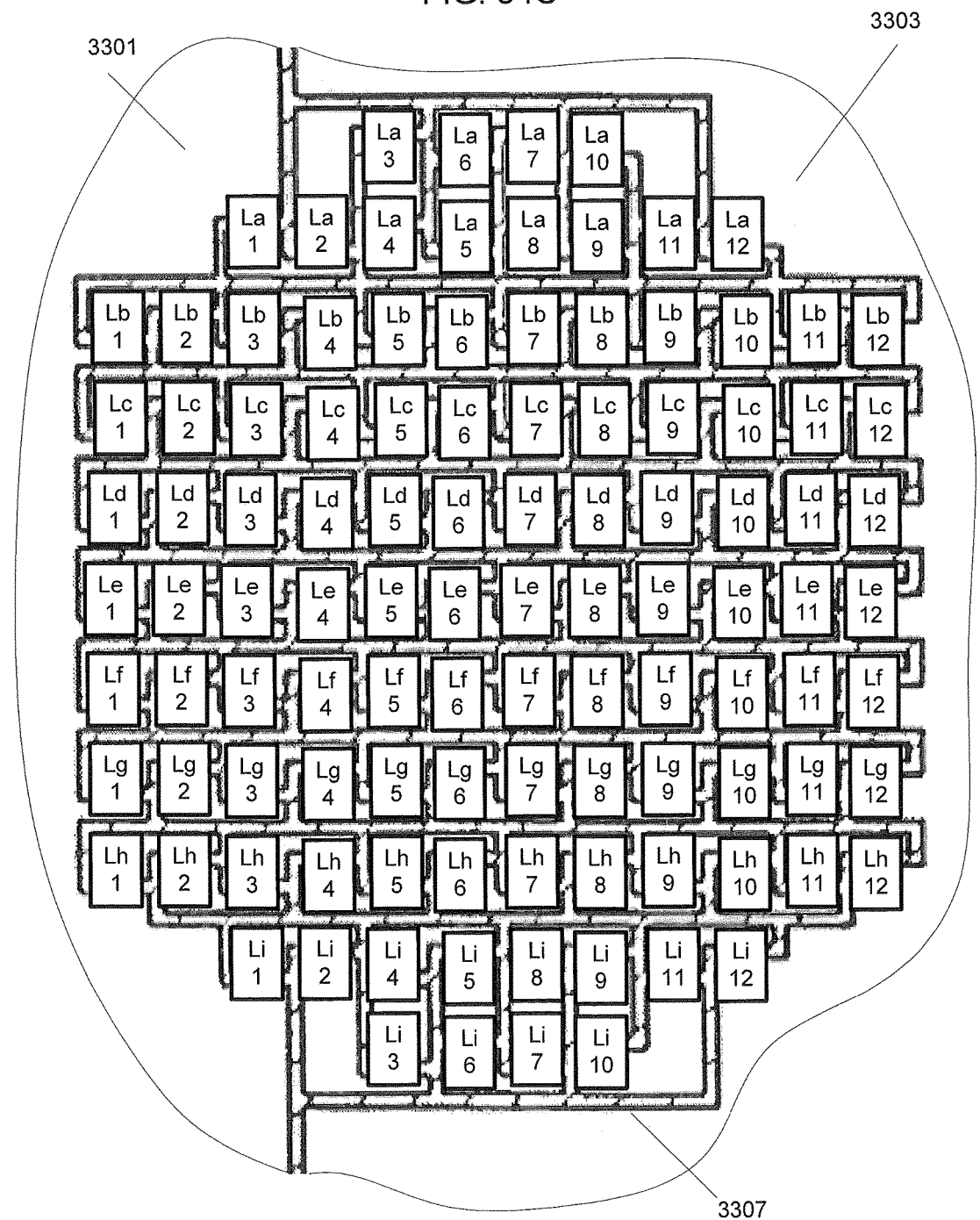
FIG. 34C is a greatly enlarged view of a central portion of the submount of FIG. 34A populated with 108 LEDs according to embodiments described herein.

FIG. 34A is an enlarged view of the top side of the submount of FIG. 33A, FIG. 34B illustrates the submount of FIGS. 33A-33E populated with 108 LEDs, and FIG. 34C is a greatly enlarged view of a central section of the submount illustrating the 108 LEDs. More particularly, the 108 LEDs may be arranged in strings of 12 serially coupled LEDs (e.g., LEDs La1-La12, LEDs Lb1-Lb12, LEDs Lc1-Lc12, LEDs Ld1-Ld12, LEDs Le1-Le12, LEDs Lf1-Lf12, LEDs Lg1-Lg12, LEDs Lh1-Lh12, and LEDs Li1-Li12) with the 9 serially coupled strings being arranged in parallel between positive and negative electrical contacts 3301 and 3303. Each LED may have a forward voltage drop in the range of about 2.5 volts to about 3.5 volts. With forward voltage drops of about 3 volts, for example, each string of 12 serially coupled LEDs may have a forward voltage drop of about 36 volts to provide a 36 volt operating voltage for the device of FIGS. 33A-E and 34A-C. One hundred eight LEDs may thus be provided within a substantially circular area having a diameter of less than about 9 mm, and more particularly, less than about 8 mm, and still more particularly, less than about 6.5 mm. Moreover, a layout of the LEDs may be symmetrical above and below a horizontal line through the center of the array. In embodiments of FIGS. 33A-E and 34A-C, a phosphor layer may be provided on the LEDs as discussed above with respect to FIG. 18 or FIG. 20 without providing a lens. While not shown in FIGS. 33A-E and 34A-C, one or more additional gaps may extend from interconnection islands 3305 to a perimeter of the metallization as discussed above with respect to FIGS. 29A-E and 30A-C to provide increased electrical separation between positive and negative electrical contacts 3301 and 3303 while maintaining a substantially circular reflective surface surrounding the LEDs that are assembled on the submount.

As shown in FIG. 34B, the 9 strings of LEDs may be electrically coupled in parallel between positive and negative contacts 3301 and 3303. Each of the lines CP-1 to CP-9 represents a current path from positive electrical contact 3301 through a respective string of twelve LEDs to negative electrical contact 3303. Moreover, each LED may have a forward voltage drop in the range of about 2.5 volts to about 3.5 volts. More particularly, each LED may have a forward voltage drop of about 3 volts so that each string of 12 LEDs has a voltage drop of about 36 volts to provide a lighting device having an operating voltage of about 36 volts. Moreover, a layout of the LEDs may be symmetrical above and below a horizontal line through the center of the array.

In addition, a dam (illustrated by the dashed circle 3395 of FIG. 34A) may surround the array of LEDs as discussed above with respect to dam 195 of FIG. 20, and the dam 3395 may be used to confine a phosphor layer that may be dispensed as a liquid therein and then solidified. The phosphor layer may thus define a continuous optical coating on the plurality of LEDs and on the submount so that the LEDs are between the optical coating and the submount. More particularly, the phosphor layer may include a layer of a transparent and/or translucent material including a phosphor material (e.g., a yellow phosphor that converts blue light to yellow light) therein. Blue emitting LEDs may thus be assembled on the submount with a yellow phosphor layer provided thereon so that a blue shifted yellow light output is generated. According to some other embodiments, the phosphor layer may include first and second different phosphor materials configured to emit different wavelengths of light responsive to light generated by the assembled LEDs.

According to still other embodiments, the phosphor layer may include first, second, and third different phosphor materials configured to emit respective first, second, and third different wavelengths of light responsive to light generated by the assembled LEDs. For example, the assembled LEDs may generate blue light, and the phosphor layer may include a binder, a first phosphor (e.g., an aluminum garnet-based phosphor) that is configured to down-convert blue light to radiation having a peak wavelength in the green color range that has a full width half maximum bandwidth that extends into the cyan color range, a second phosphor (e.g., an aluminum garnet-based phosphor) that is configured to down-convert blue light to radiation having a peak wavelength in the yellow color range, and a third phosphor (e.g., a nitride-based and/or oxynitride-based phosphor) that is configured to down-convert blue light to radiation having a peak wavelength in the red color range. Three phosphor systems are discussed, for example, in U.S. Patent Publication No. 2011/0220929, to Collins et al., entitled Warm White LEDs Having High Color Rendering Index Values And Related Luminophoric Mediums, assigned to the assignee of the present application, the entire disclosure of which is hereby incorporated by reference as if set forth fully herein (hereinafter referred to as "the '929 Publication").

In addition, a thickness of the continuous optical coating may be greater than a thickness of each of the LEDs relative to the top surface of the submount, and a surface of the continuous optical coating opposite the submount may be substantially planar over the area including the LEDs. While a planar phosphor layer may be used as discussed above, other optical elements may be used on LEDs for the submounts of FIGS. 33A-E and 34A-C such as a conformal phosphor layer(s) as discussed above with respect to FIG. 18 and/or a convex lens element(s) as discussed above with respect to FIG. 19.

Moreover, an optic area may be defined by an area of the submount covered by the continuous optical coating (e.g., an area of the submount within dam 3395, and/or an area of the submount covered by a convex lens element), and the LEDs on the submount (e.g., LEDs La1-La12, Lb1-Lb12, Lc1-Lc12, Ld1-Ld12, Le1-Le12, Lf1-Lf12, Lg1-Lg12, Lh1-Lh12, and Li1-Li12) may be configured to generate at least 20 lumens per square millimeter of the optic area while delivering at least 100 lumens per watt of power consumed by the plurality of light emitting diodes between the continuous optical coating and the submount while delivering at least 600 absolute lumens from the plurality of light emitting diodes between the continuous optical element (e.g., phosphor layer) the submount. More particularly, the LEDs on the submount may be configured to generate at least 25 lumens per square millimeter of the optical area while delivering at least 100 lumens per watt of power consumed. According to some embodiments, the optic area may be in the range of about 20 square millimeters to about 200 square millimeters.

Each LED of FIGS. 34B and 34C (e.g., LEDs La1-La12, Lb1-Lb12, Lc1-Lc12, Ld1-Ld12, Le1-Le12, Lf1-Lf12, Lg1-Lg12, Lh1-Lh12, and Li1-Li12) may have a structure as discussed above, for example, with respect to FIGS. 1 and 2. Each LED, for example, may include a diode region having first and second opposing faces including therein an n-type layer and a p-type layer, an anode contact that ohmically contacts the p-type layer and extends on the first face, and a cathode contact that ohmically contacts the n-type layer and extends on the first face. In addition, a support substrate may be provided on the second face of the diode region, with the diode region being between the support substrate and the anode and cathode contacts, and with the support substrate having a thickness of at least about 50 micrometers. The support substrate, for example, may be a portion of an epitaxial growth substrate remaining after dicing the LED from a processing wafer so that the support substrate and the diode region have aligned crystal structures. According to some other embodiments, the support substrate may be bonded to the diode region after removing the diode region from a growth substrate. Once the LED is assembled on the submount as shown in FIGS. 34B and 34C, the diode region may thus be between the support substrate and the packaging substrate.

Each LED (e.g., each of LEDs La1-La12, Lb1-Lb12, Lc1-Lc12, Ld1-Ld12, Le1-Le12, Lf1-Lf12, Lg1-Lg12, Lh1-Lh12, and Li1-Li12) may be mechanically and electrically coupled to respective interconnection islands 3305, positive electrical contact 3301, and/or negative electrical contact 3303 using first and second metallic (e.g., solder) bonds located physically between the LED and the submount as discussed above, for example, with respect to FIGS. 1 and/or 2. More particularly, each LED may include an anode contact electrically and mechanically coupled to one of interconnection islands 3305, positive electrical contact 3301, and/or negative electrical contact 3303 using a first metallic bond physically located between the anode contact and the submount. Similarly, each LED may include an cathode contact electrically and mechanically coupled to another of interconnection islands 3305, positive electrical contact 3301, and/or negative electrical contact 3303 using a second metallic bond physically located between the cathode contact and the submount. Accordingly, LEDs may be assembled on the submount of FIGS. 33A-E and 34A-C without wirebonding. Adjacent LEDs of the array illustrated in FIGS. 34B and 34C may thus be spaced apart by a distance in the range of about 20 micrometers to about 500 micrometers.

Figure 35:
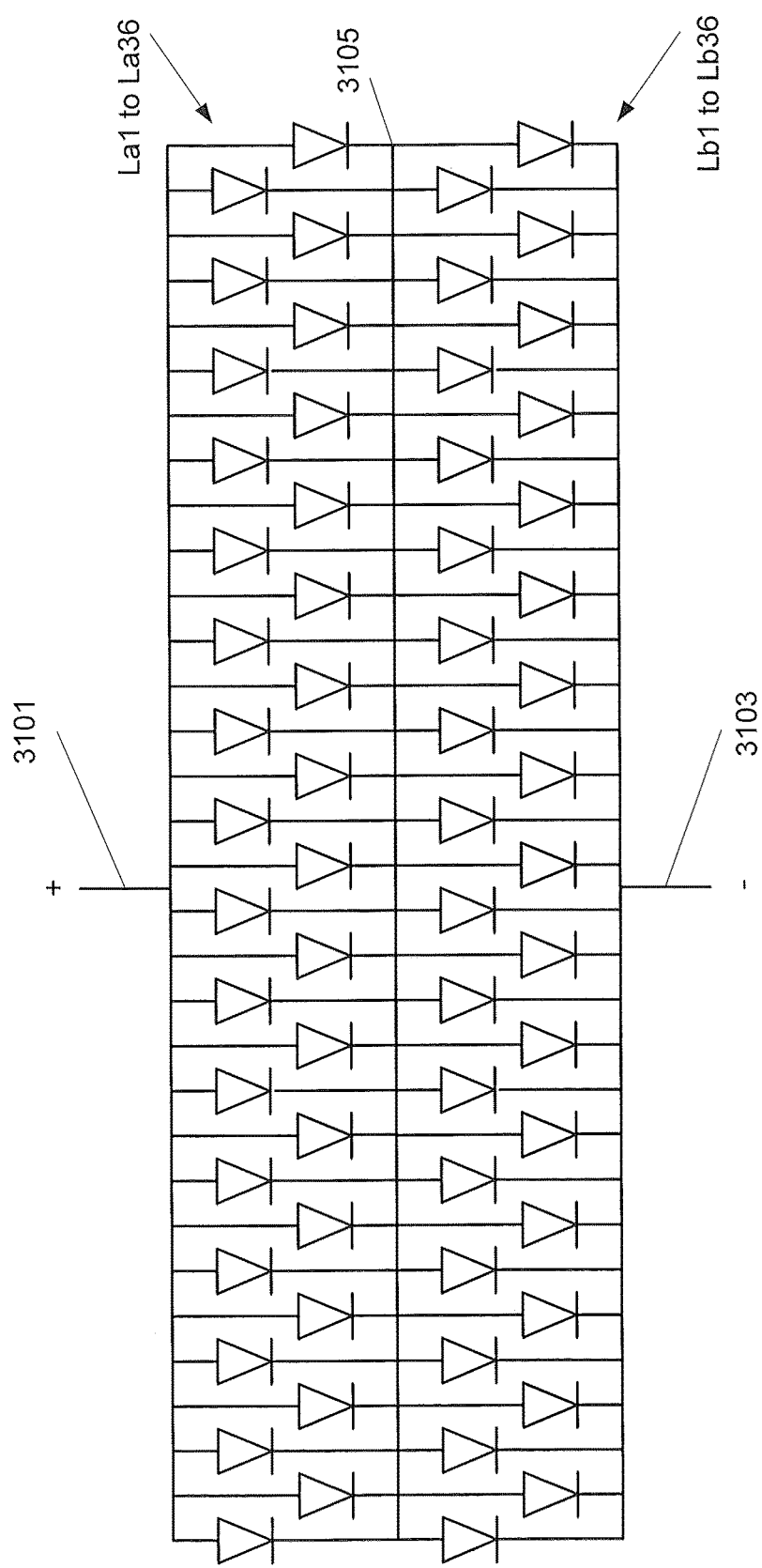
FIG. 35 is a schematic diagram illustrating electrical couplings of LEDs La1 to La36 and Lb1 to Lb36 of the device of FIGS. 31A-31D and 32A-32C according to embodiments described herein.

As discussed above with respect to FIGS. 31A-E and 32A-C, a first group of thirty six LEDs La1 to La36 may be electrically coupled in parallel between positive electrical contact 3101 and interconnection structure 3105, and a second group of thirty six LEDs Lb1 to Lb36 may be electrically coupled in parallel between interconnection structure 3105 and negative electrical contact 3103. More particularly, this electrical arrangement of LEDs is schematically illustrated in the diagram of FIG. 35. With each LED having a forward voltage drop of about three volts, for example, a voltage difference of about six volts may be applied to positive and negative electrical contacts 3101 and 3103 to drive the device, and a voltage of interconnection structure 3105 may be about 3 volts less than a voltage of positive electrical contact 3101 and about 3 volts higher than a voltage of negative electrical contact 3103. By providing interconnection structure 3105 as a common node as shown in FIG. 35, any one of the LEDs may fail without blocking current through any of the other LEDs. Stated in other words, the structure of FIGS. 31A-E and 32A-C may provide redundancy relative to a similar electrical structure without interconnection structure 3105. Similar interconnection structures may be applied to other devices including parallel LED structures to provide similar redundancies without significantly changing operation of the devices.

Figure 36B:
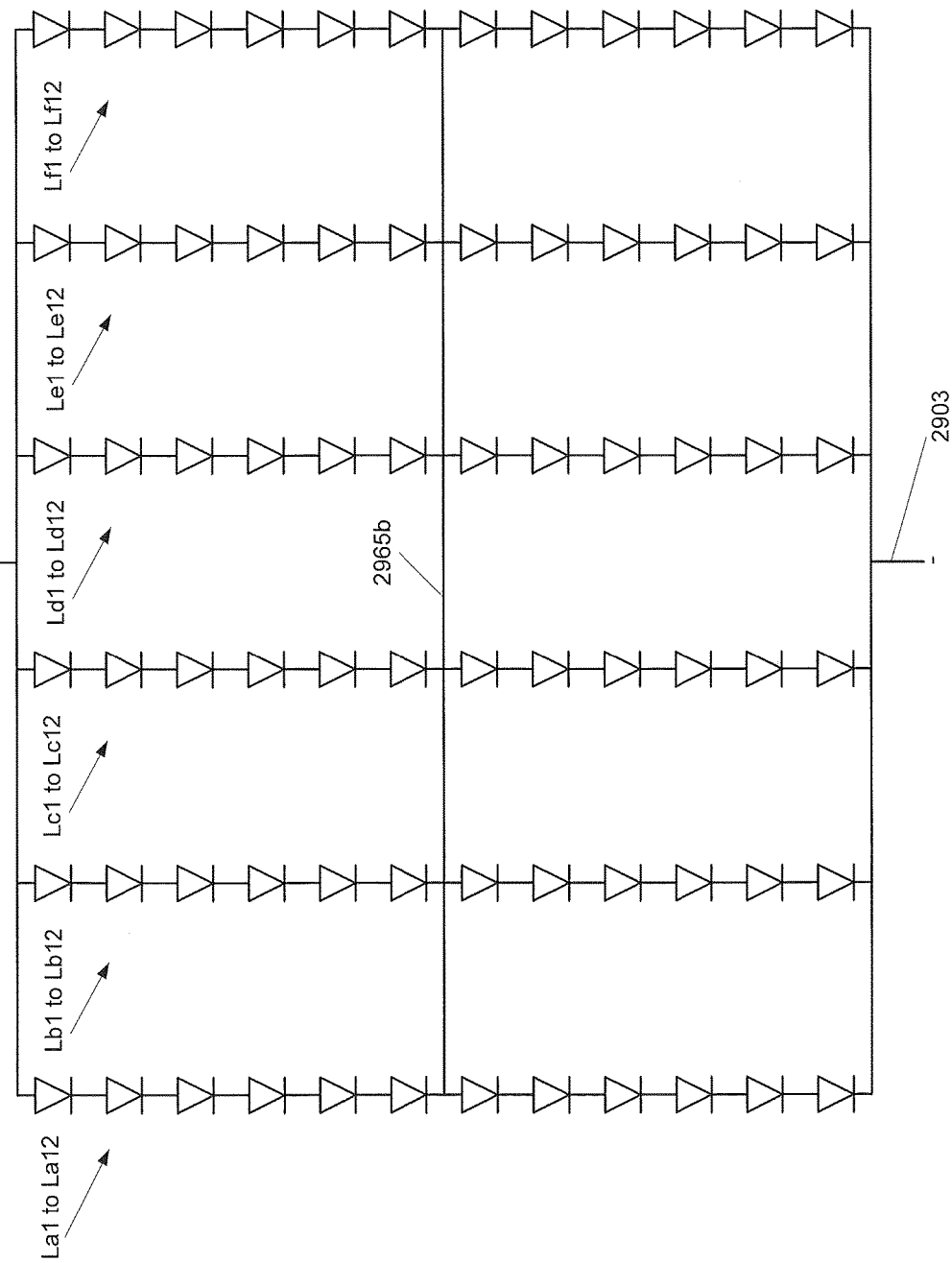

FIG. 36A, for example, is a schematic diagram illustrating electrical couplings of LEDs La1 to La12, Lb1 to Lb12, Lc1 to Lc12, Ld1 to Ld12, Le1 to Le12, and Lf1 to Lf12 of FIGS. 29A-29E and 30A-30C. In the structure of FIGS. 29A-29E, 30A-30C, and 36A, failure of one LED in a string of serially coupled LEDs may result in a loss of the entire string of 12 LEDs, potentially reducing light output by one sixth. As shown in FIGS. 36B, 36C, and 36D, the submount structure of FIGS. 29A-29E, 30A-30C, and 36A may be modified to include interconnection structures to provide redundancy as discussed above with respect to FIGS. 31A-E, 32A-C, and 35.

As shown in FIG. 36B, for example, a single interconnection structure 2965 may be provided to interconnect central nodes of each of the LED strings. Accordingly, failure of any one LED may only result in loss of a string of six LEDs. As shown in FIG. 36C, five interconnection structures 2965c may be provided so that an interconnection structure is provided for every two LEDs of the strings of LEDs. Accordingly, failure of any one LED may result in loss of only one other LED. As shown in FIG. 36D, eleven interconnection structures 2965d may be provided so that an interconnection structure is provided for each LED of the strings of LEDs. Accordingly, failure of any one LED will not block operation of any other LEDs.

The interconnection structures 2965b, 2965c, and 2965d of FIGS. 36B, 36C, and 36D may be provided by electrically coupling respective ones of interconnection islands 2905 of FIGS. 29A, 30A, and 30C. By way of example, interconnection islands, interconnection structures, and positive and negative electrical contacts may be patterned from a same metallization layer. According to other embodiments, an interconnection structure(s) may be provided using another metallization layer(s) on another plane(s) of the submount with electrically conductive vias providing electrical coupling between the interconnection structure(s) and respective interconnection islands. Interconnection structure 2965b of FIG. 36B, for example, may provide electrical coupling between the interconnections islands electrically coupled between LEDs La6 and La1, between LEDs Lb6 and Lb7, between LEDs Lc6 and Lc7, between LEDs Ld6 and Ld7, between LEDs Le6 and Le7, and between LEDs Lf6 and Lf7.

Interconnection structures 3105, 2965b, 2965c, and 2965d of FIGS. 35, 36B, 36C, and 36D may thus provide serial/parallel couplings in structures of closely packaged LEDs mounted on submounts without wirebonds. Similar interconnection structures may also be applied to submount structures of FIGS. 33A-33E and 34A-34C.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. An electronic device comprising:
   a packaging substrate having a packaging face, the packaging substrate including positive and negative electrically conductive pads on the packaging face, wherein the packaging substrate comprises a thermally conductive and electrically insulating material, and wherein the packaging substrate has a backside face opposite the packaging face, the packaging substrate further comprising,
      a first backside contact electrically coupled to the positive electrically conductive pad through a first electrically conductive via,
      a second backside contact electrically coupled to the negative electrically conductive pad through a second electrically conductive via, and
      a metal heat conducting structure on the backside face of the packaging substrate wherein the metal heat conducting structure is electrically isolated from the first and second backside contacts, and wherein the metal heat conducting structure is between the first and second backside contacts on the backside face;
   a plurality of light emitting diodes electrically and mechanically coupled to the packaging face of the packaging substrate, wherein the plurality of light emitting diodes are electrically coupled between the positive and negative electrically conductive pads on the packaging face;
   a continuous optical coating on the plurality of light emitting diodes and on the packaging face of the packaging substrate so that the plurality of light emitting diodes are between the optical coating and the packaging substrate, wherein the continuous optical coating comprises a layer of a transparent and/or translucent material including a phosphor material therein, wherein an optic area is defined by an area of the packaging face covered by the continuous optical coating; and
   wherein each of the plurality of light emitting diodes comprises, a diode region having first and second opposing faces including therein an n-type layer and a p-type layer, an anode contact that ohmically contacts the p-type layer and extends on the first face, a cathode contact that ohmically contacts the n-type layer and extends on the first face, and a support substrate on the second face of the diode region, wherein the diode region is between the support substrate and the anode and cathode contacts, wherein the anode and cathode contacts are between the n-type layer and the packaging substrate in a direction that is orthogonal with respect to the packaging face of the packaging substrate, wherein the anode and cathode contacts are between the p-type layer and the packaging substrate in the direction that is orthogonal with respect to the packaging face of the packaging substrate, and wherein the support substrate has a thickness of at least about 50 micrometers.

2. The electronic device of claim 1 wherein the plurality of light emitting diodes are configured to generate at least 25 lumens per square millimeter of the optic area while delivering at least 100 lumens per watt of power consumed.

3. The electronic device of claim 1 wherein the plurality of light emitting diodes comprises at least 16 light emitting diodes between the continuous optical coating and the packaging substrate.

4. The electronic device of claim 3 wherein the plurality of light emitting diodes comprises at least 72 light emitting diodes.

5. The electronic device of claim 1 wherein at least one of the light emitting diodes is free of wirebonds.

6. The electronic device of claim 1 wherein for each of the light emitting diodes the anode contact is electrically and mechanically coupled to the packaging substrate using a first metallic bond physically located between the anode contact and the packaging substrate and the cathode contact is electrically and mechanically coupled to the packaging substrate using a second metallic bond physically located between the cathode contact and the packaging substrate.

7. The electronic device of claim 6 wherein a first planar interface is defined between the first backside contact and a first area of the backside face, and wherein a second planar interface is defined between the second backside contact and a second area of the backside face.

8. The electronic device of claim 7 wherein the metal heat conducting structure is aligned with the plurality of light emitting diodes in a direction perpendicular with respect to the packaging face of the packaging substrate, and wherein a third planar interface is defined between the metal heat conducting structure and a third area of the backside face of the packaging substrate.

9. The electronic device of claim 1 wherein for each of the plurality of light emitting diodes, the diode region is between the support substrate and the packaging substrate, the continuous optical coating is coated on the support substrate, and the packaging substrate is free of wirebonds electrically coupled between the packaging substrate and the light emitting diode.

10. The electronic device of claim 1 wherein a thickness of the continuous optical coating relative to the packaging face of the packaging substrate is greater than a thickness of each of the plurality of light emitting diodes relative to the packaging face of the packaging substrate, and wherein a surface of the continuous optical coating opposite the packaging substrate is substantially planar over an area including the plurality of light emitting diodes.

11. The electronic device of claim 1 wherein the optic area is in the range of about 20 square millimeters to about 200 square millimeters.

12. The electronic device of claim 1 wherein the plurality of light emitting diodes comprises a first string of light emitting diodes electrically coupled in series between the positive and negative electrically conductive pads, and a second string of light emitting diodes electrically coupled in series between the positive and negative electrically conductive pads, wherein a node between two light emitting diodes of the first string is electrically coupled to a node between two light emitting diodes of the second string, and wherein at least one of the plurality of light emitting diodes is electrically coupled to the packaging substrate using no more than one wirebond.

13. The electronic device of claim 1 wherein the layer of the transparent and/or translucent material includes multiple different phosphor materials therein, wherein each of the different phosphor materials is configured to emit a respective different wavelength of light responsive to light generated by the plurality of light emitting diodes.

14. The electronic device of claim 1 wherein the plurality of light emitting diodes are configured to generate at least 20 lumens per square millimeter of the optic area while delivering at least 100 lumens per watt of power consumed by the plurality of light emitting diodes between the continuous optical coating and the packaging substrate and while delivering at least 600 absolute lumens from the plurality of light emitting diodes between the continuous optical coating and the packaging substrate.

15. The electronic device of claim 1 wherein the plurality of light emitting diodes comprises first and second light emitting diodes between the continuous optical coating and the packaging substrate wherein the first and second light emitting diodes are spaced apart by a distance in the range of about 20 micrometers to about 500 micrometers.

16. The electronic device of claim 1 wherein a first planar interface is defined between the first backside contact and a first area of the backside face, and wherein a second planar interface is defined between the second backside contact and a second area of the backside face.

17. The electronic device of claim 16 wherein the packaging substrate comprises a thermally conductive and electrically insulating material, and wherein the metal heat conducting structure is aligned with the plurality of light emitting diodes in a direction perpendicular with respect to the packaging face of the packaging substrate, and wherein a third planar interface is defined between the metal heat conducting structure and a third area of the backside face of the packaging substrate.

18. The electronic device of claim 1 wherein a metal to non-metal interface between the anode contact and the light emitting diode is coplanar with a metal to non-metal interface between the cathode contact and the light emitting diode.

19. The electronic device of claim 1 wherein the support substrate of each of the plurality of light emitting diodes is separated from the support substrate of adjacent ones of the plurality of light emitting diodes.

20. The electronic device of claim 19 wherein the support substrate of each of the plurality of light emitting diodes is separated from the support substrate of adjacent ones of the plurality of light emitting diodes by a portion of the continuous optical coating.

21. The electronic device of claim 19 wherein a surface area of a first face of the support substrate of each of the plurality of light emitting diodes adjacent the second face of the respective diode region is greater than a surface area of a second face of the support substrate remote from the second face of the respective diode region.

22. The electronic device of claim 1 further comprising:
a dam surrounding the plurality of light emitting diodes, wherein the continuous optical coating is confined within the dam and the continuous optical coating is separate from the dam, wherein the dam comprises an interior face adjacent the plurality of light emitting diodes and an exterior face opposite the interior face that is remote from the plurality of light emitting diodes, and wherein the continuous optical coating is confined within an interior perimeter of the dam defined by the interior face.

23. The electronic device of claim 1 further comprising:
a dam surrounding the plurality of light emitting diodes, wherein the continuous optical coating is confined within the dam and the continuous optical coating is separate from the dam, and wherein an entirety of the dam is outside a perimeter surrounding the plurality of light emitting diodes.

24. The electronic device of claim 1 further comprising:
a dam surrounding the plurality of light emitting diodes, wherein the continuous optical coating is confined within the dam and the continuous optical coating is separate from the dam.

25. An electronic device comprising:
a packaging substrate having a packaging face, the packaging substrate including positive and negative electrically conductive pads on the packaging face;
a plurality of light emitting diodes electrically and mechanically coupled to the packaging face of the packaging substrate, wherein the plurality of light emitting diodes are electrically coupled between the positive and negative electrically conductive pads on the packaging face; and
a continuous optical coating on the plurality of light emitting diodes and on the packaging face of the packaging substrate so that the plurality of light emitting diodes are between the optical coating and the packaging substrate, wherein an optic area is defined by an area of the packaging face covered by the continuous optical coating,
wherein the packaging substrate has a backside face opposite the packaging face, the packaging substrate further comprising a first backside contact electrically coupled to the positive electrically conductive pad through a first electrically conductive via through the packaging substrate, and a second backside contact electrically coupled to the negative electrically conductive pad through a second electrically conductive via through the packaging substrate, and
wherein the packaging substrate comprises an aluminum nitride substrate, and a metal heat conducting structure on the backside face of the packaging substrate wherein the metal heat conducting structure is electrically isolated from the first and second backside contacts, and wherein the metal heat conducting structure is aligned with the plurality of light emitting diodes in a direction perpendicular with respect to the packaging face of the packaging substrate, wherein a first interface is defined between the first backside contact and a first area of the backside face of the packaging substrate, and wherein a second interface is defined between the second backside contact and a second area of the backside face of the packaging substrate;
wherein the metal heat conducting structure is between the first and second backside contacts on the backside face.

26. The electronic device of claim 25 wherein the first interface is a first planar interface between the first backside contact and the first area of the backside face, and wherein the second interface is a second planar interface between the second backside contact and the second area of the backside face.

27. The electronic device of claim 26 wherein a third planar interface is defined between the metal heat conducting structure and a third area of the backside face of the packaging substrate, and wherein the metal heat conducting structure is between the first and second backside contacts on the backside face.

28. The electronic device of claim 25 further comprising a dam surrounding the plurality of light emitting diodes, wherein the dam comprises an interior face adjacent the plurality of light emitting diodes and an exterior face opposite the interior face that is remote from the plurality of light emitting diodes, and wherein the continuous optical coating is confined within an interior perimeter of the dam defined by the interior face.

29. The electronic device of claim 25 wherein the heat conducting structure is non-overlapping with respect to the first and second backside contacts on the backside face.

30. The electronic device of claim 29 wherein a third interface is defined between the heat conducting structure and a third area of the backside face, and wherein the first, second, and third interfaces are co-planar.

31. An electronic device comprising:
a packaging substrate having a packaging face, the packaging substrate including positive and negative electrically conductive pads on the packaging face, wherein the packaging substrate comprises a thermally conductive and electrically insulating material, and wherein the packaging substrate has a backside face opposite the packaging face, the packaging substrate further comprising,
a first backside contact electrically coupled to the positive electrically conductive pad through a first electrically conductive via,
a second backside contact electrically coupled to the negative electrically conductive pad through a second electrically conductive via, and
a metal heat conducting structure on the backside face of the packaging substrate wherein the metal heat conducting structure is electrically isolated from the first and second backside contacts, and wherein the metal heat conducting structure is between the first and second backside contacts on the backside face;
a plurality of light emitting diodes electrically and mechanically coupled to the packaging face of the packaging substrate, wherein the plurality of light emitting diodes are electrically coupled between the positive and negative electrically conductive pads on the packaging face; and
a continuous optical coating on the plurality of light emitting diodes and on the packaging face of the packaging substrate so that the plurality of light emitting diodes are between the optical coating and the packaging substrate, wherein the continuous optical coating comprises a layer of a transparent and/or translucent material including a phosphor material therein, wherein a thickness of the continuous optical coating relative to the packaging face of the packaging substrate is greater than a thickness of each of the plurality of light emitting diodes relative to the packaging face of the packaging substrate, wherein a surface of the continuous optical coating opposite the packaging substrate is substantially planar over an area including the plurality of light emitting diodes, and wherein at least one of the plurality of light emitting diodes is free of wirebonds; and wherein at least one of the light emitting diodes comprises an anode contact electrically and mechanically coupled to the packaging substrate using a first metallic bond located between the anode contact and the packaging substrate and a cathode contact electrically and mechanically coupled to the packaging substrate using a second metallic bond located between the cathode contact and the packaging substrate, wherein a metal to non-metal interface between the anode contact and the light emitting diode is coplanar with a metal to non-metal interface between the cathode contact and the light emitting diode.

32. The electronic device of claim 31 wherein an optic area is defined by an area of the packaging face covered by the continuous optical coating, and wherein the plurality of light emitting diodes are configured to generate at least 20 lumens per square millimeter of the optic area while delivering at least 100 lumens per watt of power consumed by the plurality of light emitting diodes between the continuous optical coating and the packaging substrate.

33. The electronic device of claim 31 wherein the plurality of light emitting diodes comprises at least 16 light emitting diodes between the continuous optical coating and the packaging substrate.

34. The electronic device of claim 33 wherein the plurality of light emitting diodes comprises at least 72 light emitting diodes.

35. The electronic device of claim 31 wherein a first planar interface is defined between the first backside contact and a first area of the backside face, and wherein a second planar interface is defined between the second backside contact and a second area of the backside face.

36. The electronic device of claim 35 wherein the metal heat conducting structure is aligned with the plurality of light emitting diodes in a direction perpendicular with respect to the packaging face of the packaging substrate, and wherein a third planar interface is defined between the metal heat conducting structure and a third area of the backside face of the packaging substrate.

37. The electronic device of claim 31 wherein the plurality of light emitting diodes comprises a first string of light emitting diodes electrically coupled in series between the positive and negative electrically conductive pads, and a second string of light emitting diodes electrically coupled in series between the positive and negative electrically conductive pads, wherein a node between two light emitting diodes of the first string is electrically coupled to a node between two light emitting diodes of the second string, and wherein at least one of the plurality of light emitting diodes is free of wirebonds.

38. The electronic device of claim 31 wherein the layer of the transparent and/or translucent material includes multiple different phosphor materials therein, wherein each of the different phosphor materials is configured to emit a respective different wavelength of light responsive to light generated by the plurality of light emitting diodes.

39. The electronic device of claim 31 further comprising:
a dam surrounding the plurality of light emitting diodes, wherein the continuous optical coating is confined within the dam and the continuous optical coating is separate from the dam, wherein the dam comprises an interior face adjacent the plurality of light emitting diodes and an exterior face opposite the interior face that is remote from the plurality of light emitting diodes, and wherein the continuous optical coating is confined within an interior perimeter of the dam defined by the interior face.

40. The electronic device of claim 31 further comprising:
a dam surrounding the plurality of light emitting diodes, wherein the continuous optical coating is confined within the dam and the continuous optical coating is separate from the dam, and wherein an entirety of the dam is outside a perimeter surrounding the plurality of light emitting diodes.

41. The electronic device of claim 31 further comprising:
a dam surrounding the plurality of light emitting diodes, wherein the continuous optical coating is confined within the dam, and the continuous optical coating is separate from the dam.

42. An electronic device comprising:
a packaging substrate having a packaging face, the packaging substrate including positive and negative electrically conductive pads on the packaging face, wherein the packaging substrate comprises a thermally conductive and electrically insulting material, and wherein the packaging substrate has a backside face opposite the packaging face, the packaging substrate further comprising,
a first backside contact electrically coupled to the positive electrically conductive pad through a first electrically conductive via,
a second backside contact electrically coupled to the negative electrically conductive pad through a second electrically conductive via, and
a metal heat conducting structure on the backside face of the packaging substrate wherein the metal heat conductive structure is electrically isolated from the first and second backside contacts, and wherein the metal heat conducting structure is between the first and second backside contacts on the backside face;
a plurality of light emitting diodes electrically and mechanically coupled to the packaging face of the packaging substrate, wherein the plurality of light emitting diodes are electrically coupled between the positive and negative electrically conductive pads on the packaging face, wherein each of the plurality of light emitting diodes comprises,
a diode region having first and second opposing faces including therein an n-type layer and a p-type layer,
an anode contact that ohmically contacts the p-type layer and extends on the first face,
a cathode contact that ohmically contacts the n-type layer and extends on the first face, and
a support substrate on the second face of the diode region, wherein the diode region is between the support substrate and the anode and cathode contacts, wherein the anode and cathode contacts are between the n-type layer and the packaging substrate in a direction that is orthogonal with respect to the packaging face of the packaging substrate, wherein the anode and cathode contacts are between the p-type layer and the packaging substrate in a direction that is orthogonal with respect to the packaging face of the packaging substrate, and wherein the support substrate has a thickness of at least about 50 micrometers; and a continuous optical coating on the plurality of light emitting diodes and on the packaging face of the packaging substrate so that the plurality of light emitting diodes are between the optical coating and the packaging substrate, wherein the continuous optical coating comprises a layer of a transparent and/or translucent material including a phosphor material therein, wherein a thickness of the continuous optical coating relative to the packaging face of the packaging substrate is greater than a thickness of each of the plurality of light emitting diodes relative to the packaging face of the packaging substrate, wherein a surface of the continuous optical coating opposite the packaging substrate is substantially planar over an area including the plurality of light emitting diodes, and wherein at least one of the plurality of light emitting diodes is free of wirebonds.

43. The electronic device of claim 42 wherein for each of the plurality of light emitting diodes, the diode region is between the support substrate and the packaging substrate, the continuous optical coating is coated on the support substrate, and the packaging substrate is free of wirebonds electrically coupled between the packaging substrate and the light emitting diode.

44. The electronic device of claim 42 wherein a first planar interface is defined between the first backside contact and a first area of the backside face, and wherein a second planar interface is defined between the second backside contact and a second area of the backside face.

45. The electronic device of claim 44 wherein the metal heat conducting structure is aligned with the plurality of light emitting diodes in a direction perpendicular with respect to the packaging face of the packaging substrate, and wherein a third planar interface is defined between the metal heat conducting structure and a third area of the backside face of the packaging substrate.

46. The electronic device of claim 42 wherein a metal to non-metal interface between the anode contact and the light emitting diode is coplanar with a metal to non-metal interface between the cathode contact and the light emitting diode.

47. The electronic device of claim 42 wherein the support substrate of each of the plurality of light emitting diodes is separated from the support substrate of adjacent ones of the plurality of light emitting diodes.

48. The electronic device of claim 47 wherein the support substrate of each of the plurality of light emitting diodes is separated from the support substrate of adjacent ones of the plurality of light emitting diodes by a portion of the continuous optical coating.

49. The electronic device of claim 47 wherein a surface area of a first face of the support substrate of each of the plurality of light emitting diodes adjacent the second face of the respective diode region is greater than a surface area of a second face of the support substrate remote from the second face of the respective diode region.

50. The electronic device of claim 42 further comprising:
a dam surrounding the plurality of light emitting diodes, wherein the continuous optical coating is confined within the dam and the continuous optical coating is separate from the dam, wherein the dam comprises an interior face adjacent the plurality of light emitting diodes and an exterior face opposite the interior face that is remote from the plurality of light emitting diodes, and wherein the continuous optical coating is confined within an interior perimeter of the dam defined by the interior face.

51. The electronic device of claim 42 further comprising:
a dam surrounding the plurality of light emitting diodes, wherein the continuous optical coating is confined within the dam and the continuous optical coating is separate from the dam, and wherein an entirety of the dam is outside a perimeter surrounding the plurality of light emitting diodes.

52. The electronic device of claim 42 further comprising:
a dam surrounding the plurality of light emitting diodes, wherein the continuous optical coating is confined within the dam and the continuous optical coating is separate from the dam.

\* \* \* \* \*